United States Patent
Adams

(10) Patent No.: US 8,013,312 B2
(45) Date of Patent: Sep. 6, 2011

(54) VAPOR DELIVERY SYSTEM USEFUL WITH ION SOURCES AND VAPORIZER FOR USE IN SUCH SYSTEM

(75) Inventor: Douglas Adams, Pepperell, MA (US)

(73) Assignee: SemEquip, Inc., North Billerica, MA (US)

( * ) Notice: Subject to any disclaimer, the term of this patent is extended or adjusted under 35 U.S.C. 154(b) by 253 days.

(21) Appl. No.: 12/515,667

(22) PCT Filed: Nov. 21, 2007

(86) PCT No.: PCT/US2007/085320
§ 371 (c)(1),
(2), (4) Date: May 20, 2009

(87) PCT Pub. No.: WO2008/070453
PCT Pub. Date: Jun. 12, 2008

(65) Prior Publication Data
US 2010/0025576 A1    Feb. 4, 2010

Related U.S. Application Data

(63) Continuation of application No. PCT/US2007/070900, filed on Jun. 11, 2007.

(60) Provisional application No. 60/860,631, filed on Nov. 22, 2006.

(51) Int. Cl.
*G05D 7/00* (2006.01)
*C23C 16/00* (2006.01)

(52) U.S. Cl. ............. 250/423 R; 250/424; 250/425; 250/426; 250/427; 315/111.81

(58) Field of Classification Search .......... 250/423 R, 250/424, 425, 426, 427; 315/111.81
See application file for complete search history.

(56) References Cited

U.S. PATENT DOCUMENTS

| 2,044,921 A | 6/1946 | Lawton et al. |
| 2,733,348 A | 1/1956 | Lawton |
| 3,509,216 A | 4/1970 | Obenland et al. |
| 3,527,141 A | 9/1970 | Peoples |
| 5,413,139 A | 5/1995 | Kusumoto et al. |

(Continued)

FOREIGN PATENT DOCUMENTS
WO    WO 2005/059942    6/2005

(Continued)

OTHER PUBLICATIONS

ISR PCT/US07/85320.

(Continued)

*Primary Examiner* — David A Vanore
(74) *Attorney, Agent, or Firm* — John S. Paniaguas; Katten Muchin Rosenman LLP

(57) ABSTRACT

Vapor delivery systems and methods that control the heating and flow of vapors from solid feed material, especially material that comprises cluster molecules for semiconductor manufacture. The systems and methods safely and effectively conduct the vapor to a point of utilization, especially to an ion source for ion implantation. Ion beam implantation is shown employing ions from the cluster materials. The vapor delivery system includes reactive gas cleaning of the ion source, control systems and protocols, wide dynamic range flow-control systems and vaporizer selections that are efficient and safe. Borane, decarborane, carboranes, carbon clusters and other large molecules are vaporized for ion implantation. Such systems are shown cooperating with novel vaporizers, ion sources, and reactive cleaning systems.

56 Claims, 40 Drawing Sheets

U.S. PATENT DOCUMENTS

| | | | |
|---|---|---|---|
| 6,107,634 A * | 8/2000 | Horsky | 250/423 R |
| 6,288,403 B1 * | 9/2001 | Horsky et al. | 250/427 |
| 6,452,338 B1 | 9/2002 | Horsky | |
| 6,686,595 B2 * | 2/2004 | Horsky | 250/427 |
| 6,958,481 B2 * | 10/2005 | Horsky et al. | 250/427 |
| 7,022,999 B2 * | 4/2006 | Horsky et al. | 250/427 |
| 7,064,491 B2 * | 6/2006 | Horsky et al. | 315/111.81 |
| 7,185,602 B2 * | 3/2007 | Horsky et al. | 118/723 HC |
| 7,629,590 B2 * | 12/2009 | Horsky et al. | 250/423 R |
| 7,723,700 B2 * | 5/2010 | Horsky et al. | 250/429 |
| 7,800,312 B2 * | 9/2010 | Horsky | 315/111.81 |
| 7,820,981 B2 * | 10/2010 | Horsky et al. | 250/425 |
| 7,834,554 B2 * | 11/2010 | Horsky | 315/111.81 |
| 2002/0144655 A1 | 10/2002 | Chiang et al. | |
| 2003/0230986 A1 | 12/2003 | Horsky et al. | |
| 2004/0002202 A1 | 1/2004 | Horsky et al. | |
| 2004/0188631 A1 * | 9/2004 | Horsky et al. | 250/423 R |
| 2004/0245476 A1 | 12/2004 | Horsky et al. | |
| 2007/0108395 A1 * | 5/2007 | Horsky et al. | 250/489 |
| 2007/0176114 A1 * | 8/2007 | Horsky et al. | 250/427 |
| 2007/0181830 A1 * | 8/2007 | Horsky et al. | 250/492.21 |
| 2007/0194252 A1 * | 8/2007 | Horsky et al. | 250/492.21 |
| 2007/0210260 A1 * | 9/2007 | Horsky et al. | 250/424 |
| 2007/0278417 A1 * | 12/2007 | Horsky et al. | 250/427 |
| 2008/0042580 A1 * | 2/2008 | Horsky | 315/111.81 |
| 2008/0047607 A1 * | 2/2008 | Horsky et al. | 137/8 |
| 2008/0073559 A1 * | 3/2008 | Horsky et al. | 250/428 |
| 2008/0087219 A1 * | 4/2008 | Horsky | 118/698 |
| 2008/0223409 A1 * | 9/2008 | Horsky et al. | 134/22.1 |
| 2009/0179157 A1 * | 7/2009 | Sinclair et al. | 250/423 R |
| 2009/0206281 A1 * | 8/2009 | Oved et al. | 250/492.21 |
| 2010/0025576 A1 * | 2/2010 | Adams | 250/288 |
| 2010/0107980 A1 * | 5/2010 | Horsky et al. | 118/723 E |
| 2010/0320395 A1 * | 12/2010 | Hahto et al. | 250/426 |

FOREIGN PATENT DOCUMENTS

| | | |
|---|---|---|
| WO | WO 2005/060602 | 7/2005 |
| WO | ISR | 8/2005 |
| | PCT/US07/71010 | |

OTHER PUBLICATIONS

Vasyukova, N.I "A.N. Neseyanov Institute of Heteroorganic Compounds", Academy of Sciences of the USSR, Moscow, Translated from Izvestiya Akademii Nauk SSSR, Seriya Khimicheskaya, No. 6, pp. 1337-1340, Jun. 1985.

N.N. Greenwood, A. Earnshaw, *Chemistry of the Elements*, Butterworth and Heinemann Ltd, 1984, pp. 637-697.

U.S. Appl. No. 12/300,918, filed Nov. 14, 2008, Horsky.

U.S. Appl. No. 12/296,601, filed Oct. 9, 2008, Horsky.

U.S. Appl. No. 12/296,601, filed Oct. 9, 2008, Horsky.

* cited by examiner

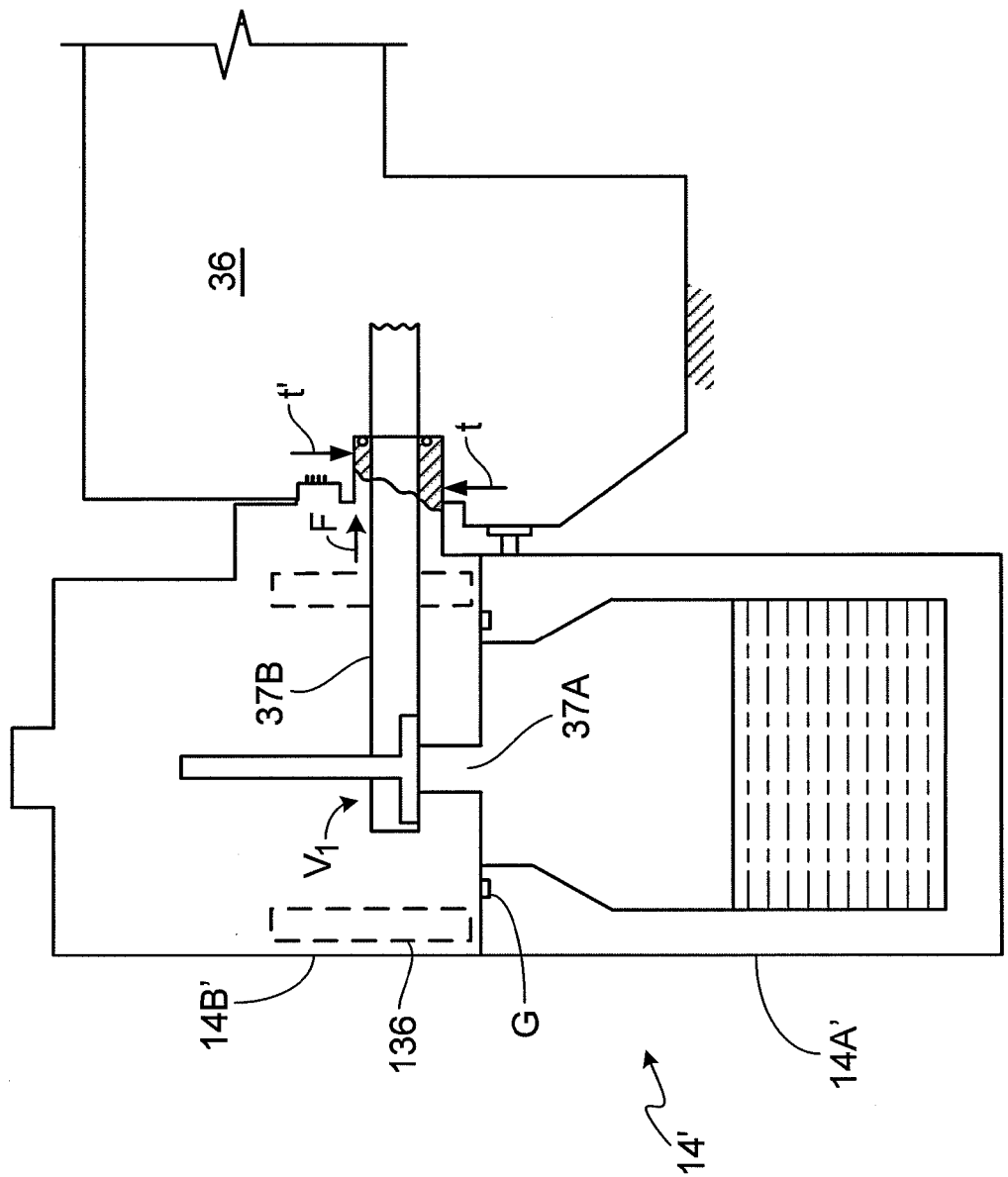

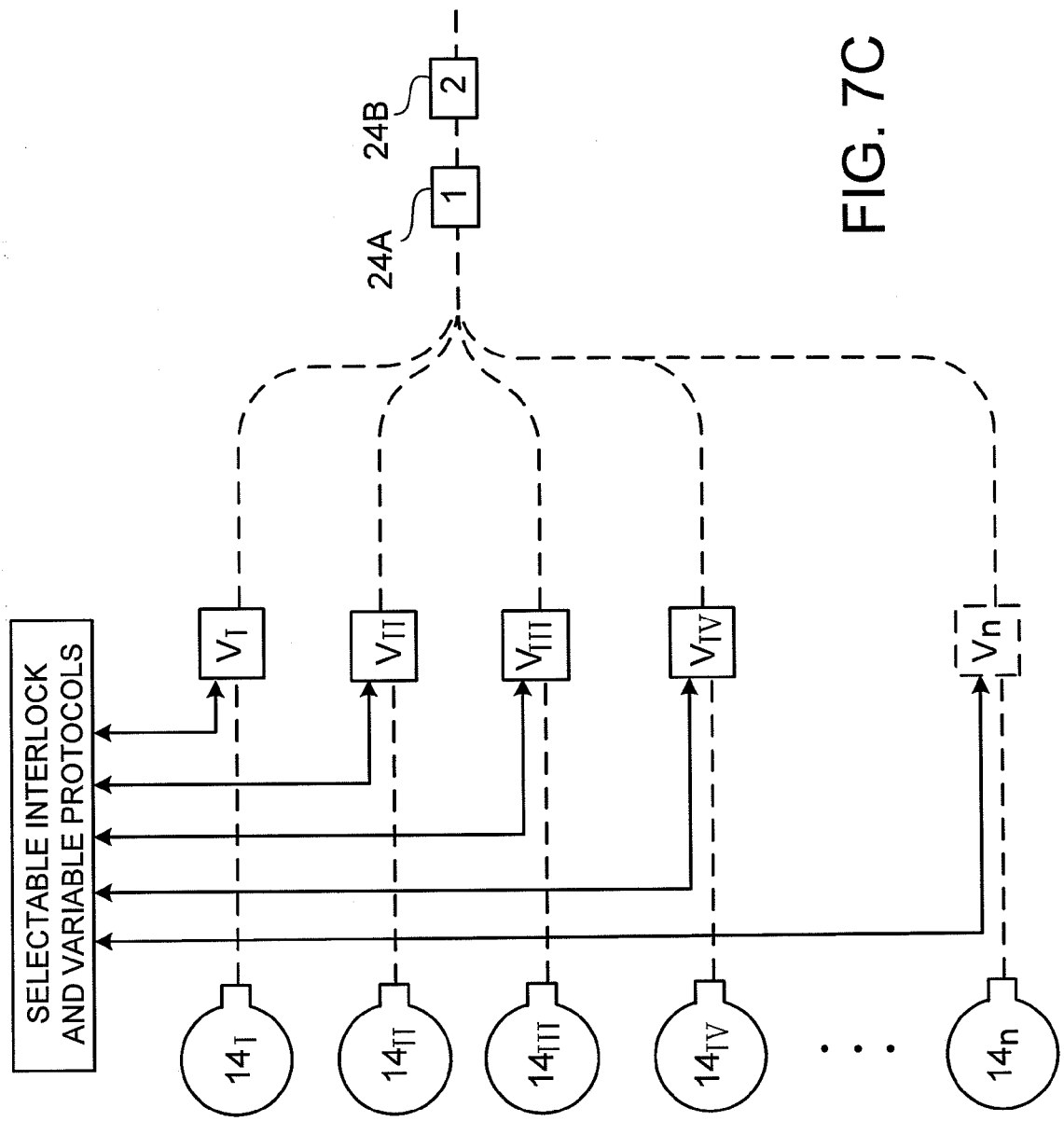

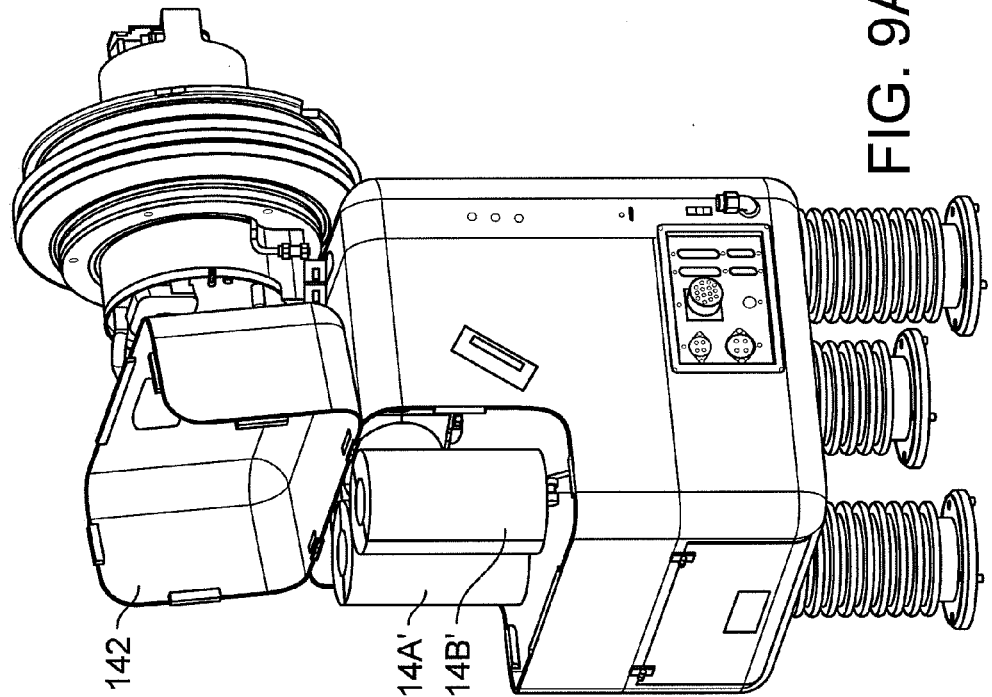
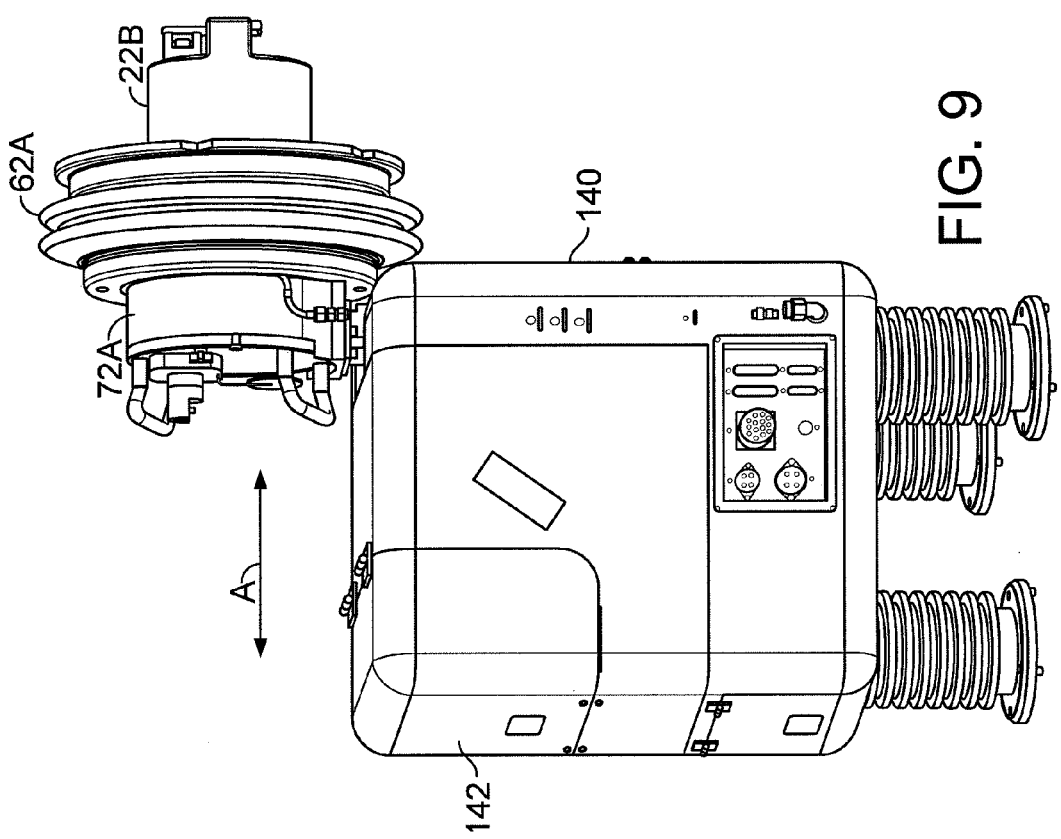

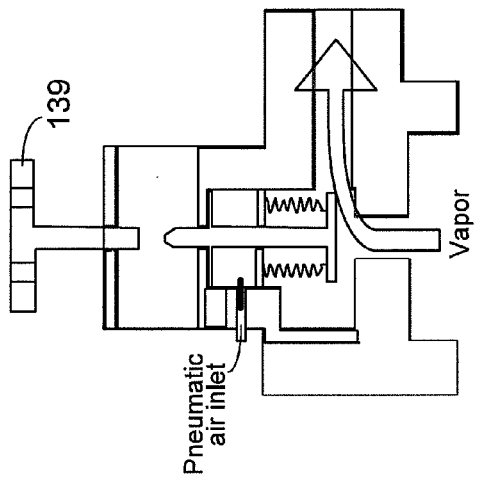
FIG. 13A Valve closed; manual override closed
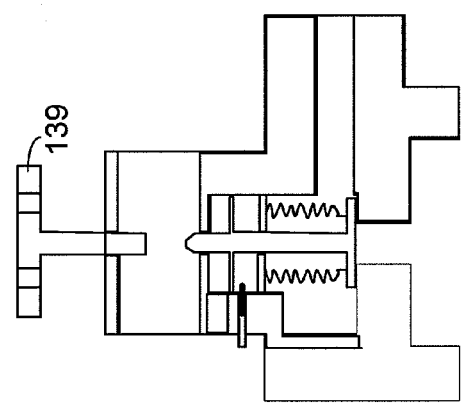
FIG. 13C Valve closed; manual override open
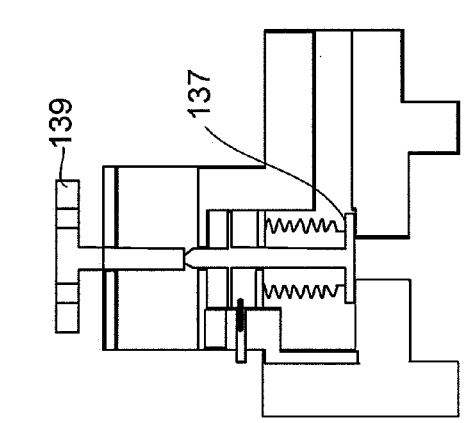
FIG. 13E Valve Open
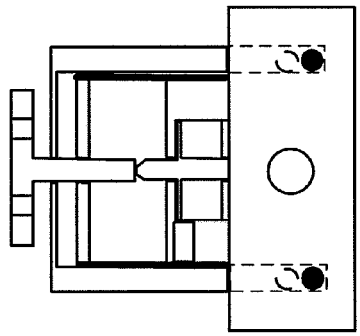
FIG. 13B manual override closed access to the vaporizer fastening screws
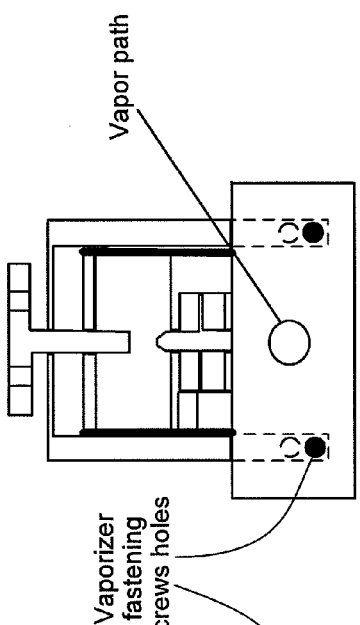
FIG. 13D manual override open blocks the access to the vaporizer fastening screws
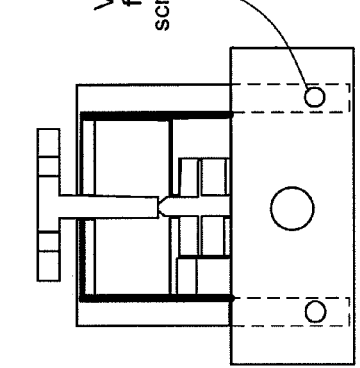
FIG. 13F manual override open blocks the access to the vaporizer fastening screws

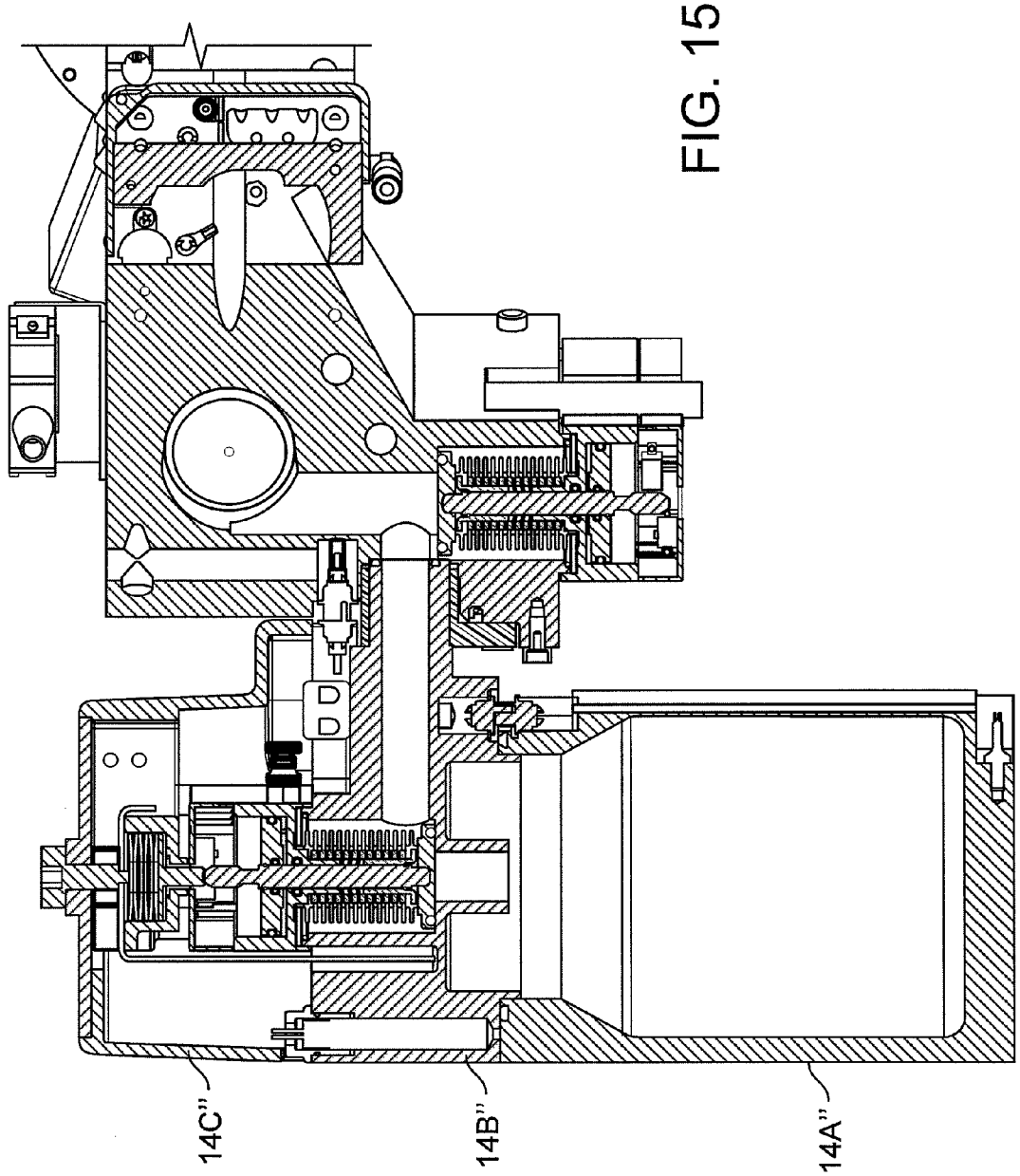

Step 1:
Loosen special security screws of top cover part

Step 2:
Take away top cover part

Step 3:
Loosen special security screws of top part

Step 4:
Disassemble top part from bottom part

The 2 O-rings are recommended to be exchanged at any refill procedure

Step 5:
Bottom part ready for refilling

VAPOR DELIVERY SYSTEM USEFUL WITH ION SOURCES AND VAPORIZER FOR USE IN SUCH SYSTEM

CROSS REFERENCE TO RELATED APPLICATIONS

This application is the national phase under 35 USC §371 of International Patent Application No. PCT/US07/085320, filed on Nov. 21, 2007, which, in turn, is a continuation of International Patent Application No. PCT/US07/070900, filed on Jun. 11, 2007, and claims priority to and the benefit of U.S. Provisional Patent Application No. 60/860,631, filed on Nov. 22, 2006.

TECHNICAL FIELD

This invention relates to the generation and delivery of vapor to vapor-receiving devices within high vacuum chambers. It also relates to delivery of ionizable vapor to high voltage ion sources that provide ion beams for ion implantation in the manufacture of semi-conductor devices and materials. It has particular relevance to systems and methods for vaporizing and ionizing materials that form molecular ions containing multiple atoms of a species of interest.

BACKGROUND

In industry it is frequently desired to deliver highly toxic, unstable material in vapor form to devices or substrate materials within a high vacuum system. It is necessary to periodically service such devices for cleaning or replacement of parts and to refill or replace the vapor sources and perform maintenance service. Each instance of refilling or service requires disengagement and re-engagement of vacuum seals and performance of re-qualification tests to ensure safety.

A particularly important example of such vapor delivery, having many stringent requirements, is the handling of doping materials for production of semiconductor devices. In this case it is necessary to produce vapor streams at accurately controlled flow from highly toxic solid materials that have low vapor pressure at room temperature. This requires careful heating of the solids to produce sublimation, and careful handling of the vapors because of risks of disassociation, unwanted condensation in the flow path and reaction of the vapors if brought in contact with other substances. Provisions to ensure personnel safety are also required. Improved systems for such vapor delivery are needed.

In particular there is need for improved vapor delivery for ion beam implantation systems in which the vapors ionized in an ion source produce an ion beam which is accelerated, mass-analyzed, and transported to a target substrate. With such ionization systems, it is especially desired to meet all requirements while prolonging the uptime, i.e. the time between required servicing. An advantageous way of doing this is by providing in situ cleaning of components of the system using highly reactive agents, but this introduces further safety concerns.

There is also need for safe and reliable vapor delivery systems that enable the same equipment to be employed with a number of different source materials that have differing vaporization temperatures.

There is further a need for a way to progress efficiently and safely from delivery of feed material obtained from a vendor to connection to a vapor receiving system of a vaporizer charged with the feed material. It is preferable that this be done in a standardized manner, to ensure familiarity to personnel.

Among the situations having all of the foregoing needs is the case of providing flows of decaborane and octadecaborane vapor, and vapor of carboranes, to an ion source at flows suitable to perform ion beam implantation to produce boron implants.

The needs also arise, more generally, in providing vapor flows of large molecules for semiconductor manufacturing. Examples include vapor flows: of large molecules for n-type doping, e.g. of arsenic and phosphorus; of large molecules of carbon for co-implanting processes in which the carbon inhibits diffusion of an implanted doping species, or getters (traps) impurities, or amorphizes crystal lattice of the substrate; of large molecules of carbon or other molecules for so-called "stress engineering" of crystal structure (e.g., to apply crystal compression for PMOS transistors, or crystal tension for NMOS transistors); and of large molecules for other purposes including reduction of the thermal budget and unwanted diffusion during annealing steps in semiconductor manufacture.

These needs apply to implementations employing ion beam implantation, and, where applicable, also to large molecule deposition of boron and other species for atomic layer deposition or producing other types of layers or deposits. Techniques for this may employ: plasma immersion, including PLAD (plasma doping), PPLAD (pulsed plasma doping) and $PI^3$ plasma immersion ion implantation); atomic layer deposition (ALD); or chemical vapor deposition (CVD), for example.

The needs just described and the inventive aspects now to be described apply importantly to the manufacture of high density semiconductor devices at shallow depth in semiconductor substrates, including CMOS and NMOS transistors and memory ICs, in the manufacture of computer chips, computer memory, flat panel displays, photovoltaic devices, and other products.

Other procedures in industry involving the generation and delivery of vapors or process gases to a vapor or gas consuming device can also benefit from features presented here.

SUMMARY

According to one aspect of invention, a flow interface device is provided in the form of a thermally conductive valve block which defines at least one vapor passage, the passage associated with at least first and second vapor transfer interfaces, one interface comprising a vapor inlet located to receive vapor from a vaporizer of solid feed material and communicating with an inlet portion of the passage, and the other interface comprising a vapor outlet for delivery of vapor from an outlet portion of the passage to a vapor-receiving device, the valve block having at least one vapor valve and constructed to heat the passage and deliver vapor from the vaporizer to the vapor-receiving device.

Implementations of this aspect may have one or more of the following features:

A vapor valve is a flow control valve for regulating the flow of vapor to a vapor-receiving device in the form of an ion source.

A vapor valve system enables vapor flow to an ion source of vapor entering through the vapor inlet and another flow to the ion source.

A flow enabled is flow of vapor from another vapor inlet defined by the valve block.

A flow enabled is flow to the ion source of a reactive cleaning gas.

Valves provided in the valve block comprise a first valve system enabling vapor flow to the ion source of vapor entering through a vapor inlet, and enabling flow to the ion source of vapor from another vapor inlet defined by the valve block, and a selector valve system enabling flow of vapor from a vapor inlet defined by the valve block, or, alternatively, closing all vapor flow and permitting flow to the ion source of a reactive cleaning gas.

At least two vapor inlets are defined by the valve block and located to receive vapor from respective vaporizers, the two vapor inlets associated with respective inlet passage portions, flows through the inlet passage portions being enabled by the first valve system, the inlet passage portions merging following the first valve system into a common passage portion, and the second valve system is arranged to selectively enable flow through the common passage portion to the vapor-receiving device, or, alternatively, flow of the reactive cleaning gas to the vapor-receiving device.

A further valve comprises a flow control valve associated with the common passage portion for regulating flow of vapor to the vapor-receiving device.

A valve of the valve system comprises a spool valve acting as a selector to permit only one of the flows at a time.

The valve block is associated with a heater controlled to maintain the temperature of the valve block higher than that of a vaporizer from which it receives vapor.

The valve block defines a mounting region constructed to receive and support a vaporizer.

Thermal insulation insulates the valve block from a vaporizer to define respective separate thermal control regions to enable maintenance of valve block temperature higher than that of the vaporizer.

A connector is constructed and arranged so that mounting motion of a vaporizer with respect to the valve block causes the connector to mate with a matching connector of the vaporizer, for connecting the vaporizer electrically to a heating control system.

The valve block defines a receptacle having support surfaces for receiving a support projection of a vaporizer to thereby support the vaporizer during vaporizer heating and vapor transfer.

The support projection is a lateral projection defining a lateral vapor flow passage, the projection having a peripheral side surface and an end surface, and peripheral and end thermal insulation portions are provided to enable thermal isolation of the valve block from the projection of the vaporizer.

The receptacle of the valve block is constructed to receive the support projection of the vaporizer by linear sliding motion of the projection, the flow interface device mounting an electrical connector that is constructed, with mounting motion of a vaporizer relative to the valve block, to slideably mate with a matching electrical connector of the vaporizer for connecting the vaporizer electrically to a control and heating system.

The electrical connector includes a pneumatic connector for supplying controllable compressed air to the vaporizer for selectively actuating a valve of the vaporizer.

The vapor valve is a flow control valve, the interface device being associated with a power supply and heating system for receiving sensed temperature signal from a vaporizer and for applying electric heating current to the vaporizer to cause the vaporizer to heat sufficiently to produce vapor of the solid feed material of pressure greater than that required by the vapor-receiving device, and in the range that enables the flow control valve to regulate vapor flow to the ion source.

The flow interface device is combined with a vaporizer, the vaporizer containing solid feed material capable of producing ionizable vapor.

The vapor-receiving device in the form of an ion source is constructed to produce ions for use in semiconductor manufacture.

The flow interface device is combined with an ion beam implanter in which the vapor-receiving device comprises a high voltage ion source capable of ionizing vapor to produce a beam of ions for ion implantation.

Solid feed material vaporized by the vaporizer comprises a cluster compound capable of producing vapor for the production of cluster ions.

The solid feed material comprises a cluster boron compound.

The compound comprises a borane or a carborane.

The cluster compound comprises $B_{10}H_{14}$, $B_{18}H_{22}$, $C_2B_{10}H_{12}$ or $C_4B_{18}H_{22}$.

The cluster compound comprises a cluster carbon compound.

The cluster compound comprises $C_{14}H_{14}$, $C_{16}H_{10}$, $C_{16}H_{12}$, $C_{16}H_{20}$, $C_{18}H_{14}$ or $C_{18}H_{38}$.

The cluster compound comprises a compound for N-Type doping.

The compound comprises an arsenic, phosphorus or antimony cluster compound.

The compound comprises an arsenic or phosphorus compound capable of forming ions of the form $A_nH_x^+$ or $A_nRH_x^+$, where n and x are integers with n greater than 4 and x greater than or equal to 0, and A is either As or P and R is a molecule not containing phosphorus or arsenic and which is not injurious to the implantation process.

The compound comprises a phosphorus compound selected from the group consisting of phosphanes, organophosphanes and phosphides.

The compound is $P_7H_7$.

The compound comprises an antimony compound that comprises a trimethylstibine.

The compound comprises $S_b(CH_3)C_3$.

The flow interface device and vaporizer are provided in combination with an ion beam implanter in which the vapor-receiving device comprises a high voltage ion source capable of ionizing vapor produced from the solid feed material for ion implantation.

A vapor-receiving-device is in the form of a high voltage ion source and the flow-interface device is mounted for support upon an electrical insulator.

The insulator is an insulator bushing that also supports the ion source to which the vapors are delivered.

The flow interface device is in combination with an ion beam implanter in which the vapor-receiving device comprises a high voltage ion source capable of ionizing the vapor to produce a beam of ions for ion implantation.

The flow interface device includes a gas purge system for removing vapor from the vapor inlet passage of the valve block prior to disconnecting the vaporizer from the valve block.

The valve block defines a delivery passage for a process gas.

The flow interface device is constructed so that a process gas is selectively directed through a passage through which reactive cleaning gas is at other times directed.

The valve block includes a delivery extension defining at least two flow paths to the vapor-receiving device, at least one of which is constructed to convey vapor from solid feed material and another is constructed to deliver a process gas or a reactive cleaning gas.

The flow control valve is a throttle type valve.

The valve system permits only one of the vapor flows at a time.

The valve system comprises a spool valve.

The flow interface device, for use with vaporizers containing the same feed material, comprises a valve system that permits flow from at least two vaporizers simultaneously. In some cases the valve system is constructed for a second mode of action in which the valve system permits only one of the vapor flows at a time.

According to another aspect of invention, a flow interface device for an ion source is constructed for use as the ion source for an ion beam implanter, the interface device being in the form of a thermally conductive valve block which defines at least one vapor passage, the passage associated with at least first and second vapor transfer interfaces, one interface comprising a vapor inlet located to receive vapor from a vaporizer and communicating with an inlet portion of the passage, and the other interface comprising a vapor outlet for delivery of vapor from an outlet portion of the passage to the ion source, the valve block constructed to heat the passage and deliver vapor from the vaporizer to the ion source, a flow control valve associated with the passage for regulating the flow of vapor to the ion source, and a valve system that enables vapor flow to the ion source of vapor entering through the inlet and another enables flow to the ion source.

Implementations of this aspect may employ one or more of the following features.

The flow interface device is associated with a power supply and control system for causing the vaporizer to heat sufficiently to produce vapor of the solid feed material of pressure greater than that required by the ion source, and in the range controllable by the flow control valve.

The flow control valve is a butter-fly type valve.

Another flow enabled is flow of vapor from another vapor inlet defined by the valve block.

Another flow enabled is flow to the ion source of a reactive cleaning gas.

The flow interface device includes at least two valve systems in the valve block that enable flow, a first valve system enabling vapor flow to the ion source of vapor entering through the vapor inlet, and enabling another flow to the ion source of vapor from another vapor inlet defined by the valve block, and a selector valve system enabling flow of vapor from a vapor inlet defined by the valve block, or, alternatively, closing all vapor flow and enabling flow to the ion source of a reactive cleaning gas.

The flow interface has vapor inlet passages associated with at least two vapor inlets located to receive vapor from respective vaporizers, controlled by a first valve system, following which inlet passage portions merge into a common passage, and the second valve system selectively controls flow through the common passage portion to the ion source, or alternatively flow of the reactive cleaning gas to the ion source, the flow control valve being associated with the common passage for regulating flow of vapor to the ion source.

A flow selection valve comprises a spool valve.

The valve block is associated with a heater controlled to maintain the temperature of the valve block higher than that of a vaporizer from which it receives vapor.

According to another aspect of invention, a method of producing vapor employs the device or combination of any of preceding claims.

The details of one or more implementations of the foregoing features are set forth in the accompanying drawings and the description below. Other features, objects, and advantages of the invention will be apparent from the description and drawings, and from the claims.

DESCRIPTION OF DRAWINGS

FIG. 1E also shows a portion of a vapor-receiving support member (that may be a flow interface device similar to that of FIG. 1) positioned to receive and support the vaporizer.

FIG. 1F shows the components of FIG. 1E when interfitted to support the vaporizer.

FIG. 1G is a side view of an implementation of the vaporizer of FIGS. 1E and 1F, with a removable thermal insulator jacket shown in phantom, while

FIG. 1I is a side view and FIG. 1J is a top view of the bottom section of this vaporizer while

FIG. 1L is a diagrammatic, perspective view with part broken away illustrating heat transfer paths in the vaporizer unit while

FIGS. 9, 9A and 10 are perspective views of the system of FIG. 8 illustrating the opening of a cover to access two vaporizers installed in the system.

FIG. 13A through FIG. 13F are a sequence of diagrams illustrating different positions of a pneumatic valve and a manual over-ride device and fastening screws of the vaporizer.

FIG. 14 is a perspective view of the exterior of the vaporizer of FIGS. 1G and 1H, while

FIG. 15 is a vertical cross-sectional view of the vaporizer of FIG. 1G, similar to FIG. 14H, but on a smaller scale and showing also a portion of a flow interface device to which the vaporizer is mounted.

FIG. 15A is an exploded diagrammatic view of parts comprising a supported, thermally insulative connection of the projecting member of the vaporizer in a vapor receiving device such as that of FIG. 15, while

DESCRIPTION OF EMBODIMENTS

Figure 1:
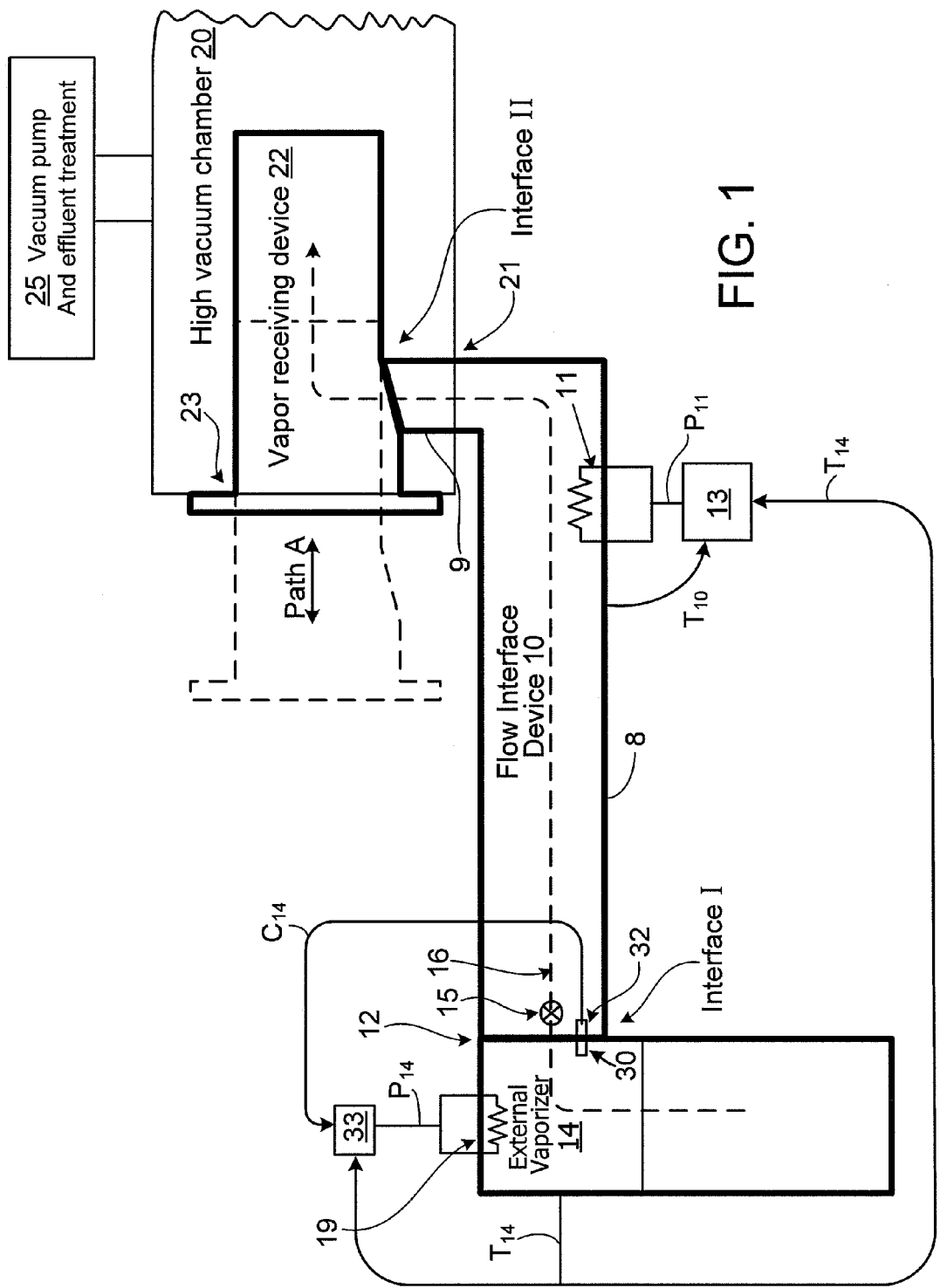
FIG. 1 is a schematic side view of a vapor delivery arrangement comprising an external vaporizer, a vapor-receiving device within a high vacuum chamber and, between these components, a flow interface system.

Referring to FIG. 1, flow interface device 10 of a vapor delivery system is connected to high vacuum chamber 20 and comprises a portion 8 located outside of the vacuum chamber and an extension 9 protruding into the vacuum chamber. Portion 8 of interface device 10 provides a mounting station 12 at which an external vaporizer 14 is removably mounted at a gas-tight interface I.

Vaporizer 14 is of canister type having a bottom section, which contains a charge of solid feed material to be vaporized, and a removable top member. The top member is associated with a vaporizer heater shown diagrammatically at 19. The interface system includes a heater control circuit 33 which controls power $P_{14}$ to the vaporizer heater which produces vapor from the feed material. A vapor flow path 16 extends in the interface device 10 from the vaporizer via the interface I, through an adjacent stop valve 15, thence through portion 8 and extension 9. The extension 9 is sealed to the housing of vacuum chamber 20 at vacuum-tight seal 21.

A sealed disengageable connection is formed between extension 9 and vapor-receiving device 22 within the high vacuum chamber. This point of connection is referred to as interface II.

With this arrangement, ready removal and servicing of both the external vaporizer 14 and the vapor-receiving device 22 is made possible without disturbance of the seal 21 at the connection of the flow interface device 10 to the housing of high vacuum chamber 20. Despite repeated flow disconnection and reconnection at interface II for performing service on vapor-receiving device 22, interface II does not present a potential leak hazard to workers because of its location. To any extent that leak may occur, the leakage is confined within high vacuum chamber 20 and is removed by its vacuum pump and associated effluent treatment system 25.

In preferred implementations of the system, at interface II, the connection is made within the high vacuum chamber by installation movement of the vapor-receiving device. In the example of FIG. 1, the vapor-receiving device 22 is installed by moving along path A until device 22 seals upon a surface of the vacuum chamber 20 at detachable connection 23. As it is installed with this motion, the vapor-receiving device 22 is constructed to engage and seal with extension 9 at interface II within the vacuum chamber 20. For instance, it may be constructed to form, effectively, a labyrinth vacuum seal by matching close-fitting surfaces. Similarly, the vapor receiving device 22 is constructed to be removable from the vacuum chamber by opposite motion along path A in a manner that breaks the seal at interface II, without disturbing the seal 21 of flow interface device 10 with the housing of vacuum chamber 20.

Figure 1A:
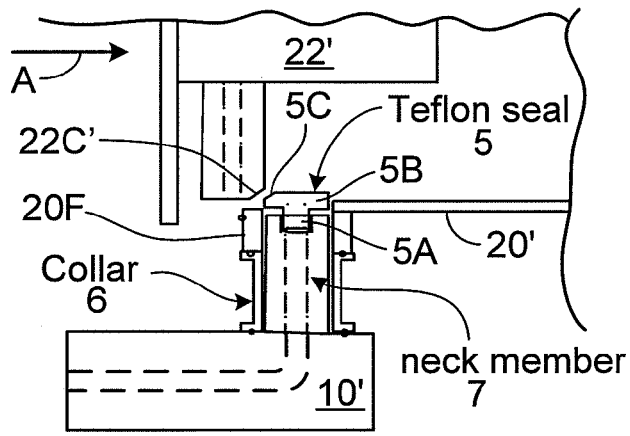
FIGS. 1A, 1B, and 1C are diagrammatic illustrations of an implementation of a sealing feature at the high vacuum chamber of FIG. 1.
Figure 1B:
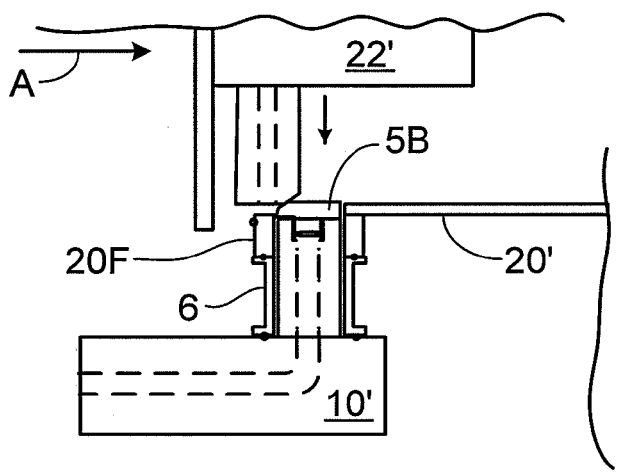
Figure 1C:
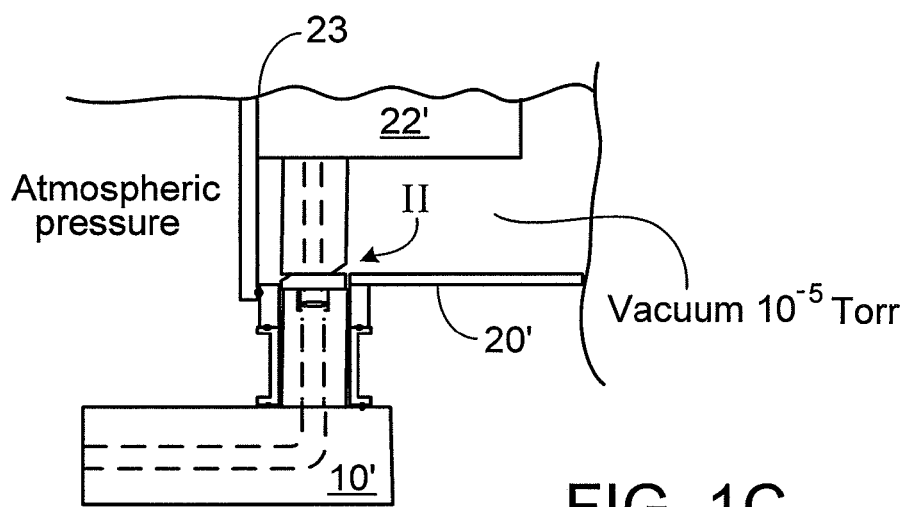

FIGS. 1A-1C illustrate a mechanism that forms such a seal at interface II within high vacuum chamber 20'. The housing of high vacuum chamber 20' includes an interface flange 20F joined in vacuum-tight manner to the housing and having an opening directed downwardly.

Flow interface device 10' is in the form of a thermally conductive block that defines a vapor flow passage. It includes a collar 6 constructed to mount the block upon housing flange 20F in vacuum tight manner. A neck member 7 joined and sealed to block 10', defines an extension of the vapor passage. Neck member 7 protrudes from the collar 6, through chamber flange 20F, into the high vacuum chamber 20'.

A spring-loaded connector seal member 5, e.g. of Teflon, has a tubular stem 5A closely fitted inside a cylindrical portion of the passage in neck member 7. The stem 5A extends upwardly into the installation path of vapor receiving device 22', terminating in a top head 5B that defines a horizontal upwardly directed sealing surface. Head 5B has a corner cam surface 5C, disposed to be engaged by a corresponding cam surface 22C' of device 22'.

In FIG. 1A, cam surfaces 5C and 22C' are shown still separated as the vapor-receiving device 22' moves to the right along path A for installation. In FIG. 1B, the device 22' has advanced to the point that the cam surfaces engage. In FIG. 1C installation is complete with the mounting flange of device 22' seated upon a corresponding flange surface of high vacuum chamber 20', forming vacuum tight seal 23. The spring-biased Teflon member 5 has been pushed downwardly and its flat top surface engages a corresponding downwardly directed flat surface of device 22'. These mating surfaces in effect form a labyrinth seal. Another labyrinth seal is formed by the close fitting cylindrical surfaces of the passage in neck member 7 and the stem 5A of the connector 5. With the flow-receiving device 22' seated, the passages of neck member 7 and the vapor-receiving device 22' are aligned to enable delivery of vapor.

For removal of the vapor-receiving device 22', the motions are reversed.

It will be understood by those skilled that other docking configurations can be employed, one example being engaging surfaces that are axially-aligned, e.g. surfaces of conical or pyramidal connectors. In other cases, after the vacuum-receiving device has been seated, a reversible actuator mechanism may be activated to complete a sealed connection between the parts within the vacuum housing.

Referring again to FIG. 1, in preferred implementations, flow interface device 10 is constructed to accept vaporizers containing different materials to be vaporized. Each vaporizer carries a temperature sensor by which the temperature $T_{14}$ of the vaporizer is sensed and sent to vaporizer heater control circuit 33 of the interface system. While shown sensing the temperature of the top of the unit, it may instead be located to sense the temperature near the bottom, with advantages, or both locations may be monitored. Each vaporizer is dedicated to a particular source material and carries an identifier device 30. The flow interface device 10 has a complementary recognition device 32. Recognition device 32 provides a control signal $C_{14}$ to vaporizer heater control circuit 33, in response to which control circuit 33 establishes a safe temperature range for heating the respective feed material including an upper limit for applying power to the heater of the particular vaporizer. As an example, in a preferred implementation, flow interface device 10 is constructed to receive vaporizers 14' and 14" dedicated to containing, respectively, decaborane and octadecaborane. The vaporizers carry distinctly different identifying devices 30. When a vaporizer is mounted to interface device 10, the recognition device 32 recognizes the vaporizer 14' or 14" and provides respective control signal $C_{14}'$ or $C_{14}"$. In a suitable implementation, the recognition signal $C_{14}'$, triggered by a decaborane vaporizer, enables the heater control circuit 33 to operate within an appropriate heating range for vaporizing decaborane and prevents heating of the vaporizer above about 35 C, while the recognition signal $C_{14}"$, triggered by an octadecaborane vaporizer, enables the heater control circuit 33 to operate within an appropriate heating range for vaporizing octadecaborane and prevents heating of the vaporizer above 135 C, for example. Other vaporizers dedicated to other materials carry other identifiers that are recognizable to cause the interface control unit to enable other temperature ranges or other appropriate operating conditions.

In preferred implementations, flow interface device 10 comprises a thermally conductive body, formed for instance of machined aluminum block-forming parts. When valves are installed, the thermally conductive block serves effectively as valve body for the valves. A vacuum-tight vapor path through the heated body extends from interface I to interface II. The body is in thermal contact with a heater shown diagrammatically at 11, controlled by circuit 13. Circuit 13 has temperature inputs $T_{14}$ from vaporizer 14 and $T_{10}$ from the conductive body of flow interface device 10. Circuit 13 is adapted to control heater 11 to maintain the conductive body at a controlled temperature, for instance, to a temperature above the temperature of the respective vaporizer 14, but below a safety temperature, e.g., a temperature below disassociation temperature of a respective material being vaporized.

The heaters of the system may be of various forms, for instance conventional electric cartridge or band heaters, and may be arranged in one or more than one heating zone. For instance, advantageously, there may be a heating zone 1 for heating the vaporizer to $T_1$, heating zone 2 for heating the interface body 10 and heating zone 3 for the vapor-receiving device 22. The heating zones are comprised of respective heater elements and temperature sensors, that, in one arrangement, increase in temperature from $T_1$ to $T_2$ along the path from vaporizer to interface II in the vapor receiving device, i.e. $T_1 < T_2 < T_3$ where all of these temperatures are limited to a temperature $T_4$ below a safety limit for the material to be vaporized.

Figure 1D:
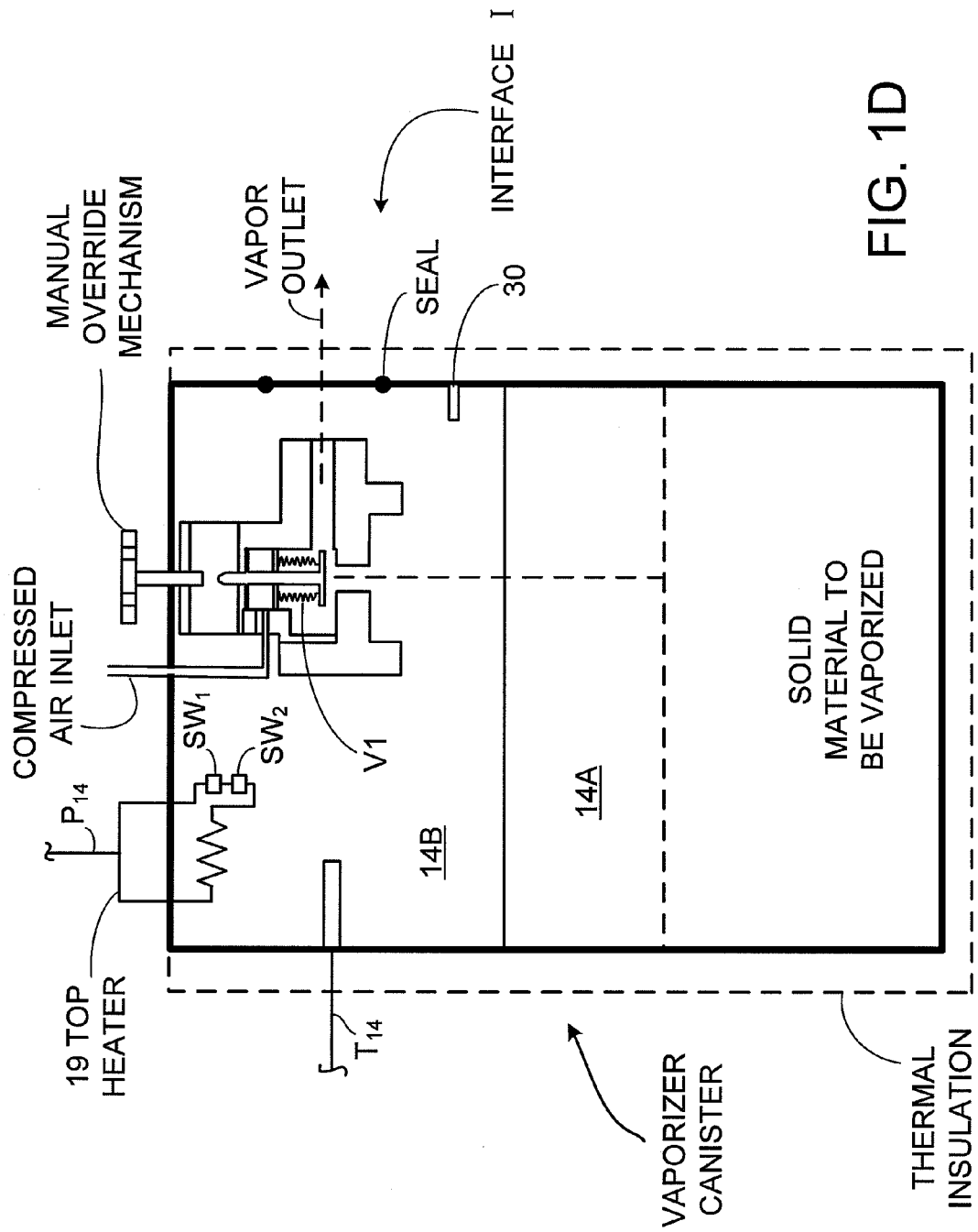
FIG. 1D is a schematic side view of a vaporizer useful in the system of FIG. 1.

Referring to FIG. 1D, in preferred implementations the vaporizer is a canister comprising a thermally-insulated canister body 14A as bottom section or member and a detachable top section or closure member 14B. Body 14A has a top opening and a volume, for instance, of 1 liter, for holding a charge of solid feed material that is to be progressively sublimated. Detachable top member 14B incorporates a valve V1. The op and bottom members, and preferably the valve as well, are comprised of thermally conductive material, for instance aluminum. The valve is located within the body 14B of the top member, by which it is maintained substantially at the temperature of the body.

Advantageously, only the top member of the vaporizer unit is electrically heated. Solid material within the canister body is heated to a major extent by heat transfer through the joint between the detachable top and bottom sections and through the side and bottom walls of the bottom section which are heated by conduction from the heater. In this manner it is ensured that the temperature $T_1$ of the vapor passage through the top member exceeds the temperature of the solid source material being sublimated.

As previously mentioned, placement of the heater in the detachable top closure section of a vaporizer-canister unit, whereas the charge of material to be vaporized at varying temperature is located in the bottom of the unit, might not appear to be good practice to those of ordinary skill. Thermal resistance of the interface between the detachable top and the bottom sections and the distance for the heat travel with associated thermal mass and slowness of response as well as heat loss to the exterior would appear undesirable. However, it is found that significant advantages are obtainable with this arrangement and what might seem to be inherent disadvantages are found avoidable or inconsequential in suitable implementations.

Thus the system ensures that vapors produced from the material encounter passages of increasing temperature while moving from the point of generation through valve V1 and to and through flow interface device 10. Similarly the part of the vapor-receiving device 22 that precedes the point of vapor utilization may define another heating zone adapted to be held at a temperature incrementally above that of the flow interface device 10.

Figure 1E:
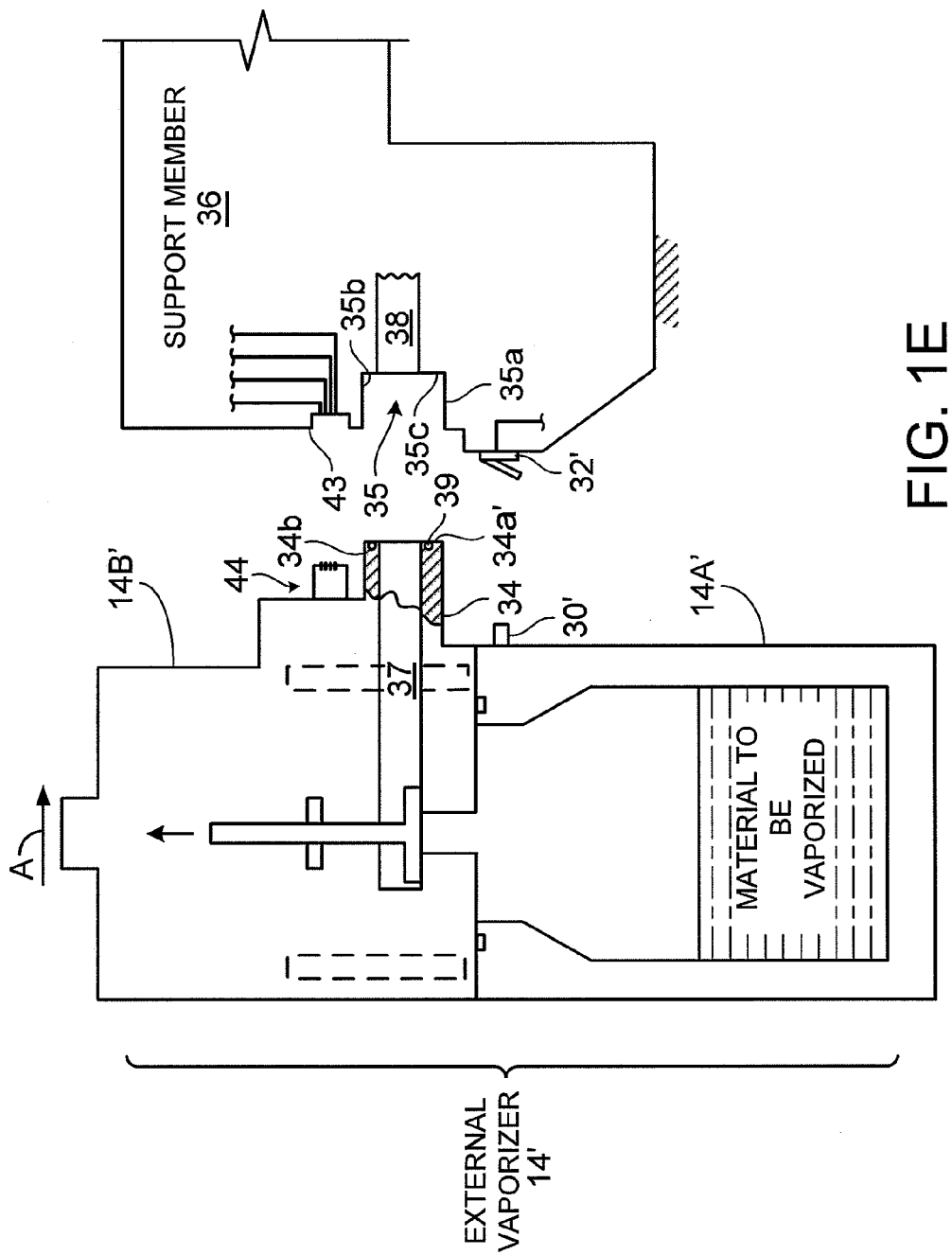
FIG. 1E is a side view of another vaporizer.

Referring to FIGS. 1E and 1F, an external vaporizer 14' is shown constructed to also serve as a delivery canister for transporting solid feed material from a supplier to the site where it is to be vaporized. The vaporizer-canister 14' comprises a thermally conductive body formed by top closure section 14A' having the heater adapted to vaporize the material and bottom section 14B' containing the charge of material to be vaporized. A lateral structural projection 34 protrudes outwardly as a cantilever from the side of the vaporizer, in this implementation from top section 14A'. Projection 34 is positioned and arranged to be engaged into a matching support receptacle 35 of a stationary vapor-accepting member 36 to position the unit preliminary to locking it into place. The projection 34 defines, internally, a vapor delivery passage 37 from the vapor volume V of the canister. The support member 36 defines a matching vapor passage 38 to conduct vapor to a point of utilization. The matching surfaces of projection and receptacle are formed of structural material having sufficient rigidity that solely by their engagement, the weight of the canister and its contents are supported upright in a secure manner. This leaves a workman's hands free to perform further activities in securing the unit and completing the vapor seal.

Thus, after delivery from a supplier, the vaporizer-canister 14, is mounted by being moved rightward, arrow A, with projection and receptacle aligned, to reach the seated position of FIG. 1F. In addition to providing support force, a reactive moment, indicated by arrows t and t', is produced by upper and lower surfaces of the receptacle 35a and 35b that resists twisting of the off-center-supported canister. After thus being assembled, a securing device applies force F to lock the canister in place for operation. An elastomeric o-ring is provided between the end surface of the projection 34 and the mating abutment surface to provide a seal against escape of vapor and to preserve vacuum. In the implementation illustrated, the o-ring 39 is provided in a circular groove in end surface 34a of projection 34. In a compressed condition o-ring 39 protrudes toward the support member; when the projection is fully installed in the receptacle, o-ring 39 is compressed between the abutting surfaces to form the desired seal.

In a preferred implementation in which thermal isolation is achieved, an insulator is interposed between the projection end and the support member with an additional seal, as described later with reference to FIGS. 15A-D.

A guide feature is associated with the projection-receptacle combination to ensure that the vaporizer canister is installed upright In the implementation of FIGS. 1E and 1F, projection 34 and receptacle 35 are of circular transverse cross-section, except that an axially extending flat chordal surface is formed along the upper portion of the projection 34, which is engaged by a matching surface of receptacle 35. See also FIGS. 15A-D.

In an advantageous implementation, the assembly has additional systems that engage during installation movement of the vaporizer canister, for instance electric and compressed air connection system and a mechanical code system. The guide feature implemented by a flat guiding surfaces, as just described, provides general alignment for these systems as well.

In the implementation of FIGS. 1E and 1F, the vaporizer is electrically heated, includes a pneumatic valve and has position and temperature detectors. This requires application of electrical power, compressed air and signal connections to the unit to enable operation. Support member 36 that receives vapor from the canister also carries the necessary air, power and signal lines. It mounts a connector in position to mate with a complementary connector of the vaporizer canister during the canister mounting motion, arrow A. This is illustrated in FIG. 1E by a multipurpose connector 43 mounted on support member 36 and complementary multipurpose connector 44 mounted on the canister, the two aligned to engage with the mounting motion A of the canister. Such a connector is available for instance from FCT Electronic GmbH of Munich, Germany, shown in FIGS. 14 and 14A.

Also, as with the vaporizer of FIG. 1D, a mechanical failsafe arrangement ensures that proper levels of power are applied to the vaporizer in keeping with the type of feed material carried by the vaporizer. For this purpose support member 36 carries two microswitches 32', one seen in FIG. 1E. The canister has two corresponding locations at one or both of which switch actuators are placed in predetermined manner depending on the code designation of the particular feed material for which the canister is dedicated. Switch actuator 30' is shown in FIG. 1E. Guided motion in direction A of the vaporizer canister to the assembled position of FIG. 1F causes those switch actuators 30' that are present to engage and actuate the respective switches 32', signaling to the control system the type of feed material present; thus power control to the vaporizer is caused to appropriately regulate the vaporization temperature to the range designed for the selected feed material to which the vaporizer canister unit is dedicated.

Figure 14:
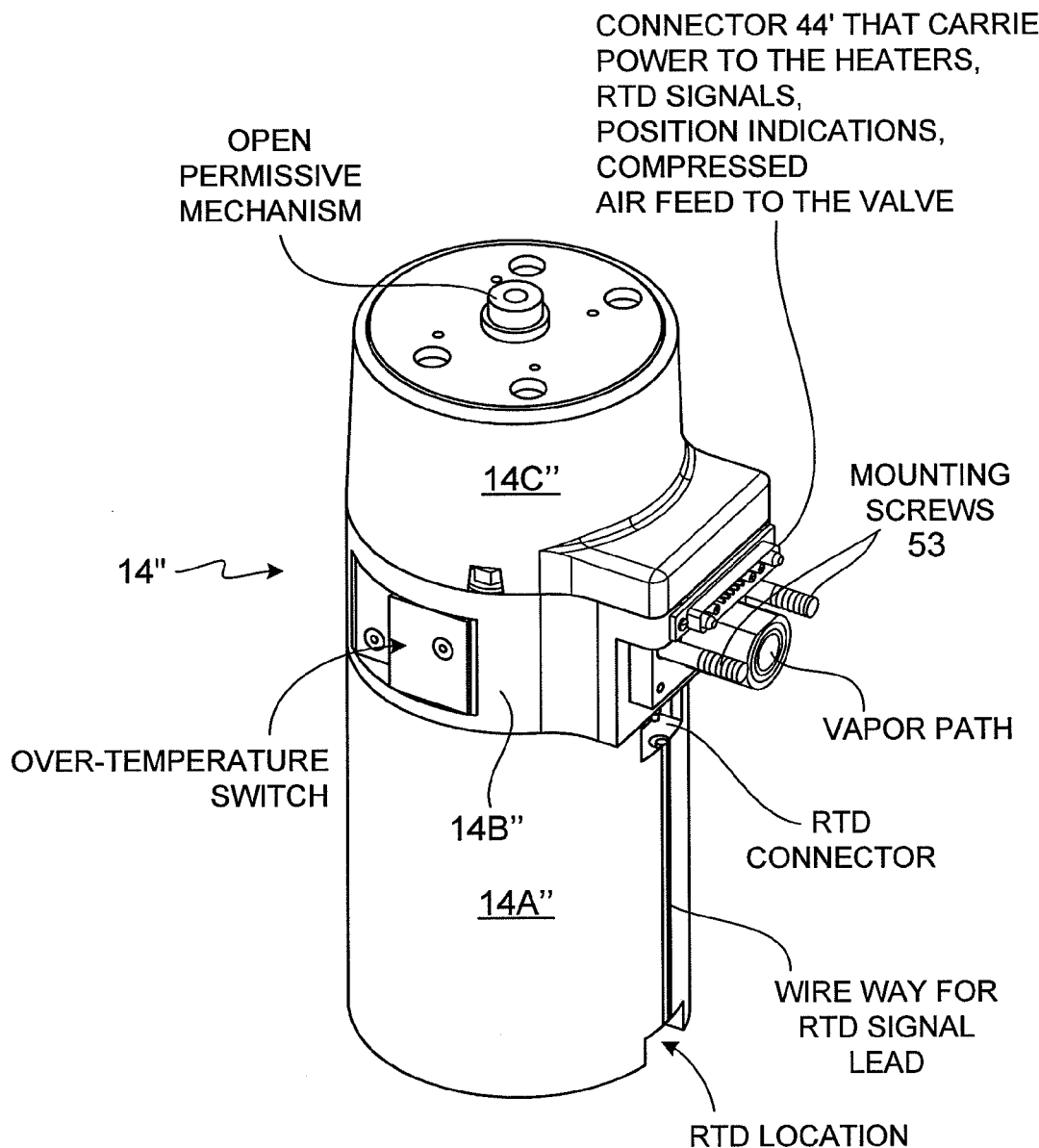
Figure 14A:
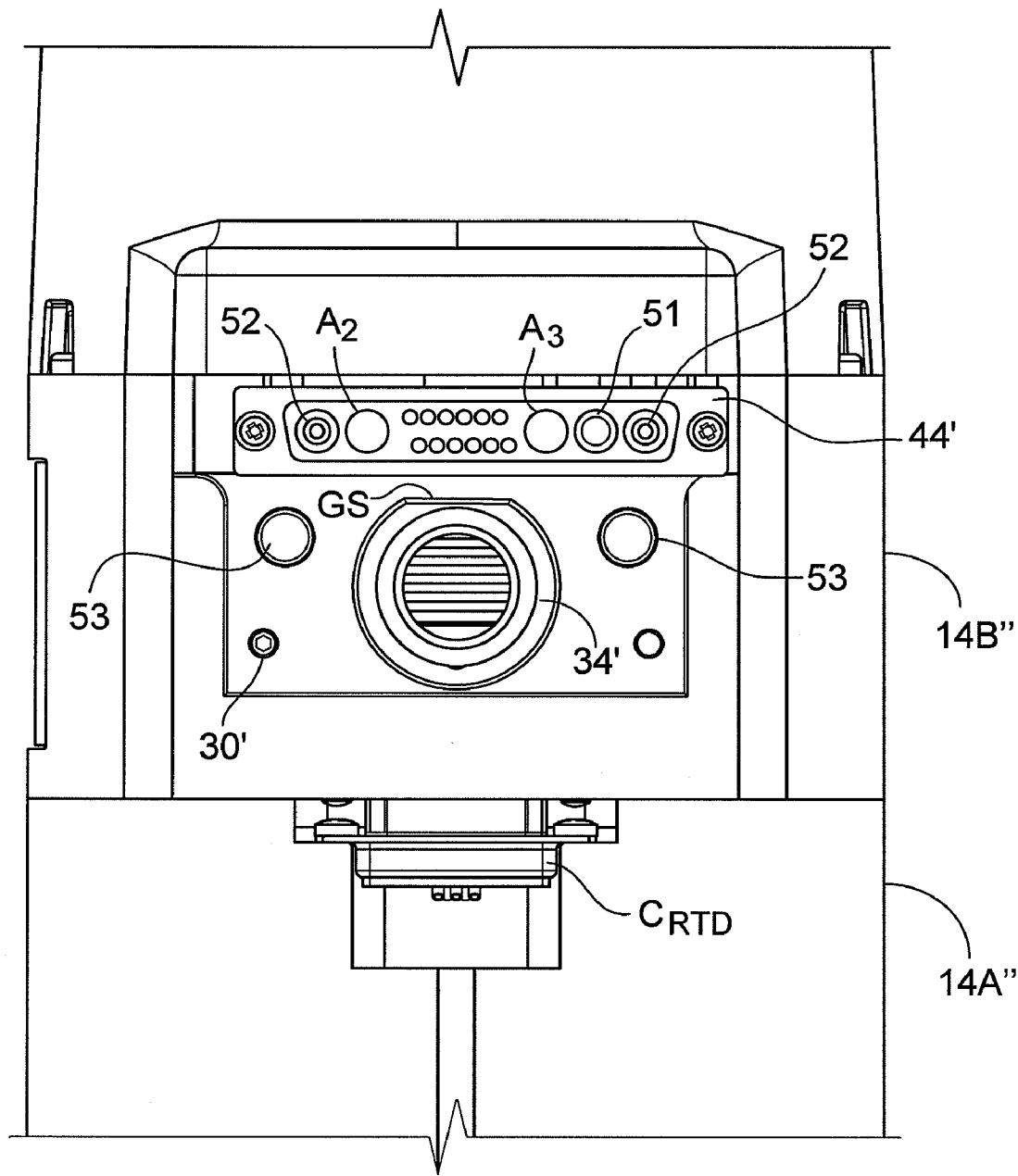
FIG. 14A is a partial vertical side view in the direction of the axis of the connection features.
Figure 14B:
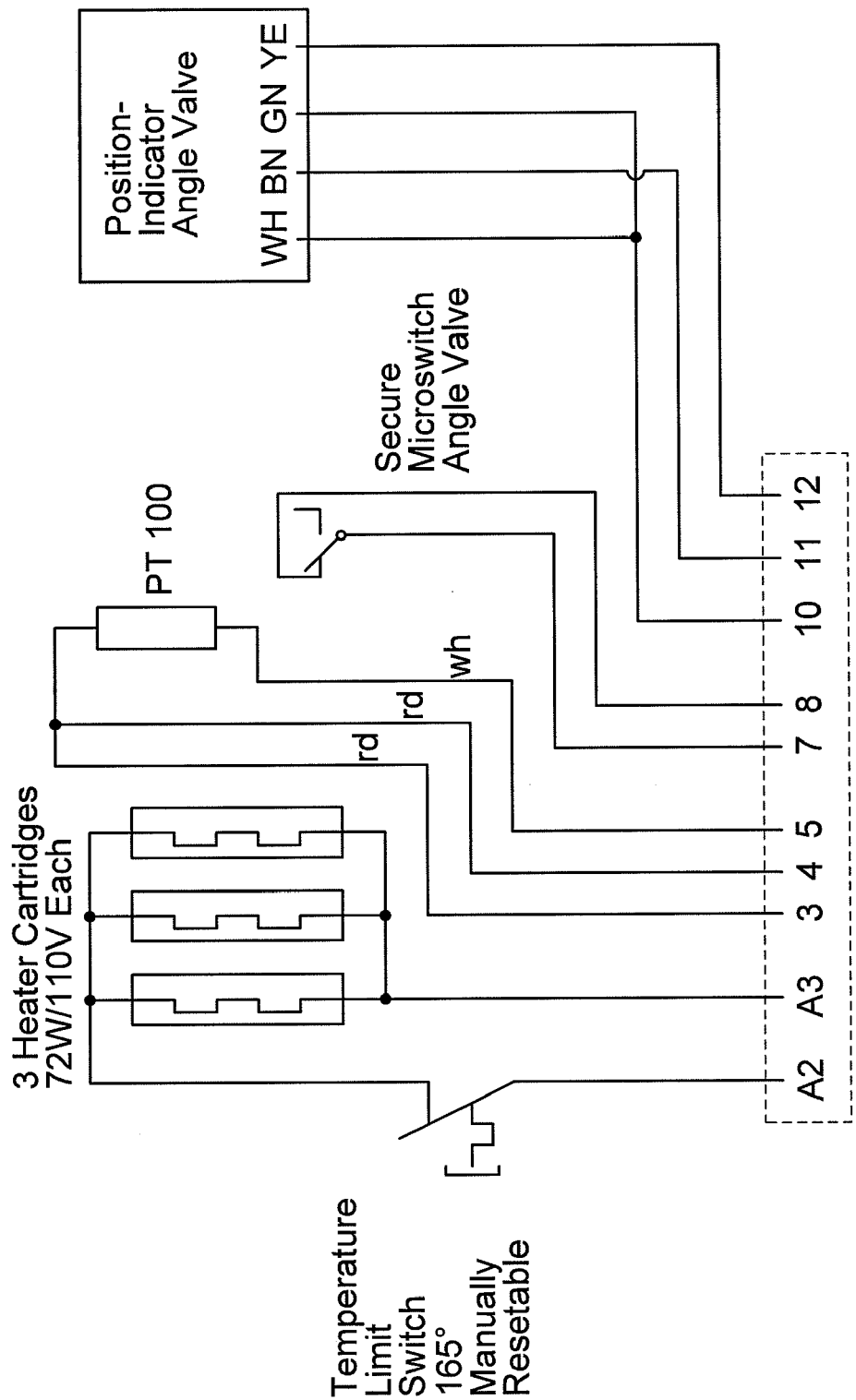
FIG. 14B is a detail of the set of electrical connection pins shown in FIG. 14A.
Figure 14C:
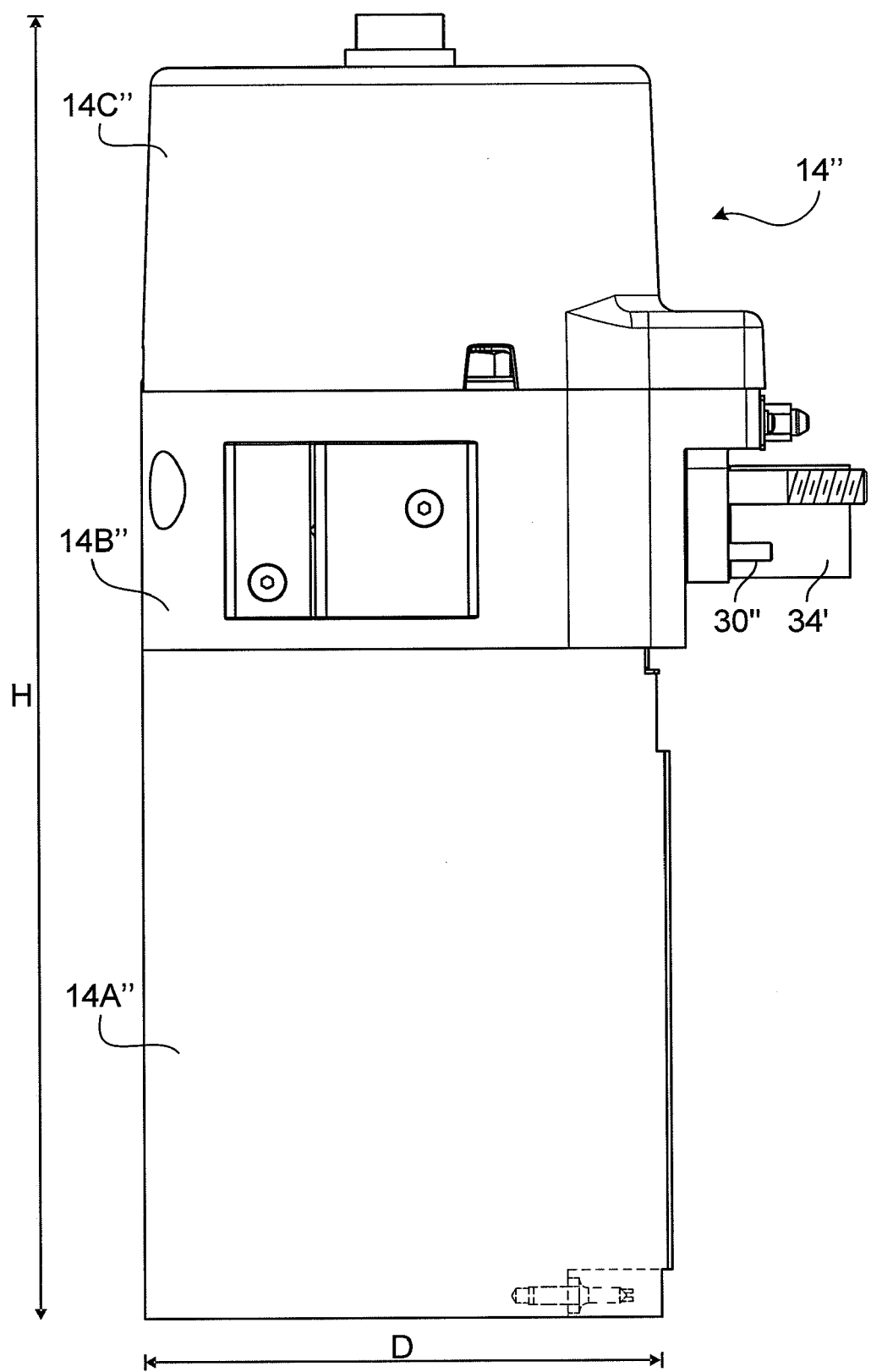
FIG. 14C is a vertical side view of the vaporizer of FIGS. 14 and 14A taken orthogonal to FIG. 14A.
Figure 14D:
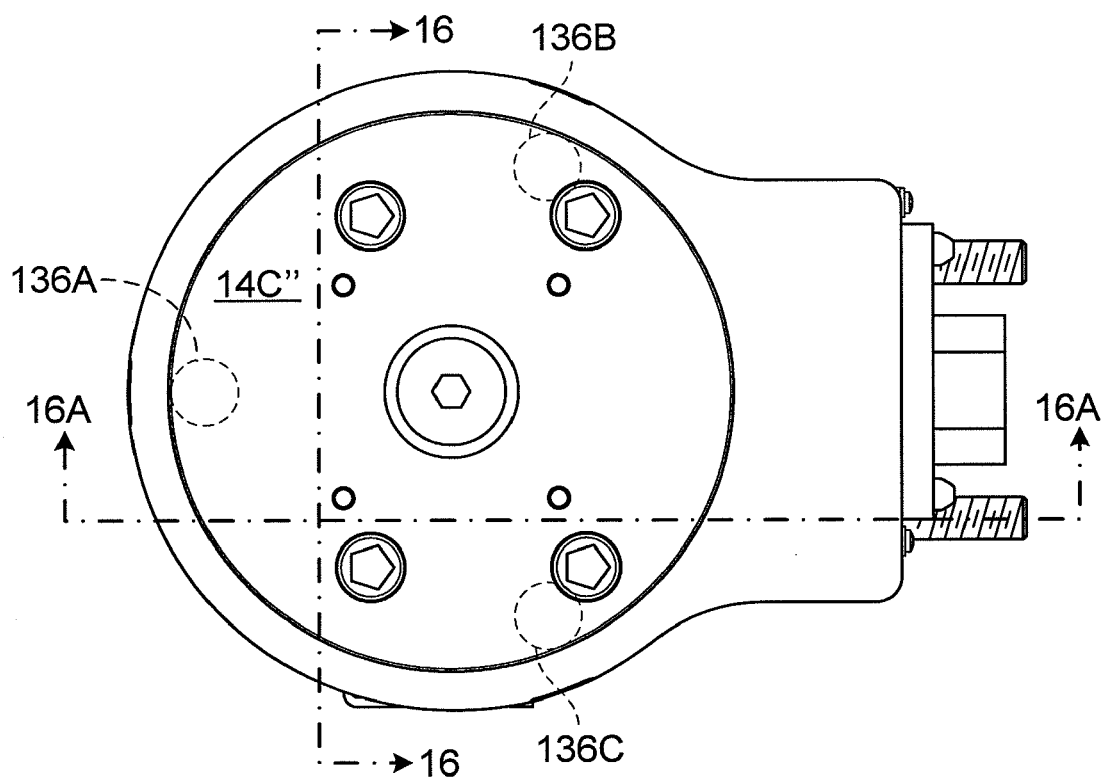
FIG. 14D is a top view of the vaporizer and FIG. 14E is a perspective view of a machine screw employed to assemble a cover to the top part of the vaporizer, and the top part to the bottom part of the vaporizer.
Figure 14E:
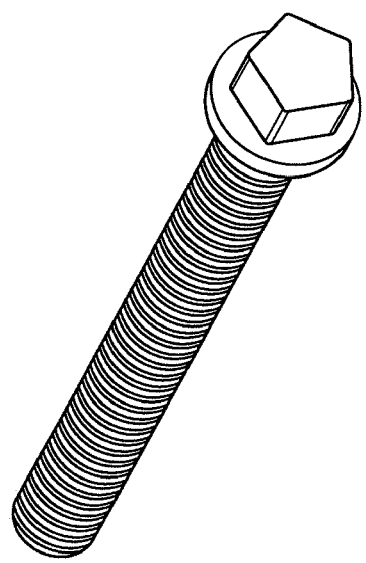
Figure 15A:
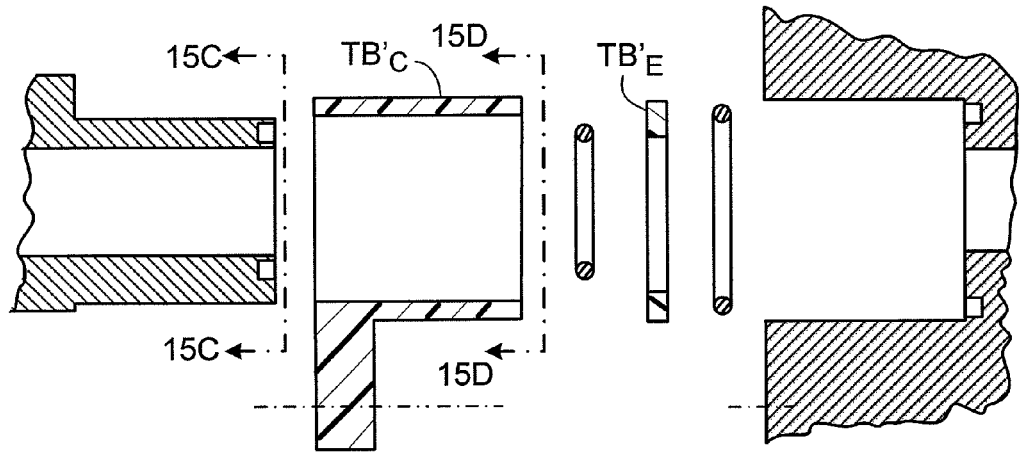
Figure 15B:
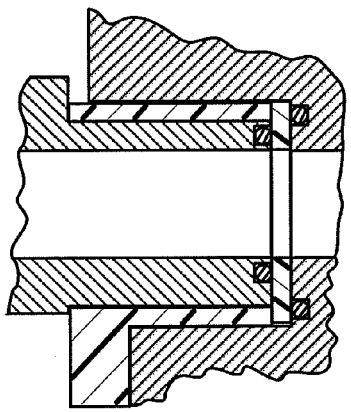
FIG. 15B shows the parts assembled and FIGS. 15C and 15D are end views of the projecting member and of a circumferential insulative member, respectively, taken as shown in FIG. 15A.
Figure 15C:
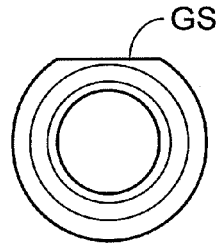
Figure 15D:
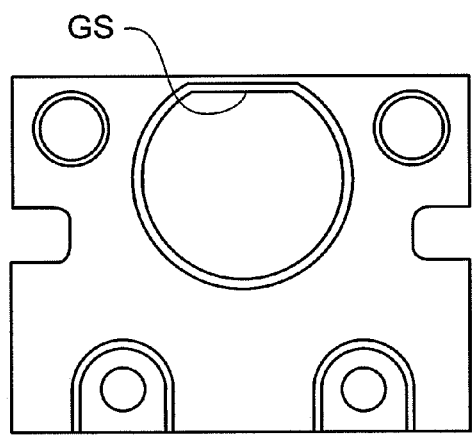
Figure 16A:
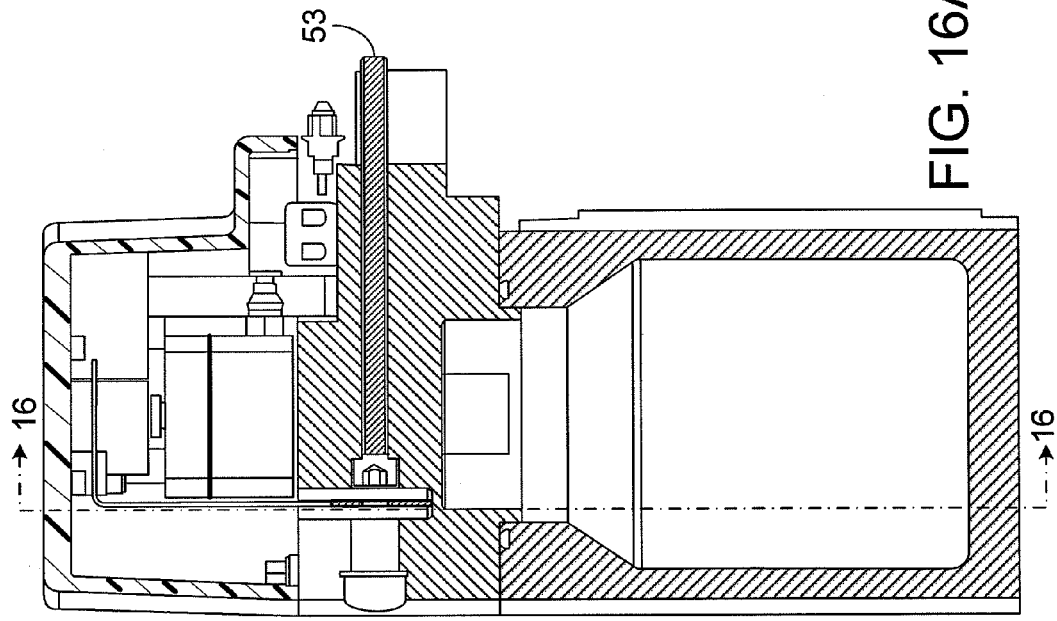
FIGS. 16 and 16A are orthogonal, diagrammatic vertical cut-away views of the vaporizer of FIG. 14, taken on lines 16-16 and 16A-16A of FIG. 14D, showing the relationship of the open-permissive bar to the horizontal screws that fasten the vaporizer to the flow interface device.
Figure 16:
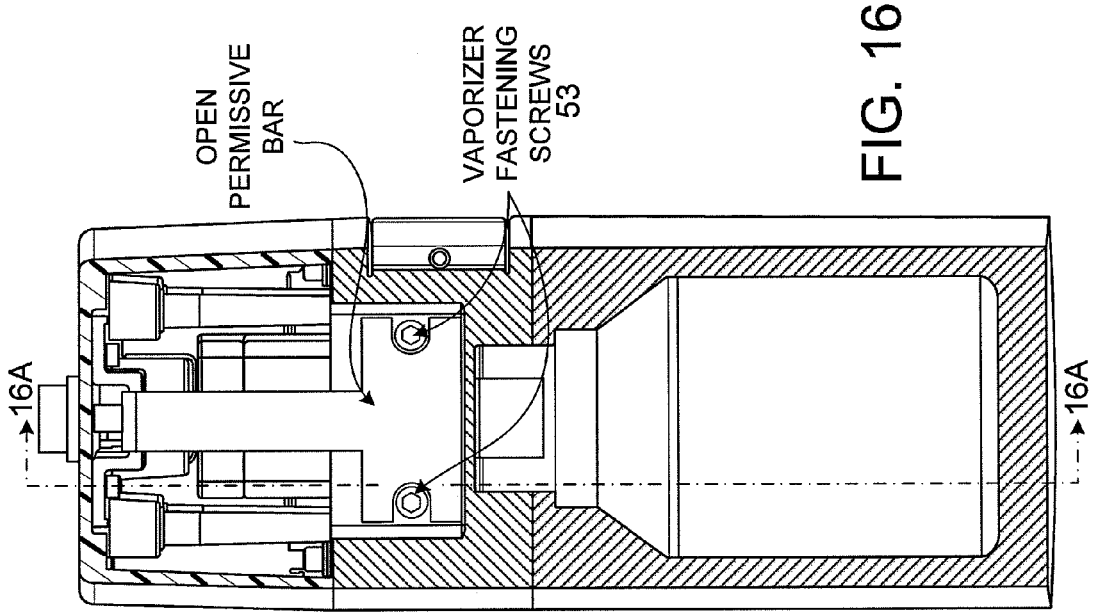

FIGS. 1G-1K and 1H, as well as FIGS. 14-14E, and FIG. 16 show details of a preferred implementation of the vaporizer-canister features just described. These figures will be described later herein. Suffice it to note here that: only the detachable top section 14B″ of the vaporizer-canister contains the heater as well as the delivery passage and internal valve; the support projection 34' protruding as cantilever from the vaporizer body is comprised of rigid aluminum and is integral with the aluminum body of the top part of the canister; and the connector module 44' carried by the canister is a multipurpose unit, providing, within one housing, connections for power $A_2$, $A_3$, electrical signal (the twelve pins) and compressed air tube connector 50. Guide pins 52 are included to ensure fine alignment with the mating module or the support member, after the vaporizer-canister is moved in direction A of FIG. 1E to provide course alignment.

The vaporizer-canister of FIGS. 1E and 1f is well suited for use in the system schematically shown in FIG. 1. For this purpose the flow interface device of FIG. 1 and of similar figures described later herein is modified to provide the mating female receptacle to receive support projection 34'.

Figure 1G:
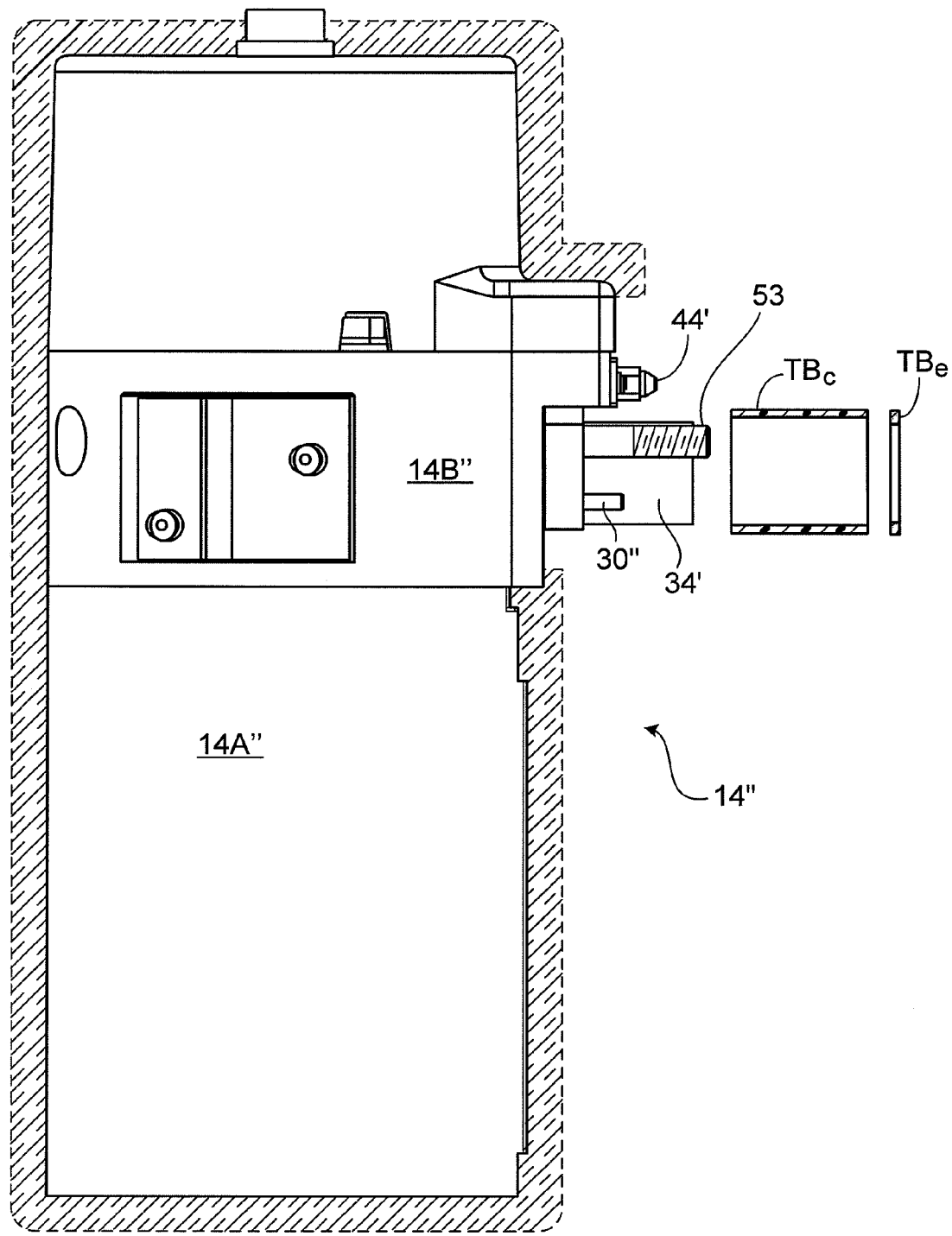
Figure 1H:
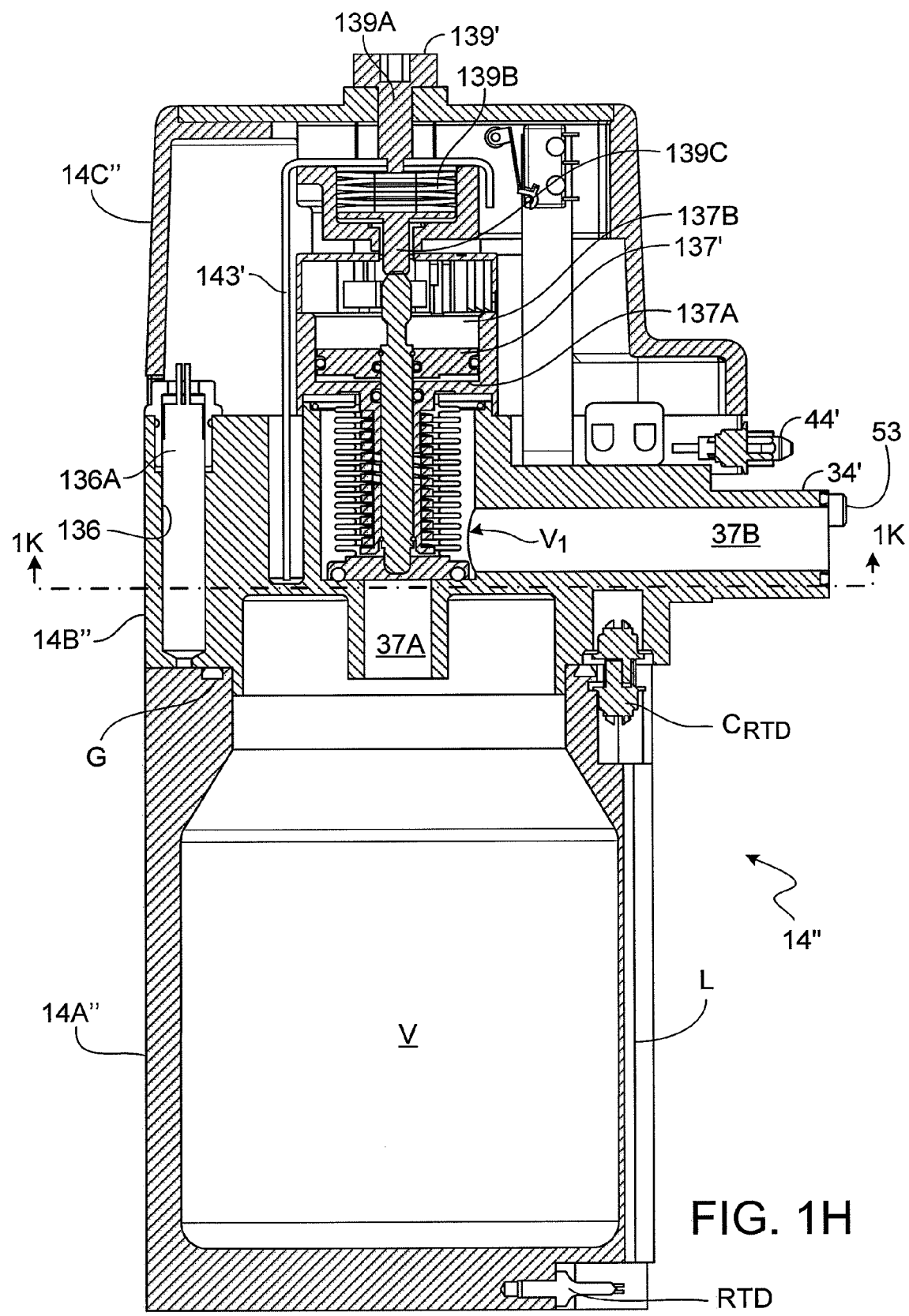
FIG. 1H is a vertical cross-section of the vaporizer through its center.
Figure 1I:
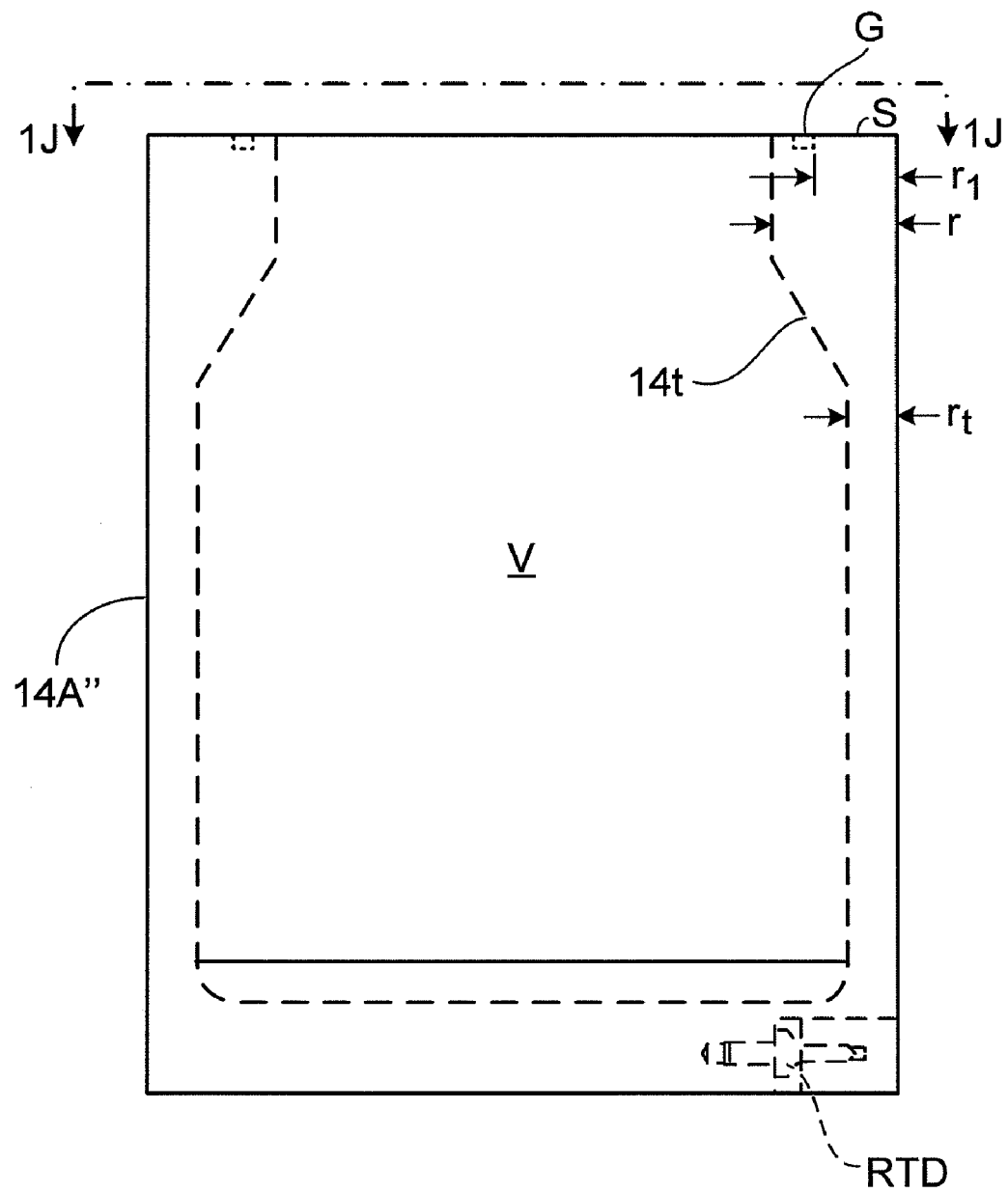
Figure 1J:
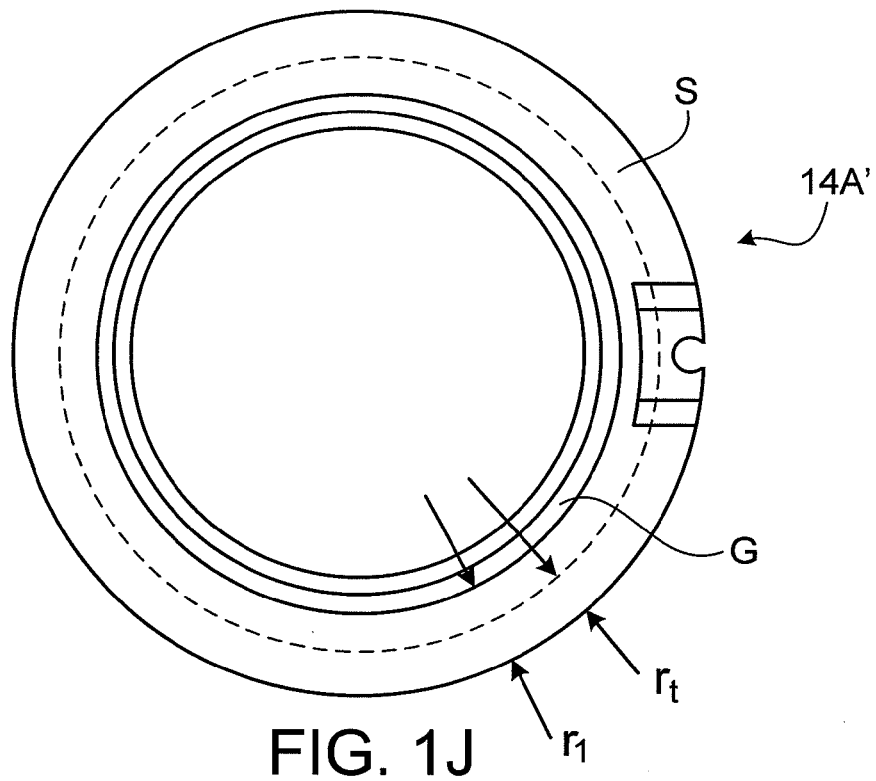
Figure 1K:
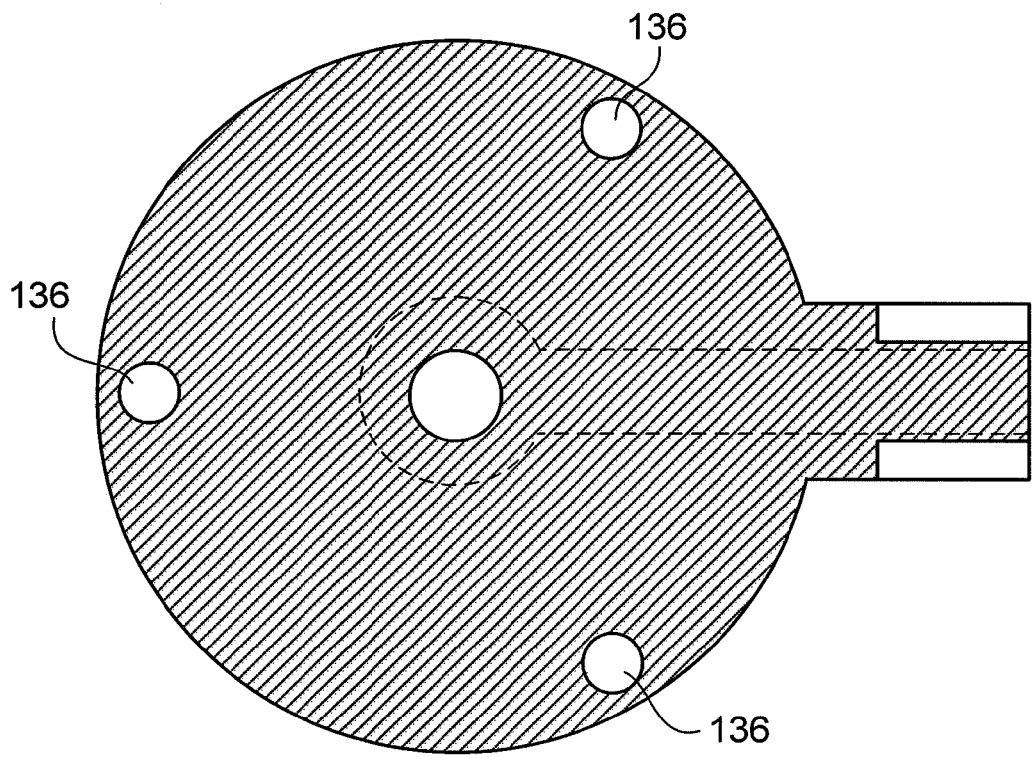
FIG. 1K is a horizontal cross-section of the vaporizer, taken on line 1K-1K in FIG. 1H.
Figure 1L:
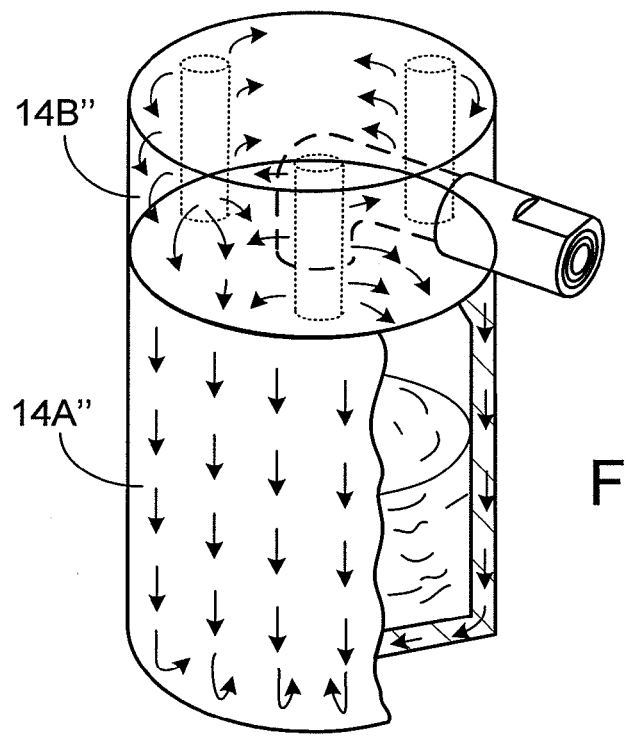
Figure 1M:
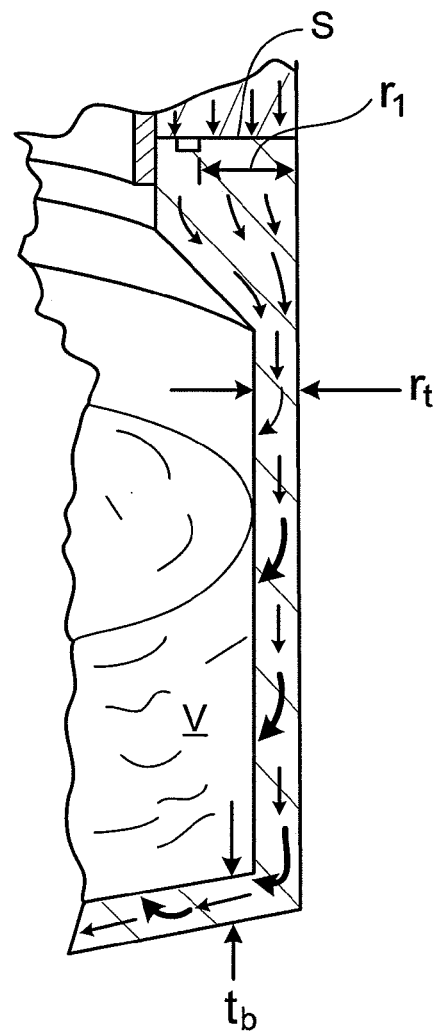
FIG. 1M is a magnified view of a portion of FIG. 1L.

FIG. 1L is a diagrammatic, perspective view with part broken away illustrating heat transfer paths in the vaporizer unit while FIG. 1M is a magnified view of a portion of FIG. 1L.

Figure 2:
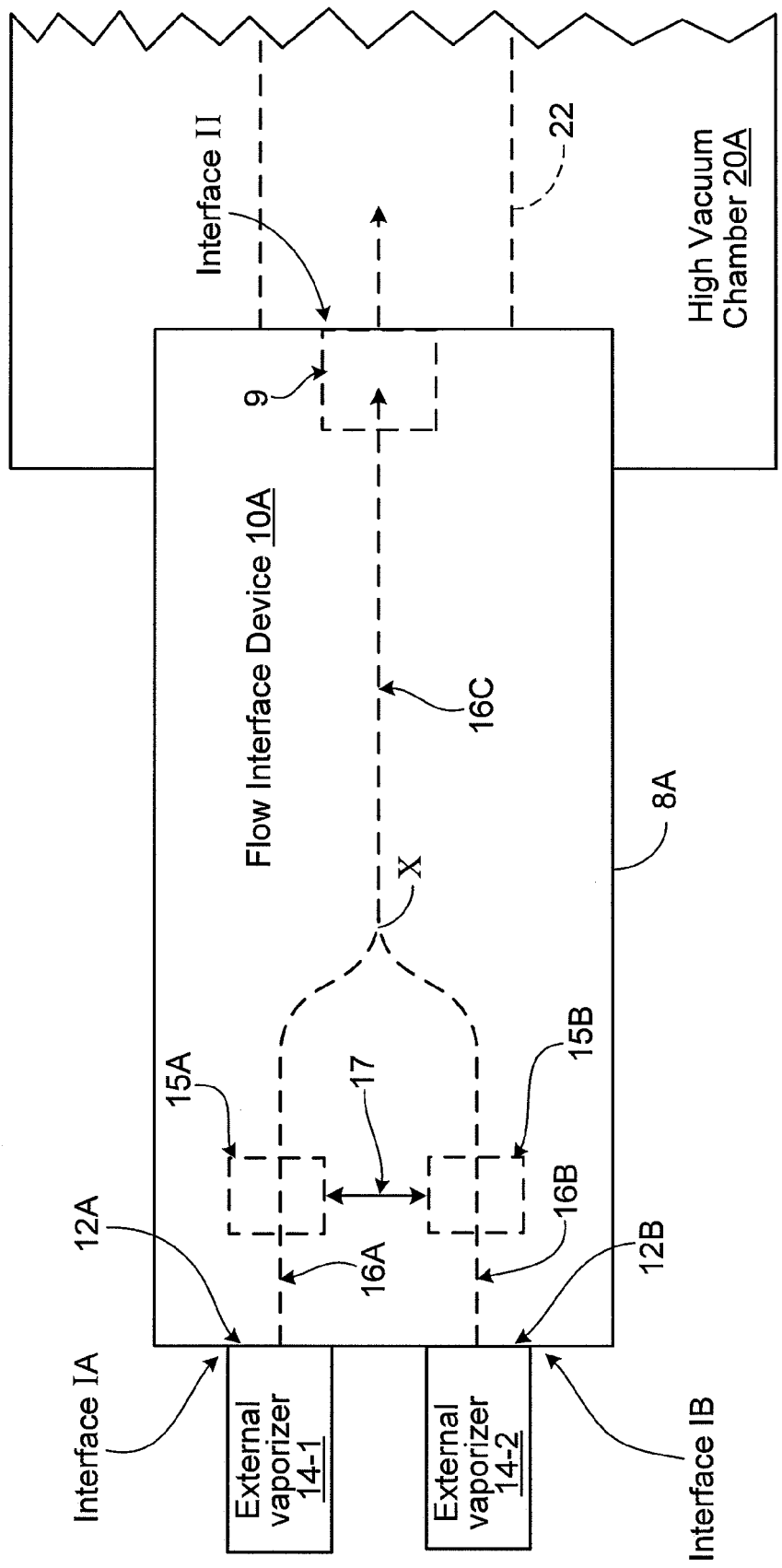
FIG. 2 is a schematic bottom plan view of an arrangement having a flow interface system similar to that of FIG. 1, and which provides mounting stations for two vaporizers that supply vapor through a common vapor delivery path.

Referring now to the plan view of FIG. 2, the flow interface system has all the features of the system of FIG. 1, some not shown, and also defines multiple vaporizer mounting stations. Two are shown, stations 12A and 12B.

Individual flow path segments 16A and 16B extend partially through the length of portion 8 of the thermally conductive body of device 10A, respectively, from the mounting stations 12A and 12B. Paths 16A and 16B merge at junction X. A common vapor flow path segment 16C extends through the remainder of portion 8A and through extension 9 of interface device 10A to interface II where the vapor is delivered to vapor-receiving device 22. Stop valves 15A and 15B in device 10 are associated with the individual flow paths 16A and 16B. As indicated by link 17, valves 15A and 15B are interlocked. This is done, in the case shown, in a manner that ensures each valve must be closed before the other can be opened. This prevents simultaneous flows from paths 16A and 16B.

The flow interface device 10A thus provides ready access for removal and servicing of two vaporizers without disturbance of the sealed connection 21 of interface device 10A with the high vacuum chamber 20; it permits one vaporizer to be serviced or filled, while another, containing the same source material, produces vapor and permits vaporizers of two different species to be installed for selective use. By providing, at Interface I, thermal isolation of the vaporizer-canister from the remainder of the system, an inactive unit is enabled to cool so that any charge of material remaining in the unit does not substantially degrade.

Figure 3:
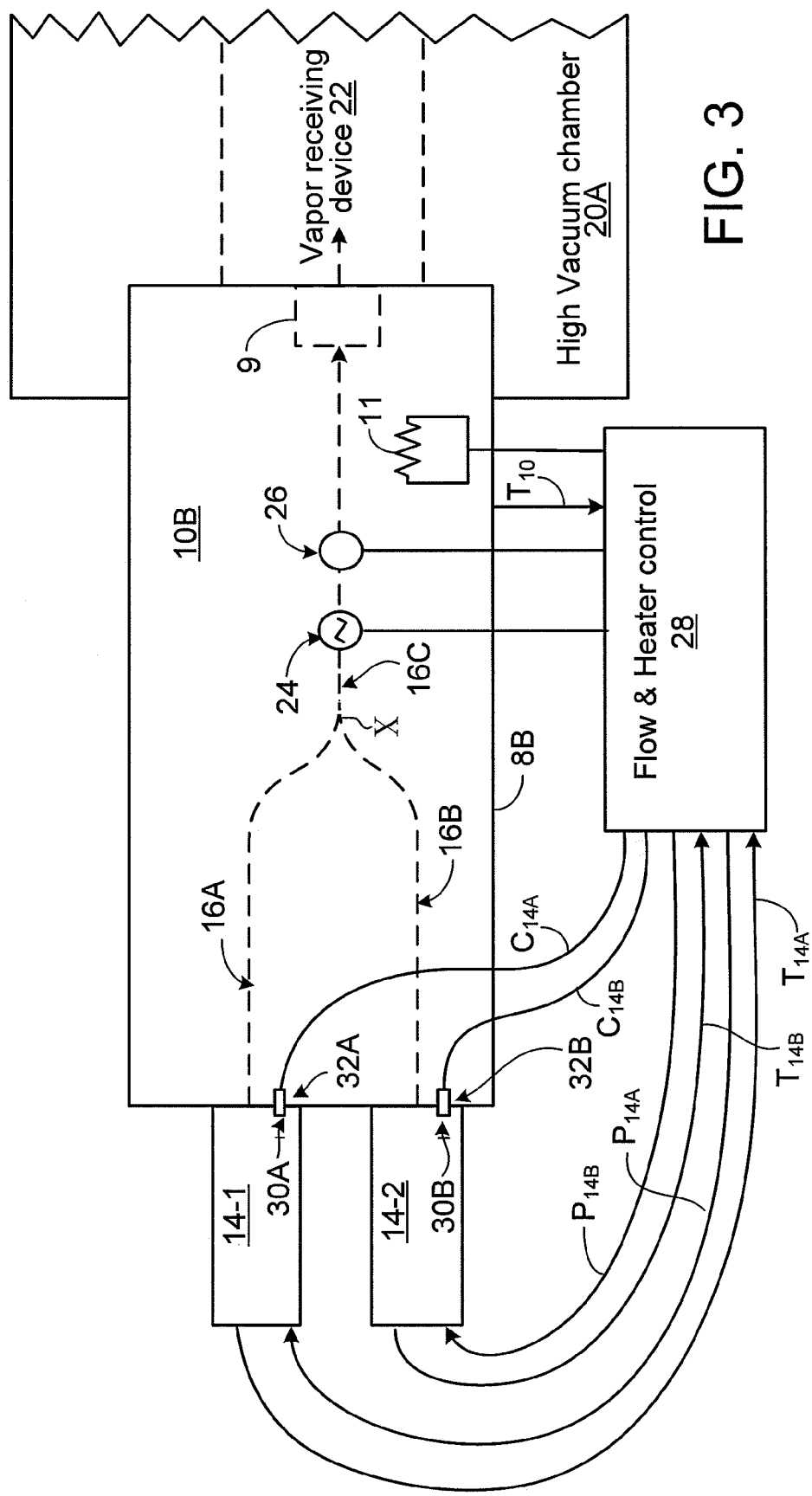
FIG. 3 is a schematic bottom view of an arrangement having a flow interface system similar to that of FIG. 2, and incorporating a flow control and vaporizer heating system by which a desired vapor flow from each of two vaporizers can be selectively sustained.

Referring to FIG. 3, the flow interface system has all features of the system of FIG. 2, some not shown. Also, in common path 16C, the flow interface device 10B of FIG. 3 includes flow control device or throttle valve 24 followed by pressure monitor 26. These are connected to flow and heater control device 28 of the interface system. Control device 28 is connected to temperature sensing lines $T_{14A}$ and $T_{14B}$ and heater power lines $P_{14A}$ and $P_{14B}$ for the respective vaporizers 14A and 14B. Recognition devices 32A and 32B at the mounting stations interact with identity devices 30A and 30B on vaporizers 14A and 14B dedicated to particular source materials. The recognition devices communicate the identities of the types of vaporizers to the flow and heater control system 28, causing the latter to select proper operating limits, and application of appropriate power to the respective vaporizer heaters 19.

The flow control device 24 in common path C may comprise a throttle valve such as a butterfly valve that varies the vapor conductance of the passage. The control system may be constructed to operate in accordance with the protocol described in the patent application WO 2005/060602 published 7 Jul. 2005, entitled "Controlling the Flow of Vapors Sublimated from Solids", the entire contents of which are hereby incorporated by reference.

In particular, the operation of such a throttle valve to deliver a desired flow depends upon there being a desired pressure of vapor in the region immediately upstream of the throttle valve. It is to be noted that at a given vaporizer temperature, the amount of the vapor generated and hence its pressure, is dependent upon the amount of the charge of feed material that remains in position to be heated to vaporization temperature. To compensate for progressive depletion of the original charge of material, the control system senses delivered pressure and increases the temperature of the vaporizing chamber accordingly. It is advantageous for the vaporizer system to be capable of achieving the increased temperature without great delay. This is important during operation and is especially important during start-up when the operating pressure and heating system is being tuned to achieve desired performance of the overall system.

The single flow control device 24, being situated in the common path segment 16C, is capable of selectively controlling flows from two or more vaporizers at respective mounting stations. By interlocks, including the selected position of linked valves 15A and 15B as described in FIG. 2, the system may be prevented from heating and transmitting vapor from more than one vaporizer at a time. The selected vaporizer, device 10B and device 22 are constructed to be heated to the appropriate temperatures, e.g. $T_1 < T_2 < T_3$, where all of these temperatures are limited to a temperature $T_4$ below a safety limit for the particular material in the vaporizer selected. Thus, it is ensured that heating is applied in the pre-determined safe range appropriate for the material in the selected vaporizer, and that other conditions relevant to that material are properly controlled.

Figure 4:
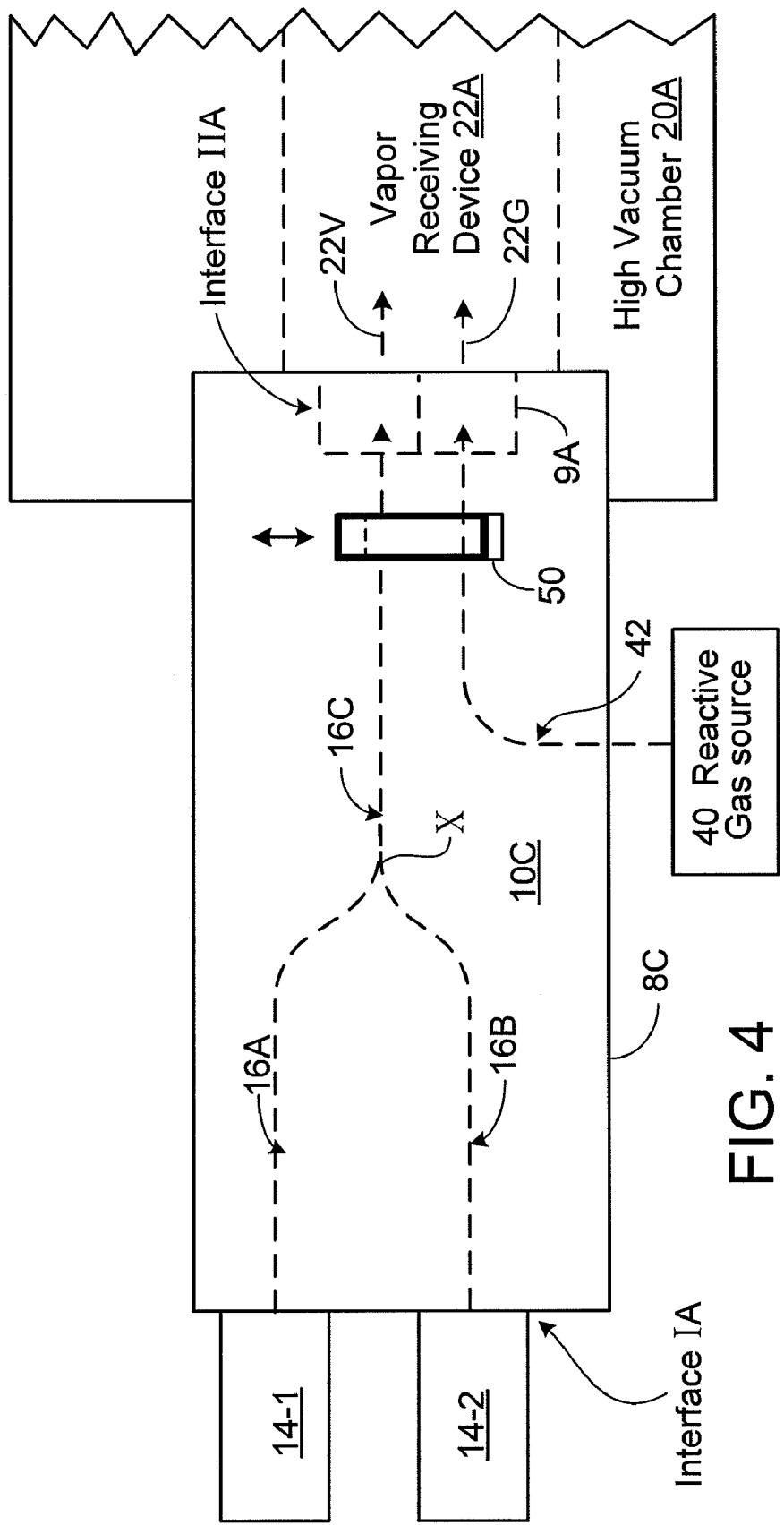
FIG. 4 is a schematic bottom view of an arrangement having a flow interface system similar to that of FIG. 2 that incorporates a reactive gas source and a flow-stopping device that prevents co-communication of flows.

Referring to FIG. 4, a system is shown which may have all features of the system of FIG. 2 or 3, some not shown, and is provided with a reactive cleaning gas source 40 which communicates with passage 42 in portion 8C of the body of flow interface device 10C. An extension 9A of the flow interface device is sealed to a wall of the high vacuum chamber 20A and protrudes into the high vacuum chamber 20A to interface II-A. It defines two separate flow paths to the vapor receiving device 22A, path 16C for flow of vapor from the common vapor path and parallel but separate path 42 for flow of reactive cleaning gas. Sealed connection with corresponding passages 22V and 22G of the vapor-receiving device 22A are removably formed at interface II-A; each may be formed by labyrinth seals in the manner previously described. Leakage from either seal can be contained by the surrounding walls of high vacuum chamber 20A.

If implemented according to FIGS. 1A-1C, for instance, installation and removal movements of vapor-receiving device 22A along path A, can make and disconnect sealed connection of both vapor and reactive gas passages through extension 9A. Close-fitting surfaces of the matching parts can effectively form the labyrinth vacuum seals as previously described.

The reactive cleaning gas source 40 may be a container of reactive gas or a means for generating a reactive gas from a gaseous or solid feed material.

The interface device 10C of FIG. 4 includes a valve interlock 50 that prevents simultaneous flow of vapor and reactive cleaning gas to vapor receiving device 22A. In a preferred implementation, this is achieved with a reciprocal spool valve, which ensures that each path is completely closed before the other path is opened. In an alternative construction not shown, in which the reactive gas source 40 is a reactive gas generator that has a feed gas supply line for feed gas to be disassociated, the interlock can be formed with the feed supply line to the gas generator rather than with the reactive gas line, in a manner that can disable the supply line. In this case, the reactive gas connection with the vapor-receiving device may be separately formed.

Figure 5:
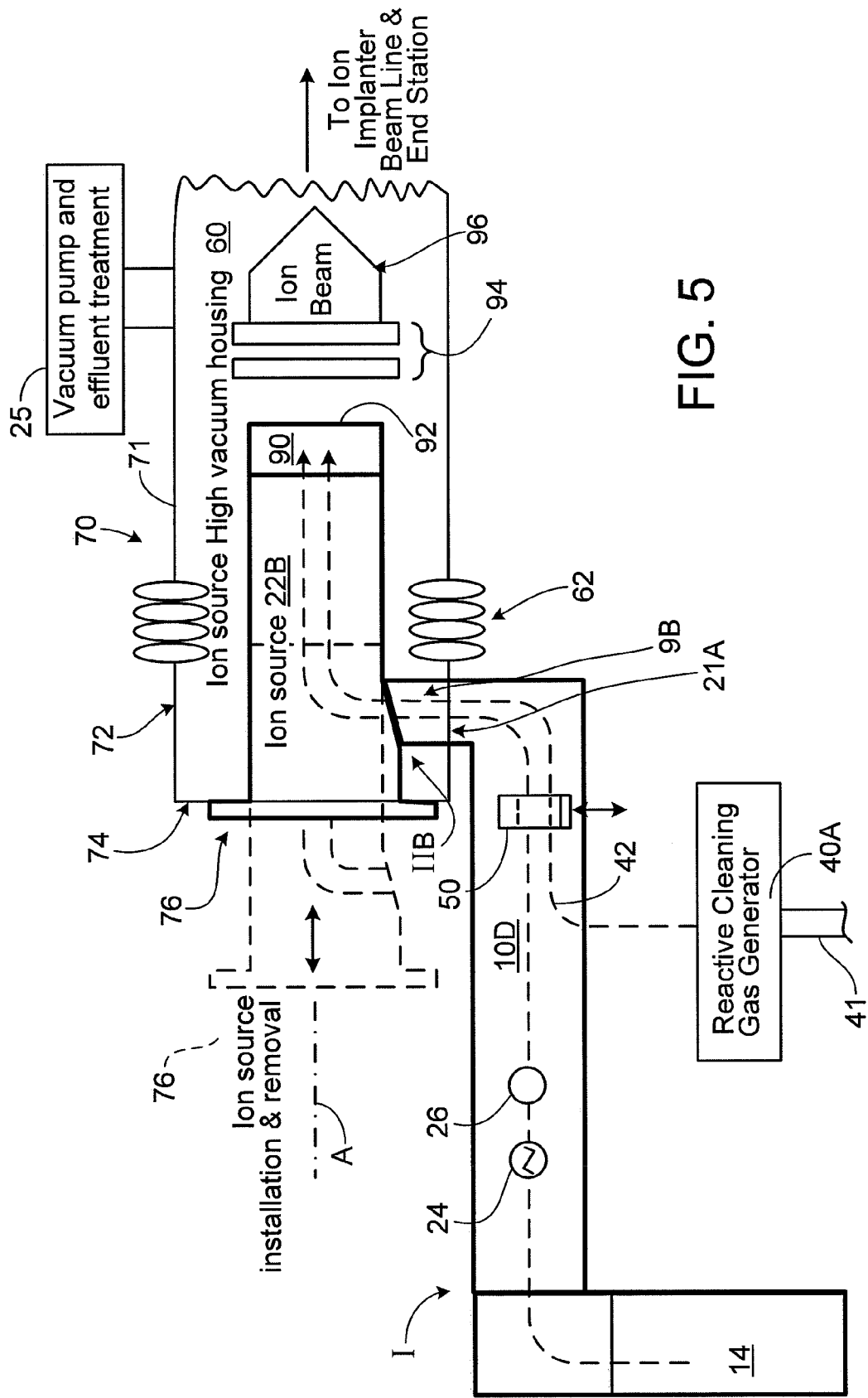
FIG. 5 is a schematic side view of an arrangement having a flow interface system similar to that of FIG. 1, shown integrated with an ion source within a high vacuum chamber, and having an external reactive cleaning gas generator and a flow-stopping device that prevents co-communication of flows.

Referring to FIG. 5, an adaptation of the general scheme of FIG. 1 is shown in which the vapor-receiving device comprises a high voltage ion source 22B, having an ionization chamber 90 into which a controlled flow of vapor is introduced to be ionized. Ions are withdrawn from ionization chamber 90 though an extraction aperture 92 by electrostatic attraction of an extraction electrode and final energy assembly 94 to form ion beam 96. The beam is directed along a beam line to an ion implanter end station, not shown. The high vacuum chamber of FIG. 5 comprises an ion source vacuum housing 70 that is provided with a high voltage insulator 62, for instance of reinforced epoxy. Insulator 62 electrically isolates the main vacuum housing member 71 from the high voltage end at which is mounted the ion source 22B and its vapor feed system 10D and 14. A vacuum-tight mounting ring 72 is provided on the high voltage side of insulator 62. It provides an end flange 74 for removably receiving and sealing with mounting flange 76 of ion source 22B. The ion source structure extends axially along axis A from the mounting flange into the vacuum chamber. As shown in FIGS. 4 and 5, the extension 9B of flow interface device 10D is of two-passage construction and is sealed at 21A to mounting ring 72. It protrudes into the high vacuum chamber to interface II-B. By constructing the interface for each passage of extension 9B according to FIGS. 1A-1C and FIG. 4, for instance, this interface can be positioned to receive the removable ion source via a connection that effectively form seals for each passage, for instance by close-fitting surfaces forming, effectively, labyrinth vacuum seals, in the manner previously described.

A reactive gas source in the specific form of a reactive cleaning gas generator 40A has a feed line 41 for a material, for instance a gaseous fluoride compound capable of being disassociated. The cleaning gas generator is constructed to provide disassociating conditions by which a reactive cleaning gas is generated, for instance, fluorine or fluorine ions. Its output is introduced to feed passage 42 in interface device 10D. As in FIG. 4, reactive gas passage 42 and the vapor flow path 16 pass through an interlock device 50, such as a spool valve, that selectively permits flow through only one passage at a time, preventing simultaneous flow. Advantageously a throttle valve 24 and pressure monitor 26 and associated controls, such as provided in FIG. 3, are provided in the flow interface device 10D. The reactive cleaning gas generator may comprise a plasma chamber or other apparatus capable of producing reactive gas cleaning from solid or gaseous feed material.

The system of FIG. 5 may readily be incorporated in each of the ion implanter systems shown in the published application WO 2005/05994 entitled "Method and Apparatus for Extending Equipment Uptime Ion Implantation," the contents of which, in this regard, are hereby incorporated by referenced as if fully set forth herein.

Figure 6:
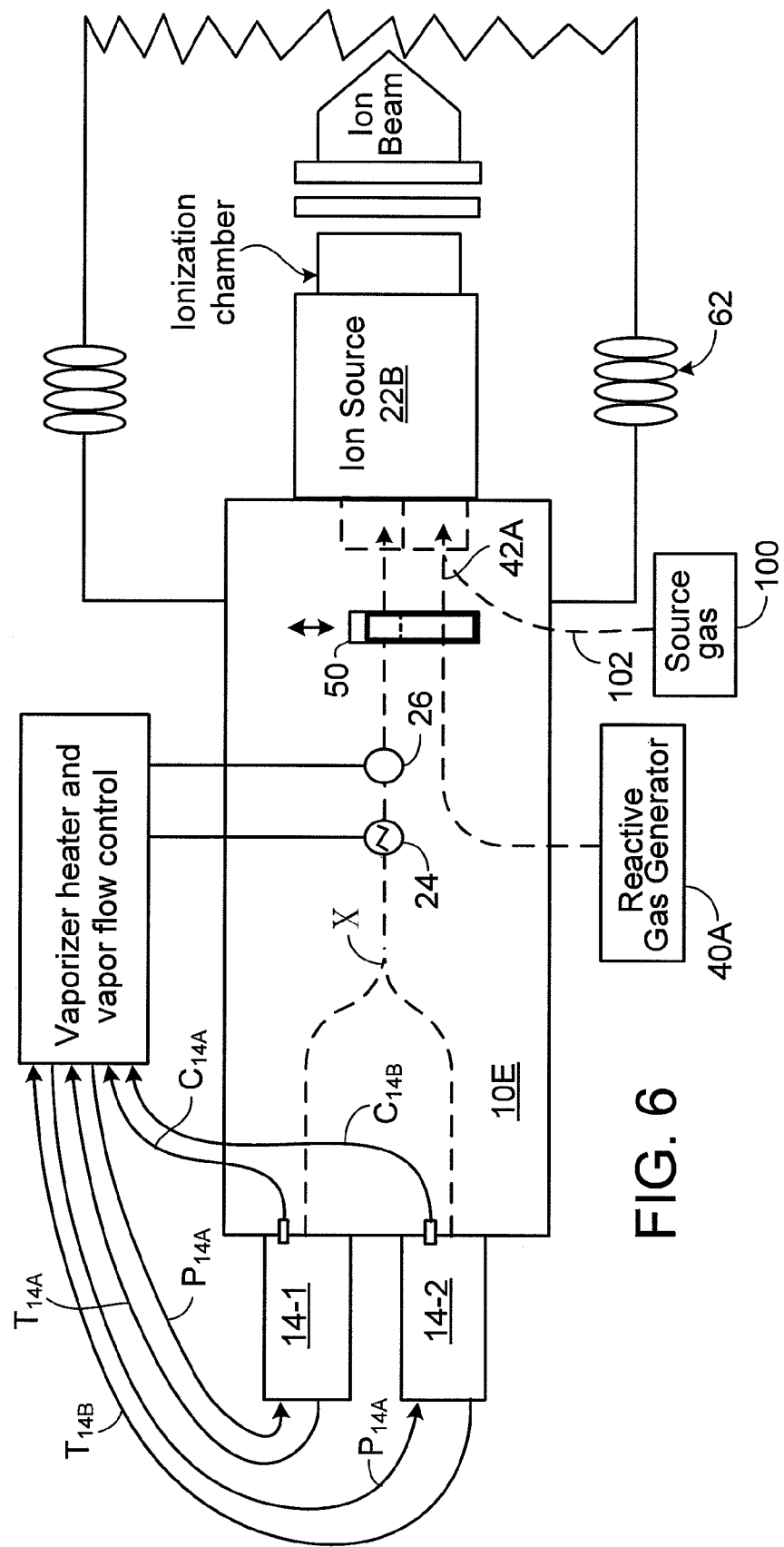
FIG. 6 is a schematic bottom plan view of an arrangement having an ion source system that has features of FIG. 5 combined with the flow control and dual vaporizer features of FIG. 3.

Referring to FIG. 6, an ion source 22B and vapor delivery system (14-1, 14-2, and 10E) similar to that of FIG. 5 may have all features of the systems of FIGS. 1-5, some not shown. In FIG. 6, two mounting stations are defined for solids vaporizers 14-1 and 14-2 for producing ionizable vapor. The system may have all interlocks and safety features so far described, and a control system constructed to control heating of the vaporizers and flow though the interface device 10E. A source of ionizable gas 100, such as gas of a monatomic doping species, is also provided having a conduit 102 associated with the interface system. It makes connection with the reactive gas passage 42A at a point downstream of the interlock 50. This downstream portion of gas passage 42A for reactive cleaning gas and the related reactive gas passage of extension 9A is thus alternately useful for introducing an ionizable material that is gaseous at room temperature for providing other dopant species. An interlock, not shown, may be provided to prevent flow of ionizable source gas when flow of ionizable vapor or cleaning gas is occurring.

Figure 6A:
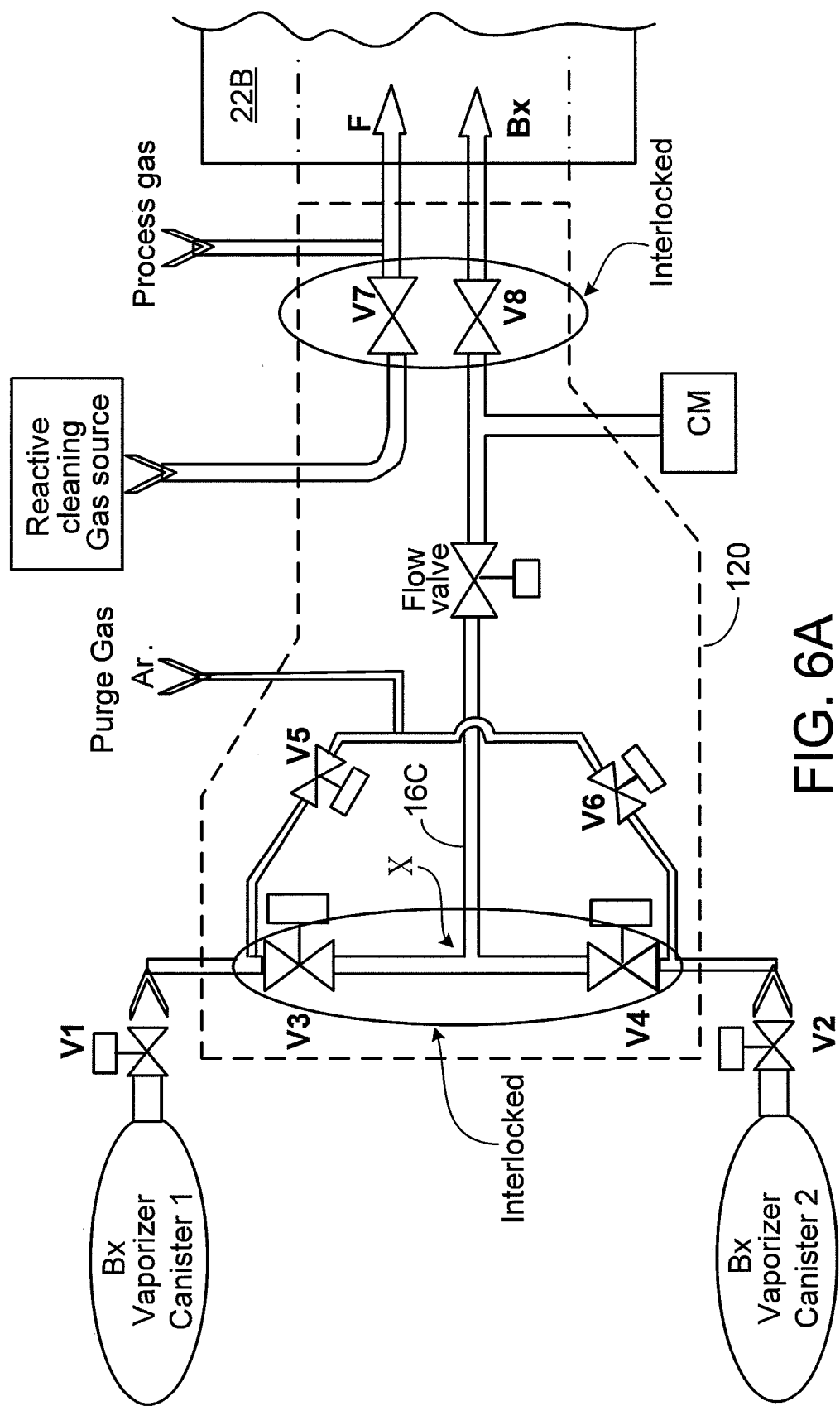
FIG. 6A is a valve and passage schematic drawing that implements features of FIG. 6 and includes a purge gas arrangement.

The schematic of FIG. 6A indicates that the flow features of FIG. 6 are incorporated in a conductive block 120. Also incorporated in the block are purge gas passages that enable purging the block e.g., with argon while the block is heated. This can remove vestiges of toxic or reactive vapor before servicing the system or before introducing vapor of another species. As indicated in FIG. 6A, this system in particular is suitable for providing boron-containing vapor $B_x$, e.g. decaborane and octadecaborane, from vaporizer bottles to an ion source 22B of an ion implanter.

The vapor system of FIG. 6A has a purge capability similar to techniques used for toxic gas boxes. The valve on the solids vaporizer canister, V1 or V2, is constructed to be remotely operated. It can thus be remotely closed to isolate the vaporizer. The interlocked vaporizer selector valves V3 and V4 (realized, for instance, in the form of a spool valve unit) also is operated to isolate the vapor delivery path from the vaporizer. A gas cavity is thus created between the bottle isolation valve and vaporizer selector valve. This gas cavity will contain residual vapor, e.g. $B_x$ vapor. Prior to vaporizer disconnection for removal, by appropriate actuation of valve V5 or V6, the cavity is cycle-purged with argon through common line 16C to eliminate any trace of $B_x$ vapor that otherwise might escape to the environment.

Figure 7:
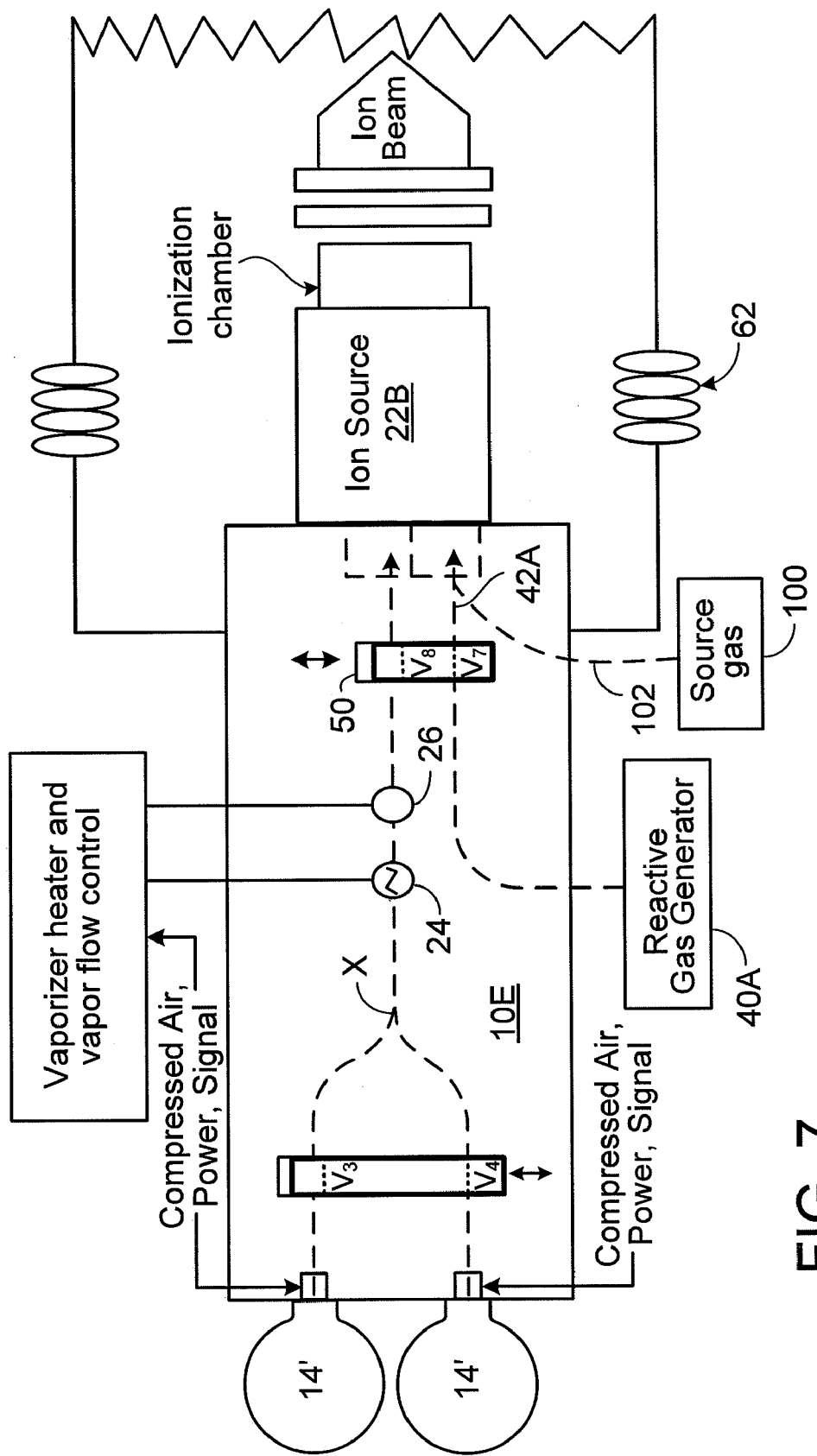
FIG. 7 is a view similar to FIG. 6, but showing installed two vaporizers of the type shown in FIGS. 1E to 1H. It also shows schematically a spool-type valve that enables selection of only one vapor passage at a time.
Figure 7A:
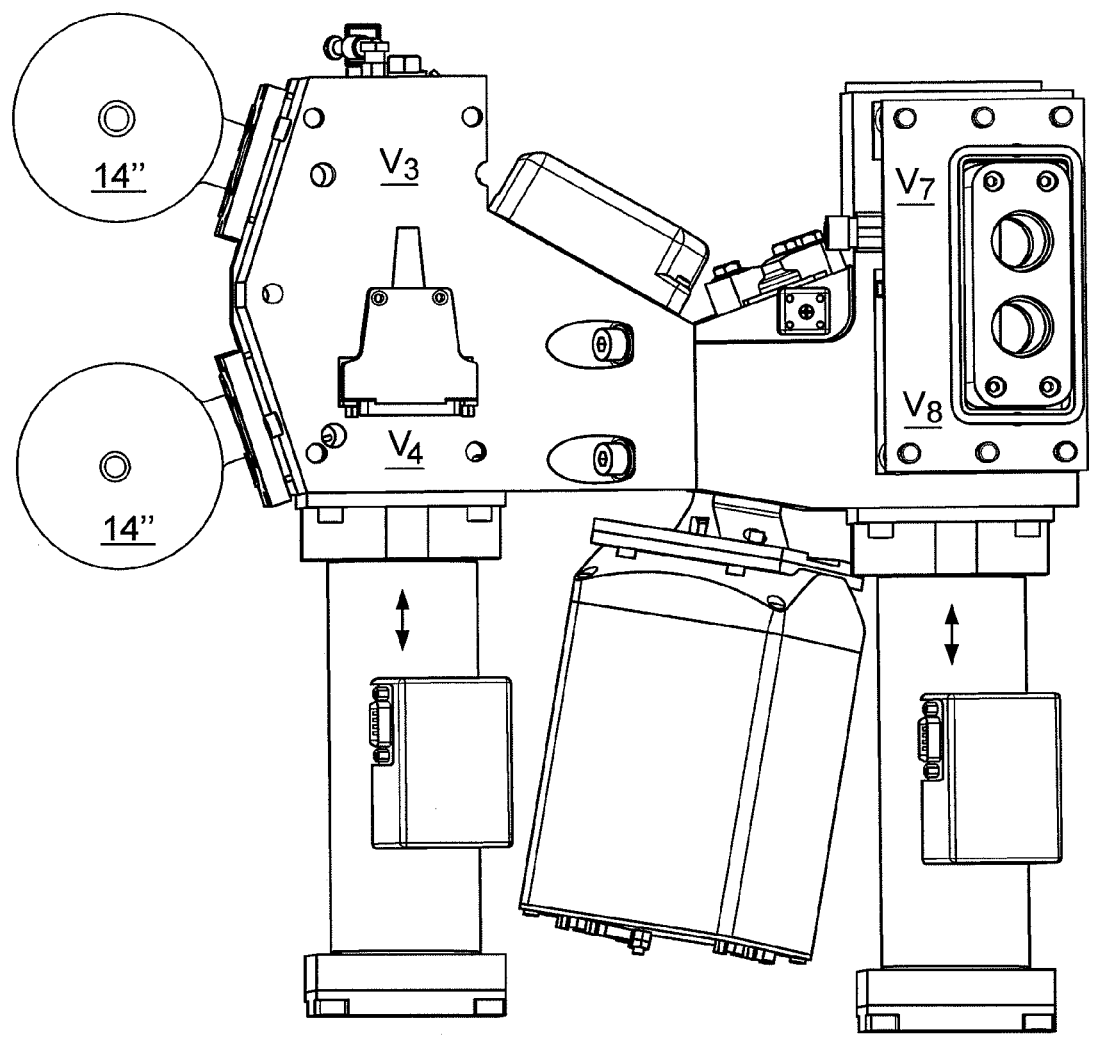
FIG. 7A is a top view and FIG. 7B a horizontal cross-section view of an implementation of the flow delivery system of FIG. 7.
Figure 7B:
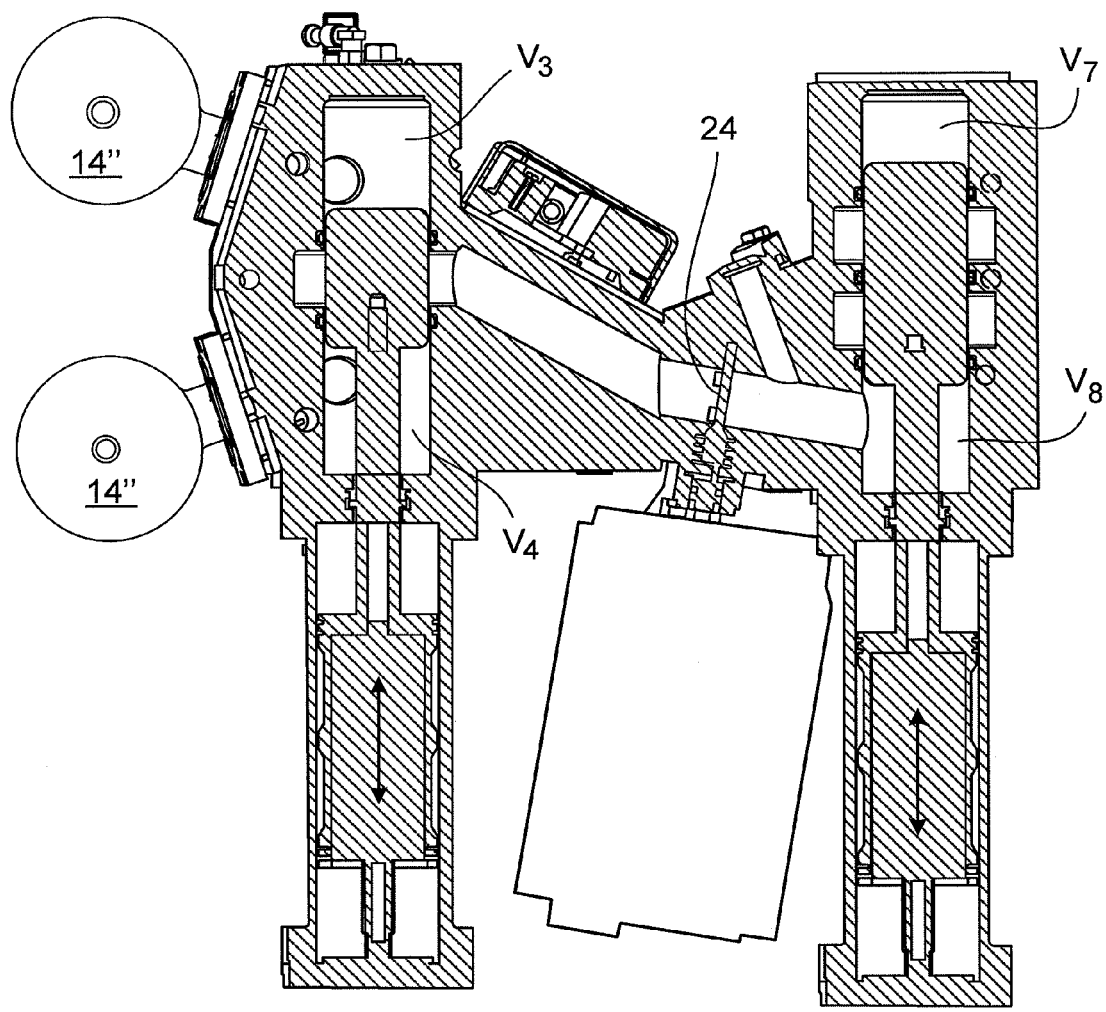
FIG. 7C is a perspective view of an enclosed of system illustrating the opening a cover of the enclosed to access two vaporizers installed in the system.

The system shown schematically in FIG. 7 and implemented in FIGS. 7A and 7B may be the same as that shown in FIG. 6 and has further features.

All connections to the canisters are formed at Interface I. This includes electrical power connections for powering the vaporizer heaters, signal connectors for signaling temperature and other parameters of vaporizer status and compressed air, for controlling the pneumatic valve within each vaporizer canister.

Like FIG. 6A, in FIGS. 7, 7A and 7B, interlocked valves V3 and V4 are provided for the vapor passages from the two vaporizers (vaporizers 14' in FIG. 7, vaporizers 14" in FIGS. 7A and 7B). The interlock is shown implemented by valve elements V3 and V4 being portions of a spool valve similar to the spool valve 50 of FIG. 6. The purge gas feature of FIG. 6A is included.

For enabling flow from the vaporizers, the strict controls needed to prevent mixing of dangerous combinations of vapors can be subject to pre-established protocols, implemented by control logic in an electro-mechanical control system. Similarly, mechanical interlocking mechanisms may have provisions for altering modes of operation. In some cases, controls are established that absolutely prevent communication between vaporizers, or between selected vaporizers. They may on the other hand implement permission for simultaneous flow of some vaporizers. A case where this is appropriate and useful is where the vaporizers contain the same feed material. For example, a simultaneous flow may be employed when a charge in one vaporizer is nearing depletion and while it is desired for economic reasons to utilize the entire charge, it is also desired to commence use of a replacement vaporizer. Such strategy has advantage in ensuring a plentiful supply of vapor, while not pushing the heating limits of a nearly-spent vaporizer. Referring to FIG. 7C, a flow interface device defines mounting stations for four vaporizers (or more), each connected to a respective stop valve, and all communicating by common passage to a flow control system. Examples for interlocking control logic: Example 1: Vaporizers 1 and 2 are permitted to be on service at the same time, or Vaporizers 3 and 4 are permitted to be on service at the same time. Example 2: Vaporizer 1 or 2 or 3 or 4 can be on service at the same time.

In the implementation shown in FIG. 7C, two variable impedance flow control devices, 24A and 24B such as throttle valves, e.g. butterfly valves, operate to enable a higher upstream vapor pressure, and effectively achieve a broader dynamic range than a single unit, so that both high and low vapor flows may be achieved.

Figure 10:
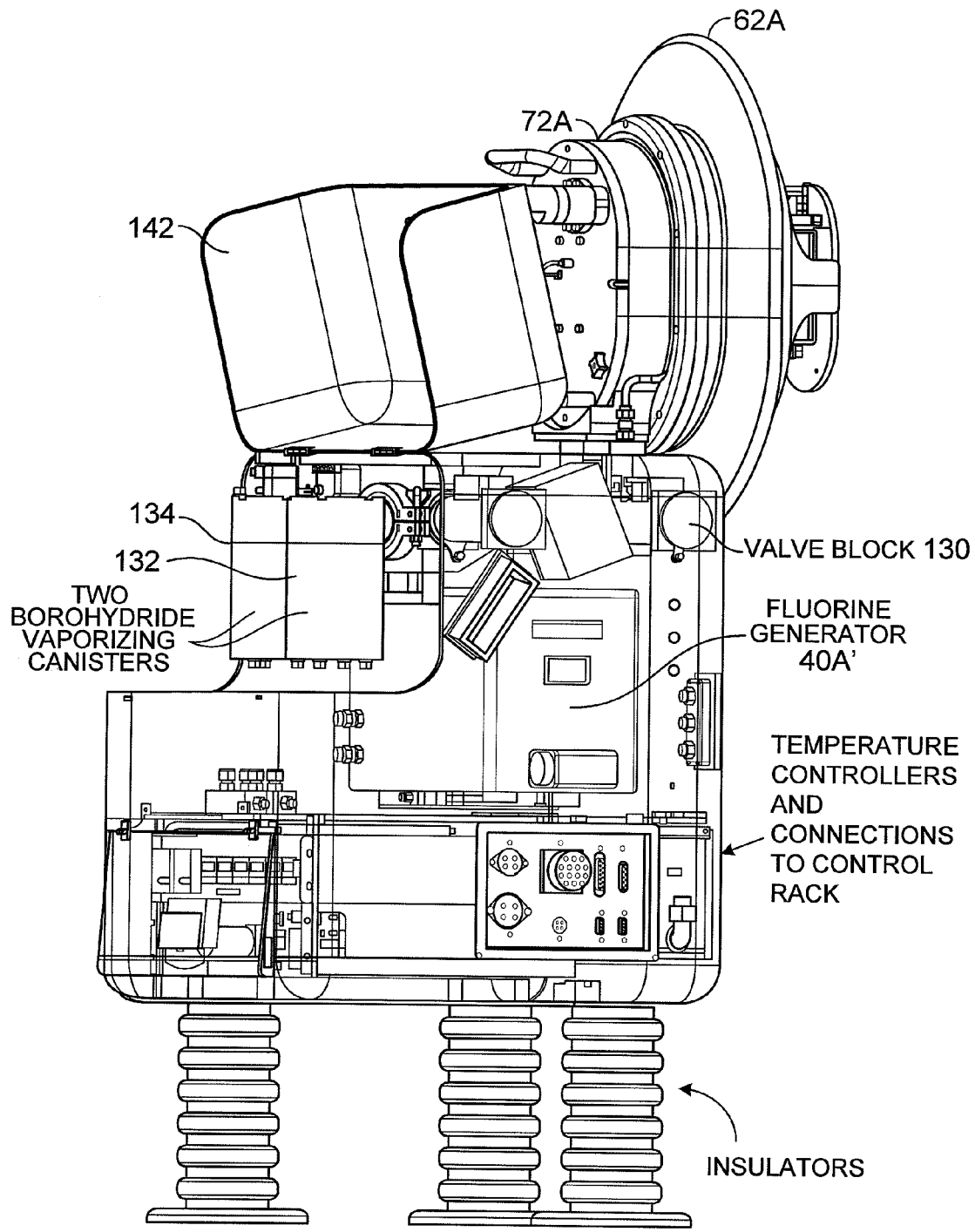
Figure 11:
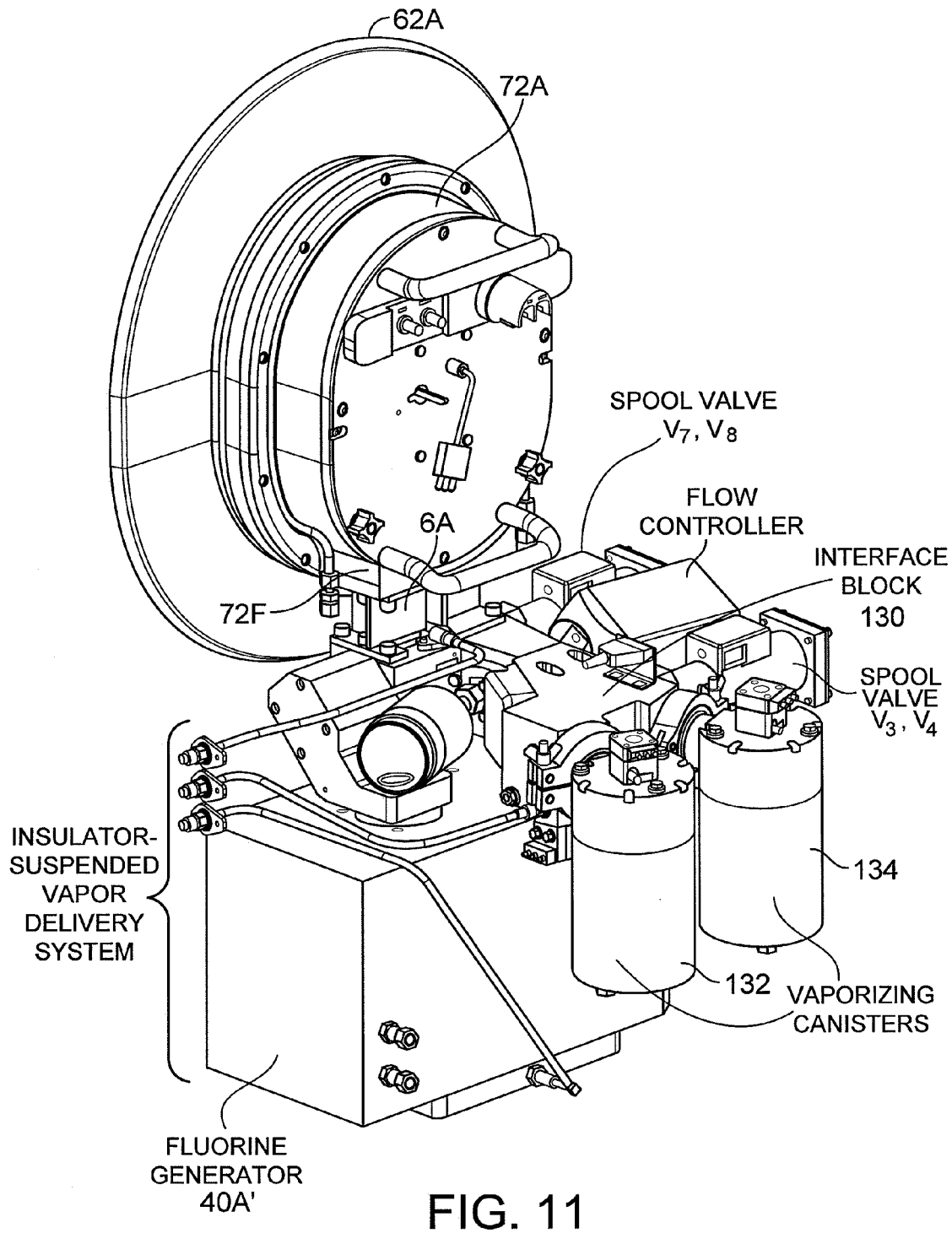
FIG. 11 is a perspective view of the system of FIG. 8 with cover removed.

FIGS. 8-11 show an implementation that combines all features of a flow interface device so-far described. As shown in FIGS. 10 and 11, a flow interface device, in the form of a thermally conductive body comprising a valve block 130, is mounted below the installation-and-removal path A of an ion source 22B, shown in FIGS. 8 and 9. Valve block 130 defines two mounting stations for vaporizers 132 and 134 of heated canister form, which hang from the flow interface device by mounting features incorporated in their top sections. Valve block 130 has individual flow passage segments from these mounting stations, that merge to a common passage segment that leads into the high vacuum chamber 71A, FIGS. 8 and 8B.

Figure 8:
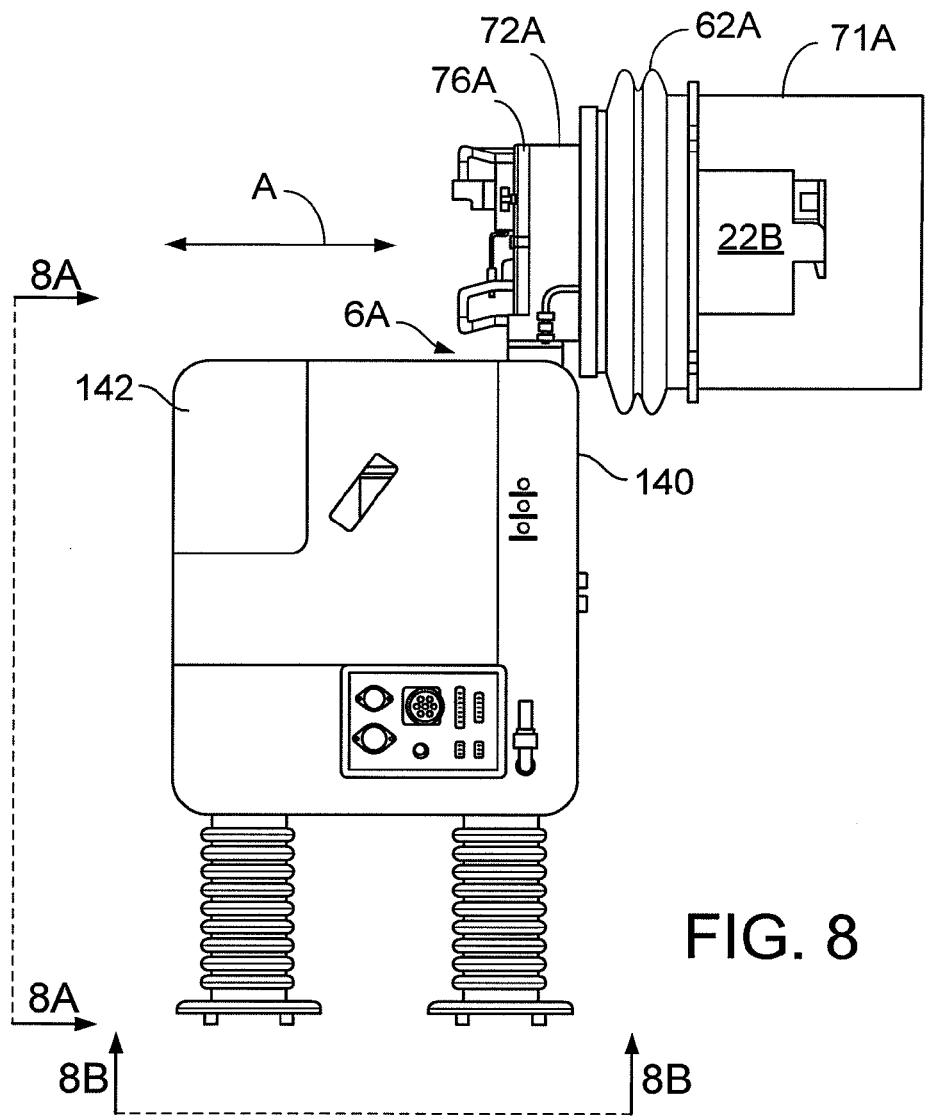
FIGS. 8, 8A and 8B are orthogonal views of an implementation of a vapor delivery system within a housing, showing its relationship to an ion source high vacuum housing and ion source.
Figure 8B:
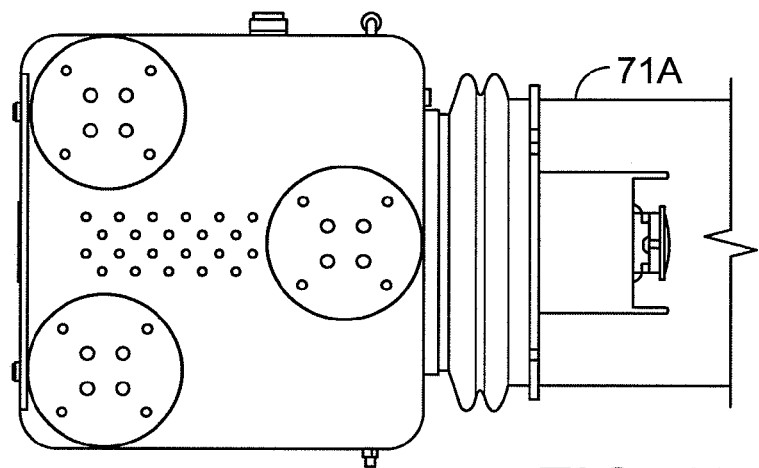
Figure 8A:
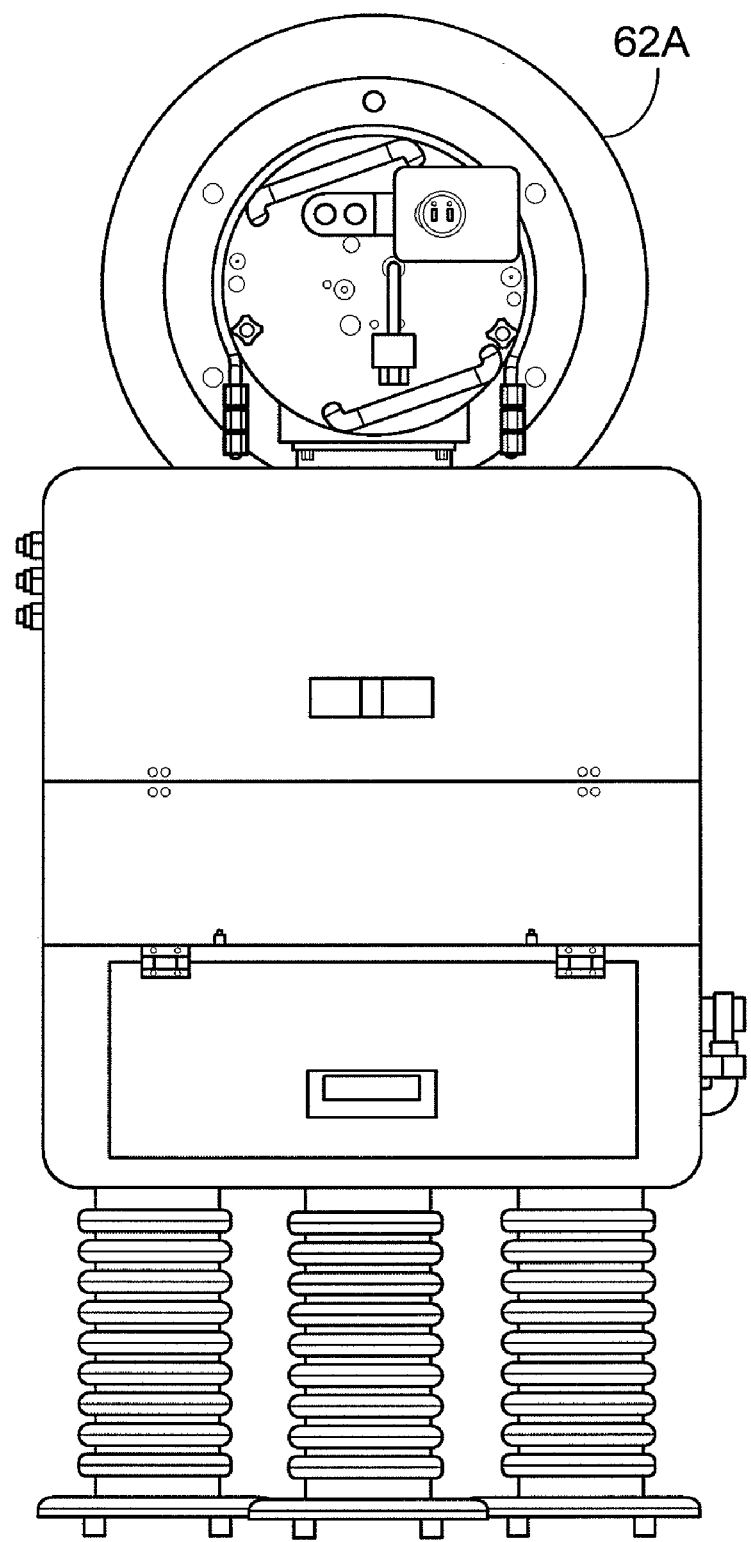

As shown in FIGS. 8 and 11, and similar to features shown in FIGS. 1A-1C, the interface device 130 is suspended, by its collar 6A, from a mounting flange 72F that forms part of vacuum housing mounting ring 72A. Thus the system is suspended on the high voltage side of high voltage insulator 62A. Its flow passages connect to the ion source structure via a cammed connector within the vacuum housing as shown in FIGS. 1A-1C. A reactive cleaning gas source, in the form of a plasma chamber 40 A', is suspended from the valve block 130, below it. It is constructed to disassociate a feed gas to produce reactive fluorine. In one preferred form, the weight of this entire assembly is carried by ion source mounting ring 72A, which in turn is supported by insulator 62A.

Incorporated in the valve block 130 are cartridge heaters and valves that perform the safety and flow heating and control functions of the heater and valves described with respect to the previous figures. A sheet metal enclosure 140 surrounds this delivery assembly, and has covers, including vaporizer cover 142, that can be opened for access. This enclosure is supported from the floor by feet comprising high voltage insulators. Thus the entire vapor delivery system is adapted to be maintained at the high voltage potential of the ion source.

It will be understood that numerous other physical arrangements are possible that still provide the actions described at one or the other sides of a mounting ring connected to the insulator and still out of the path of installation and removal of the ion source.

Figure 12:
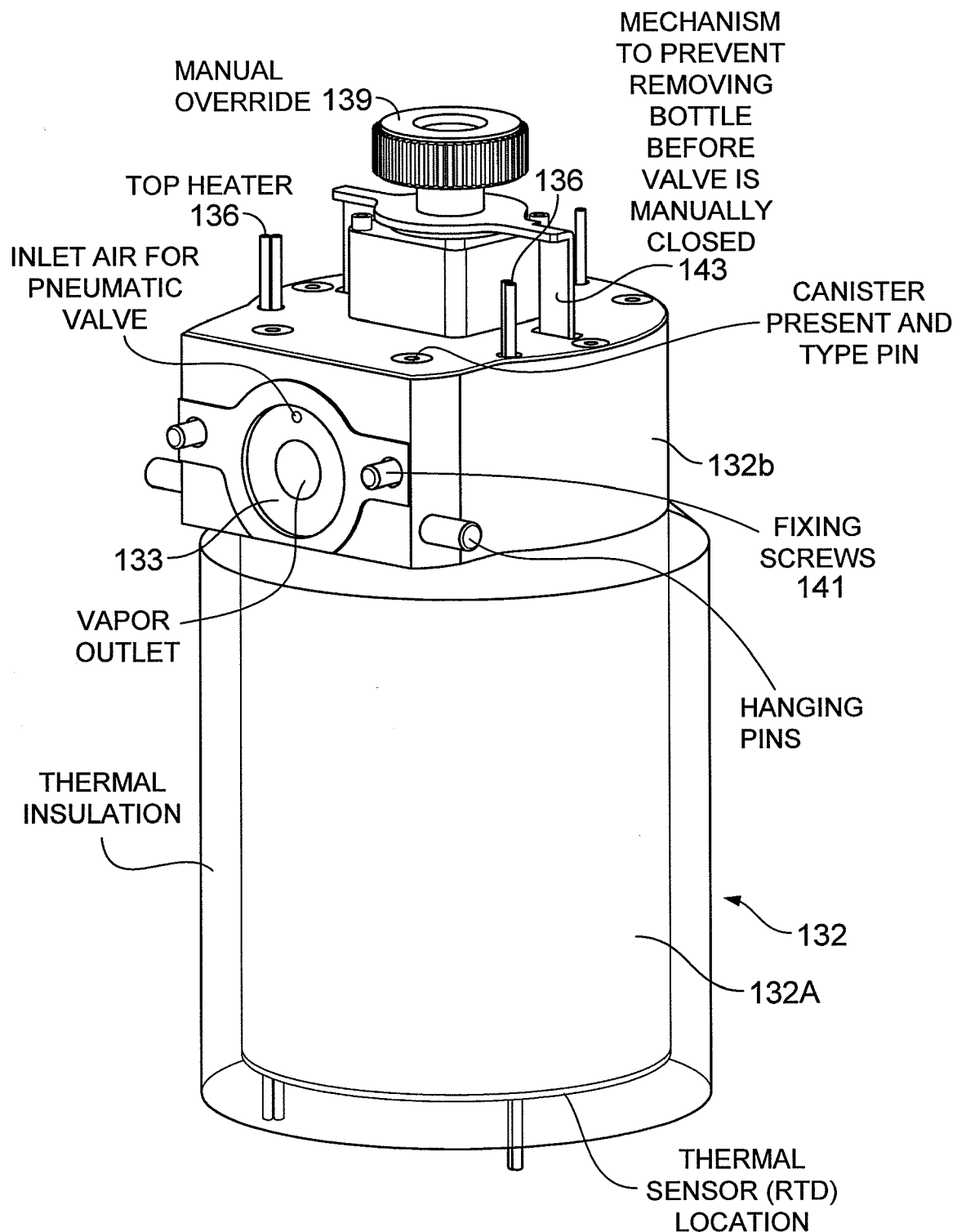
FIGS. 12 and 13 are perspective views from opposite directions of a vaporizer useful in a flow delivery system.
Figure 13:
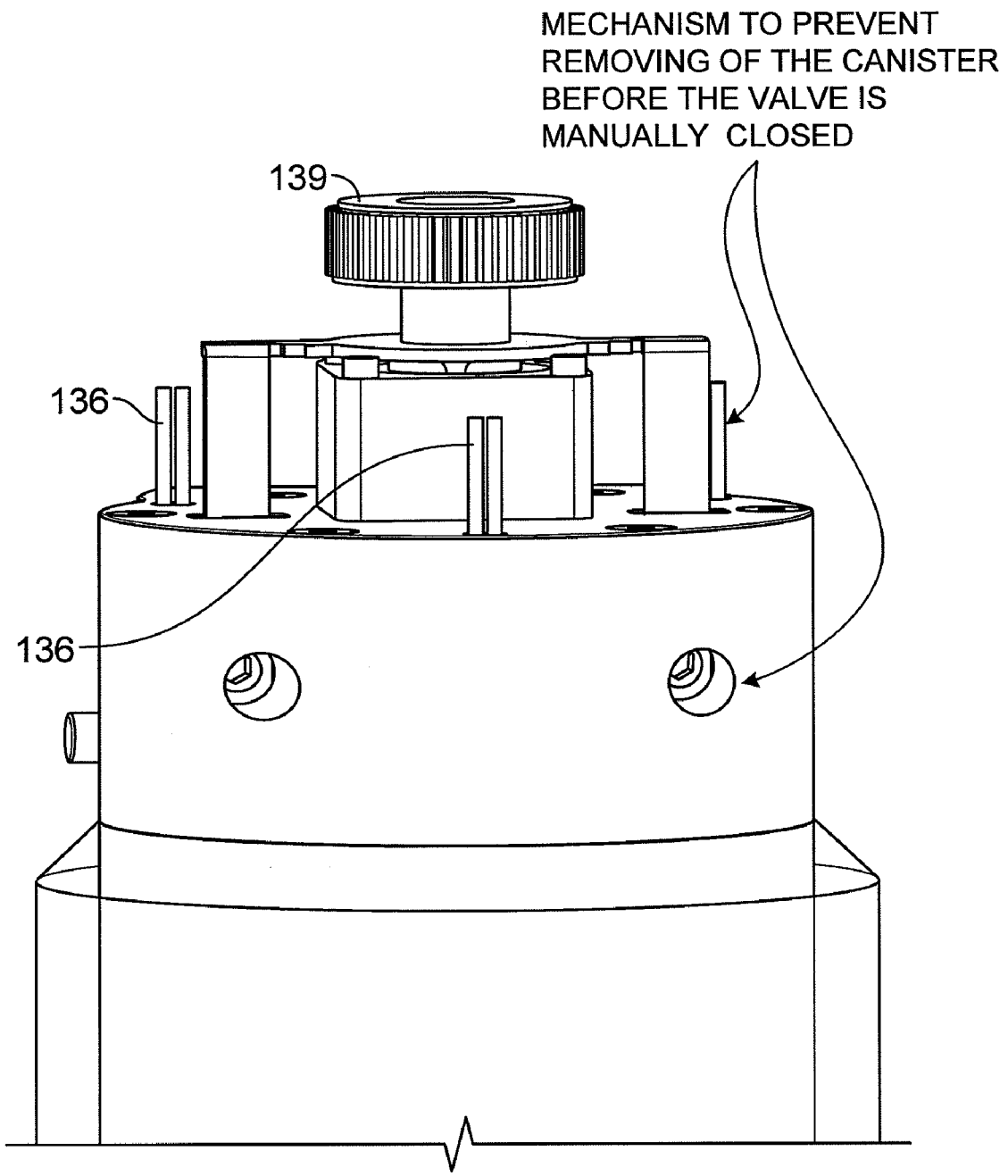

Referring to FIGS. 12-13D a vaporizer unit 132 is shown having a heater and constructed to contain and heat a solid feed material such as decaborane or octadecaborane to a temperature that produces vapor to be ionized. As with the unit of FIG. 1D, the vaporizer unit comprises a lower canister body 14A having a solids-receiving volume, typically about a liter, and a detachable top closure member 14B. It is constructed to hang vertically from the top closure member 132B at a suitable mounting station. For this purpose, the top closure member defines a vertical mounting surface 133 to match and seal with a corresponding surface of the mounting station defined by the flow interface device 10, FIG. 1, or its valve block implementation. Top member 132B of the canister of FIGS. 1D and 1I also incorporates a valve 137 that permits vapor flow from the canister to the mounting station. Top member 132B is formed of thermally conductive material, e.g. aluminum.

The heater 19 of this vaporizer preferably comprises a set of cartridge heater elements 136 fit into receptacles formed in the top member 132B. Importantly, this heater, located in the detachable top member is found to provide sufficient heat to vaporize the solids properly. By its location, it serves to maintain the valve of the top closure member at temperature higher than the temperature to which the solid material is heated. Advantageously, for this purpose, the body of valve 137 is comprised of thermally conductive aluminum and disposed in conductive heat transfer relationship with the heater, via the aluminum top member to maintain the vapor passage through the valve substantially at heater temperature.

In preferred implementations, there is only one controlled heating zone for the vaporizer. With these features in combination, it is found that the heater located in the top section of the vaporizer-canister can produce efficient vaporization of the remote charge in the lower section as the charge is consumed. The construction is found to have a sufficiently low thermal mass so that acceptably fast equilibration to a set temperature can occur. This permits proper operation and sufficiently rapid change in temperature setting as an operator adjusts parameters to initiate or tune the operation of the overall system.

In particular, the unit is found useful with pressure-based throttle valve vapor flow control 24, implemented e.g. with a butterfly valve, in which the vaporization temperature must be gradually increased as the charge of feed material is consumed to maintain the pressure upstream of the throttle valve, see FIGS. 3, 6, and 7 and related description.

Furthermore, and very importantly, the positive temperature gradient from bottom to top of the vaporizer unit that is attainable with this heat transfer arrangement prevents condensation of the vapor and build-up of disadvantageous deposits in the vapor valve V1 (located at the transition from vertical to horizontal flow) and the vapor delivery passage (upward inlet passage and horizontal delivery passage). These features are strategically located close to the heater, with temperature dependably being higher than the temperature of the charge of material in the bottom of the remote vaporization cavity.

The presently more preferred implementation, the vaporizer canister shown in FIGS. 1G-1H, will now be described in detail with reference also to FIGS. 14-14E, 15 and 16.

Referring to the figures, the main body of the vaporizer-canister is comprised of two aluminum pieces, bottom section 14A″ and top section 14B″. A cover 14C″, of suitable plastic covers the top of the assembly.

Bottom part 14A″ defines a vaporizing volume V for solid material to be vaporized. Top part 14B″ has recesses 136 for receiving three vertically-extending heater cartridges 13′. The cartridges have tight fit with the top aluminum part 14B″ and enable the top part to perform the heat distribution function to heat the remote solid feed material. This occurs principally by heat transfer via the removal interface to the walls of the bottom aluminum part which in turn heat the solid feed material. This heating is supplemented in a minor way by direct radiation to the solid material from the top.

FIG. 1H a vertical cross-section, FIG. 1I, a side view and FIG. 1J a top view show the aluminum bottom section 14A″ that defines the vaporization cavity V where the charge of material resides. FIG. 1J shows an upwardly directed, horizontal planar mounting surface S. It is dimensioned for engagement with a corresponding mounting surface of the aluminum top section that contains the heater and defines the removable closure and vapor delivery passage of the unit. The figures show an o-ring groove G in the mounting surface S of the bottom section and a major radial dimension $r_1$ of heat conductive metal surface outside of the o-ring and a minor dimension of surface inside of the o-ring. These surfaces are exposed upwardly to receive the like-dimensioned metal surface of the top section. As shown for instance by comparison of the radial dimension $r_1$ outside of the o-ring with the radial thickness $r_1$ of the cross-section of the metal cylindrical wall along the height of the vaporization cavity V, FIG. 1I, the area for heat transfer at the mounting interface is substantially greater than the horizontal cross-sectional heat transfer area of the wall bounding the vaporization cavity V. An upwardly, powder grains of solid feed material as well as in some instances poor thermal conductivity of the solid substances themselves prevent good heat transfer through the bulk material. Supplemental heat transfer occurs through radiative heat transfer from the heated upper surfaces of the unit as well as by convection effect of heated vapor.

Top part 14B″ also includes the integral cantilever support projection 34′ and defines the vapor outlet passage. In more detail, the rising passage 37A is defined by a vertical tubular shield which terminates at a horizontal valve seat.

The horizontal vapor passage 37B then extends from the valve through the cantilever projection 34′. Top part 14B houses pneumatic bellows valve (V1 in FIG. 1D, V1 or V2 in FIG. 6A) and a portion of the "open permissive" mechanism to be described further herein in connection with FIGS. 16 and 16A. Cover 14C″ carries a central screw, which when turned, moves the "open permissive" mechanism between "locked down" and "open permissive" positions. Cover 14C″ is secured by further special security screws, see FIGS. 17 and 17A.

Figures 17, 17A:
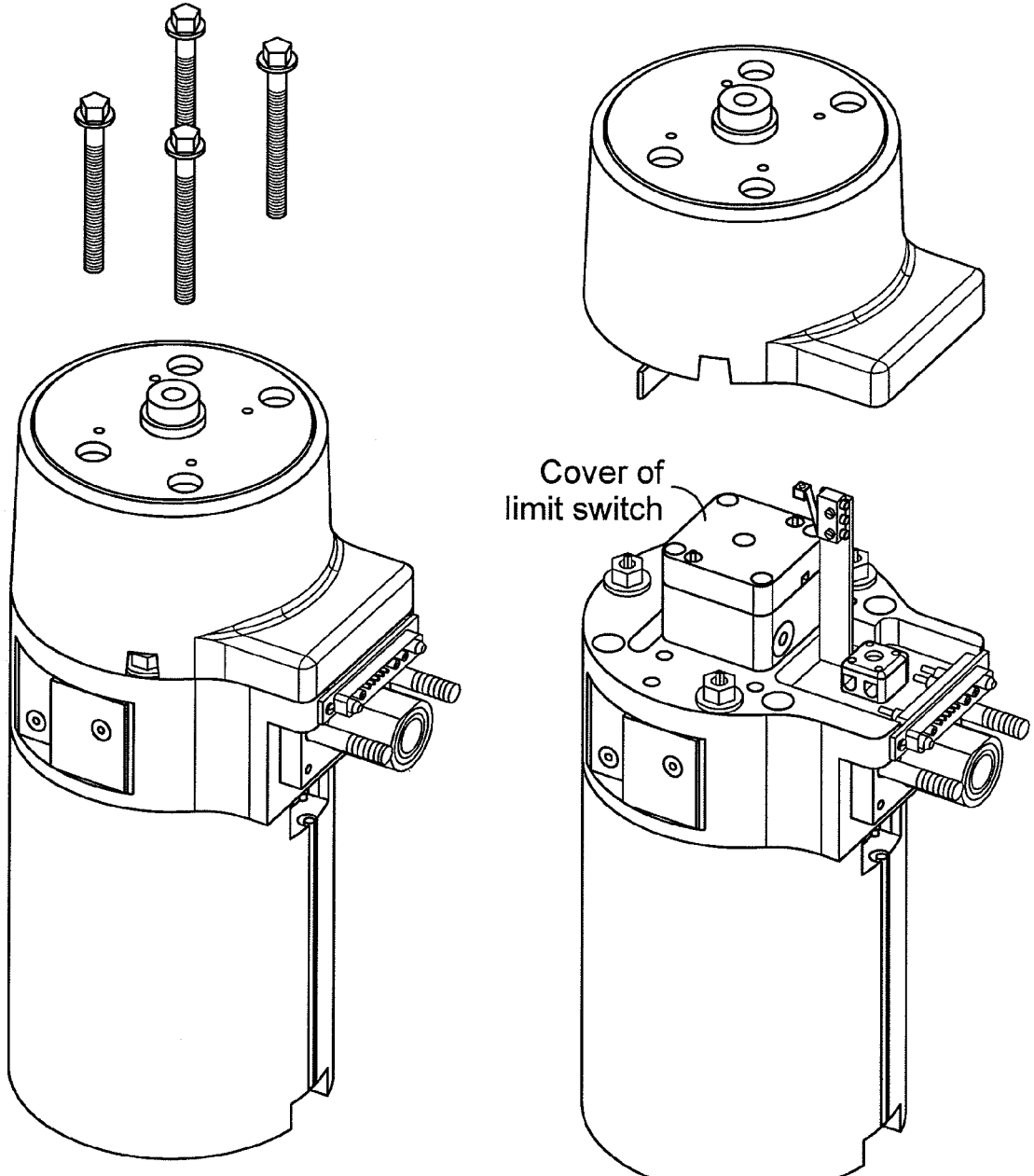
FIGS. 17-17D are a series of perspective views illustrating steps of disassembling the vaporizer of FIGS. 1G and H to enable refilling prior to delivery to a customer.
Figure 17B:
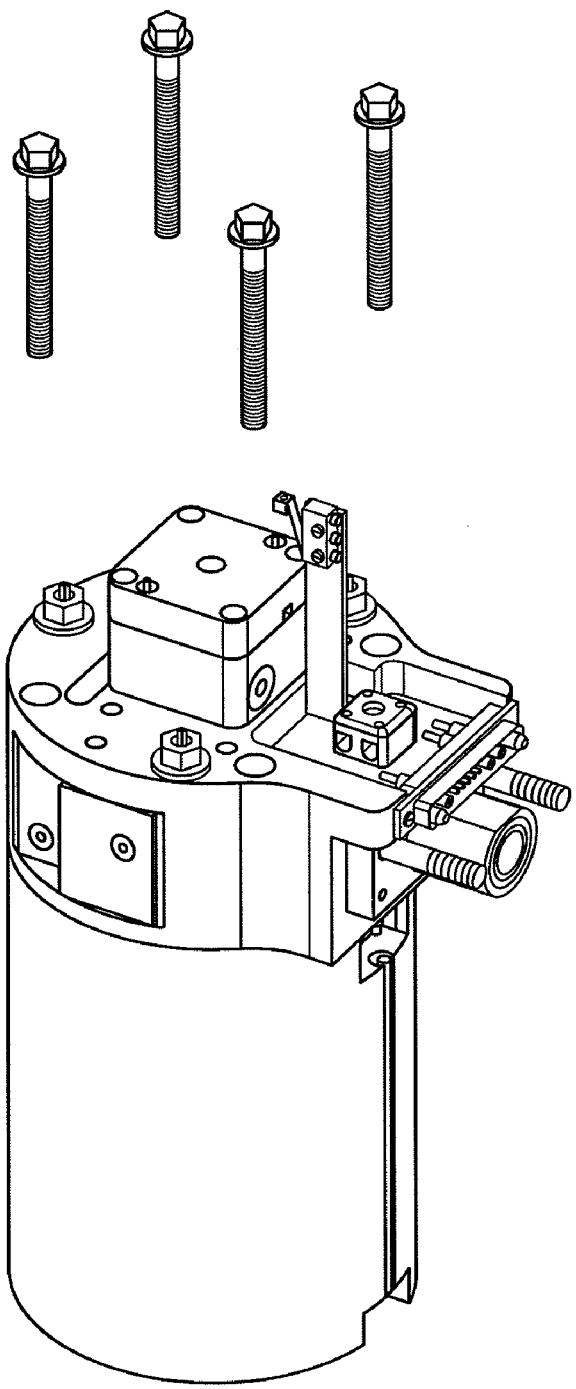
Figure 17C:
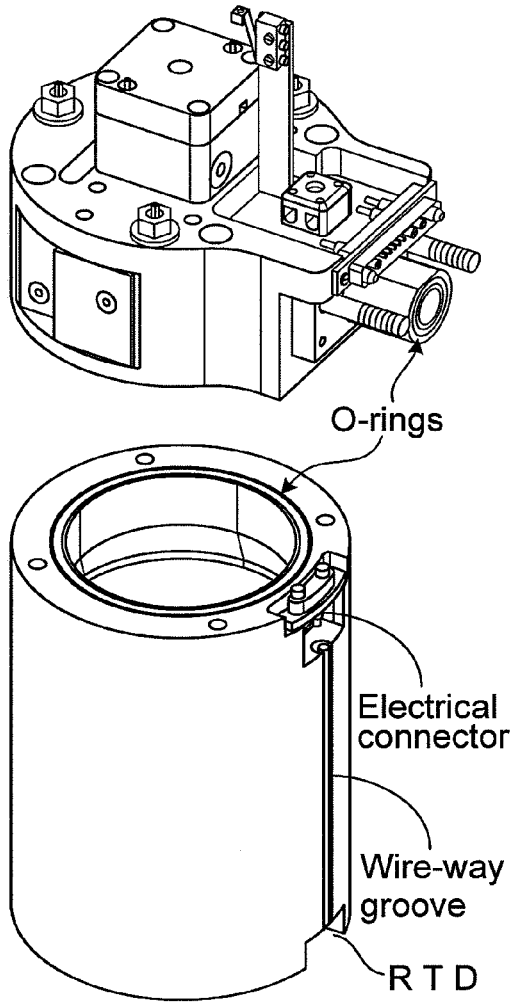
Figure 17D:
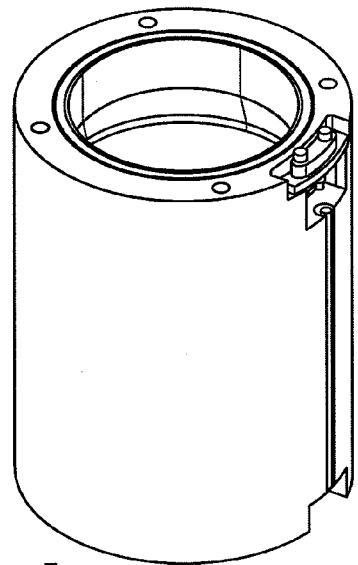

Certain feed materials are hazardous if handled improperly. Out of concern that untrained personnel might attempt disassembly of the vaporizer-canister unit, special security screws with 5-sided heads, FIG. 14E and the sequence FIGS. 17-17D are used to secure top part 14B″ to the bottom part 14A″, and the top cover 14E″ to the top part 14B″. This is done at the supplier for the feed materials, who also takes extra precaution to assure that the right top section is employed having the correct temperature limit switch and code indication for the particular feed material being supplied in the bottom section.

The following further features of the preferred implementation of FIGS. 1G-1K are explained in more detail as follows:

1. Heater Cartridges

The electrical resistance heater cartridges 136A that form the heater in the top section 14B of the vaporizer-canister unit are of cyclical form of approximately 10 cm height and 0.8 cm diameter. Each heater cartridge extends for substantially the entire depth of the aluminum top closure body 14B". Machined wells 136 in the aluminum body are open at the top for insertion of the heater cartridges with tight fit and open slightly at the bottom to enable air venting during insertion. As shown in FIGS. 1H and 1K the heater cartridges are located radially outward from the location of the o-ring G that seals the top and bottom sections 14A" and 14B". Accordingly, their bottom portions are located immediately above the portion of the major thermal interface portion of radius $r_1$ that is exposed to the atmosphere for filling microscopic imperfections in the mating surface with air. FIGS. 1H and 1K shows this aluminum body and the relationship of the cartridge heaters to the body and to the vapor passage that extends through the body. The axes of the heaters are parallel to the axis of the vertical intake section 37A of the vapor passage. The horizontal vapor delivery section 37B extends between two of the heater cartridges while a third heater cartridge is located on the side opposite from the location of the vapor delivery section of the passage, see FIG. 1K. Thereby the vapor passages are heated by direct conduction from the heaters, over short heat transfer paths through the aluminum body of the top section.

Cartridge heaters of suitable type are available for instance from Türk & Hillinger of Germany. Similar cartridge heaters may be employed in the valve block flow interface device 10.

2. Thermal Detector

A suitable RTD (resistive thermal detectors) are located at the bottom of the vaporizer-canister unit and elsewhere in the system. A conductive lead for signal from the bottom sensor extends to a connector at the interface with the top section 14B. This connector is laterally aligned with a mating connector of the top section by bringing the overall mounting devices of the unit into alignment with those of the bottom section, and movement of the aligned top section down to engage the bottom section engages the connector. Resilient compliance provided in the connectors enables electrical connection to be completed before the top and bottom sections are finally seated. The compliance then enables the top section to move downwardly a further increment while being screwed tightly to the bottom section.

3. Groove for the Conductive Lead for the Detector

The vertical wire way groove for conductor L indents substantially into the thickness of the sidewall as shown in Fig. H and FIG. 14. This enables protection of the electrical conductor, e.g. during handling of the unit as a delivery canister. Despite the deep indentation, the groove does not introduce a significant cold spot to the cavity wall because of narrowness of the groove. To explain, heat transfer in the bottom section is principally downward from the top section, the heat flow being substantially uniformly distributed about the constant thickness cylindrical wall. For heating the narrow portion of cavity surface lying opposite the groove, lateral heat transfer paths extend from both sides of the groove from adjacent portions of the full thickness wall. Being short, these progressively narrowing, heat transfer paths, provide little heat demand and offer relatively little resistance to the necessary heat transfer. As the result, it is found that substantial lateral equilibration of temperature occurs and the temperature of the cavity surface in the region of the groove is substantially uniform with the remainder of the wall. The groove also has substantially no effect upon the positive temperature gradient in the vertical direction.

4. Over-Temperature Switch

The over-temperature switch 165" in the power circuit to the heater shown in FIG. 14B is of the well-known thermocouple type, and is located at the top section of the unit. Its function is to sense the local temperature and protect the vaporizer-canister from over heating in case the regulated heating system fails leaving the heater energized. It directly senses the temperature of the top section 14B" and interrupts power to the heater at a pre-set temperature that is selected in accordance with the particular feed material filling the unit. When the discrepancy that caused overheating is corrected, the switch can be reset by pushing a button in the usual manner 5. Temperatures of Operation The top of the regulated temperature range for the RTD temperature sensor, controlled by the remote thermal control unit, in one example, may be set at 40 C for $B_{10}H_{14}$ and 120 C for $B_{18}H_{22}$, and, for one example, an over-temperature limit switch in the top of the vaporizer-canister unit may be set at 50 C for a $B_{10}H_{14}$ vaporizer-canister and 140 C for a $B_{18}H_{22}$ vaporizer-canister. Similar temperature settings are employed with other feed materials, the particular values being dependent upon the vaporizing properties of the chosen material. By thermal design of the unit, during operation of the vaporizer-canister the bottom-to-top positive thermal gradient of the vaporizer-canister can be of the order of 5 C (it may for instance be as low as 3 C) for $B_{10}H_{14}$ and of the order of 10 C for $B_{18}H_{22}$.

6. Temperature Isolation from the Vapor-Receiving Device

The vapor-receiving device fed by the vaporizer-canister is maintained at a higher temperature than the vaporizer in some instances during operation. Prevention of heat migration to the vaporizer canister from the vapor-receiving device is accomplished by introduction of a substantial thermal break.

The thermal break prevents heat entering from the vapor-receiving device and interfering with the thermal control system of the vaporizer-canister unit (or vice versa if the vapor-receiving device is operated cooler than the vaporizer). Also, because of the presence of this thermal break, a mounted vaporizer-canister unit can cool relatively quickly after being de-energized and its outer thermal insulation removed despite the vapor-receiving device continuing operation at temperature after switching to another vaporizer unit. Thus, despite the continued heated state of the vapor-receiving device, workmen can soon handle a de-energized vaporizer-canister unit for removal and replacement. Alternatively, the cooled unit may be left in place without occurrence of substantial thermal degradation of any remainder of the charge of feed material.

In preferred implementations, the thermal break is provided directly at the interface of the vapor delivery projection of the vaporizer-canister with the receptacle of the vapor-receiving device. In the preferred implementation of the figures this thermal break is formed by an endwise thermal break section and a circumferential thermal break section. One implementation of this feature is shown in FIG. 1G.

7. The Endwise-Thermal Break

The end-wise thermal break of the preferred implementation, shown in FIG. 1G, is located at the end of the lateral vapor delivery projection. In this implementation it is of the form of a thermal insulator washer $TB_e$. The insulative washer is disposed between the end surface of the projection and the opposed internal abutment surface at the internal end of the support receptacle that receives the projection. The washer is sealed on its respective sides to these surfaces by respective o-rings. In the presently preferred design of FIGS. 15A and B, the washer $TB_e$ remains part of the receptacle assembly of the vapor-receiving device. The end surfaces and insulative washer are forced together by the mounting screws of the vaporizer-canister that thread into the vapor-receiving device. The washer is of rigid material and enables stable connection of the vaporizer canister to the vapor-receiving device. In one preferred implementation, the washer has an axial thickness of about 4 mm and is comprised of PEEK resin.

8. The Circumferential Thermal Break and Support for Vapor Delivery Projection

This thermal break $TB_c$ is formed about the cylindrical periphery of the vapor delivery projection of the vaporizer-canister unit. It is provided by a matching cylindrical member of rigid, thermally insulative, wear-resistant rigid resin, in one implementation it comprises a molding of Araldite NU resin. In the implementation shown in FIG. 15B, the circumferential thermal insulator $TB_c$ is anchored to the vapor-receiving device and is constructed to slideably receive and support the projection, and thereby, the entire vaporizer-canister unit. Guide surfaces are provided to ensure upright orientation of the vaporizer canister while the anchoring of the receptacle prevents angular displacement of it. Preferably, guiding is accomplished by matching slideable guide surfaces on the mating components. In the particular implementation shown in FIGS. 15 A-D, the guide surfaces $G_s$ are planar formations on the exterior of the projection and the interior of the cylindrical thermal insulator into which it slides. Matching composite connectors mounted on the vaporizer-canister and the vapor receiving device for electrical and compressed air connection are guided into initial contact by the guide surfaces of the vapor delivery projection and the mating receptacle when the latter come together.

Besides defining the thermal break, the cylindrical insulative member provides rigid support to the vapor delivery projection and thereby to the vaporizer-canister unit. As previously described in relation to FIGS. 1E and 1F, this mounting provides a reactive torque and supporting force for stabilizing the off-center weight of the vaporizer-canister unit.

In another implementation the end-wise insulation portion is molded integrally with the circumferential portion.

9. Main Electrical Connector

Referring to FIGS. 14A and B, a composite connector is employed to connect all necessary functions, e.g. electrical power, electrical signal and compressed air. Such a connector is available from FCT Electrical GmbH of Munich, Germany, as previously mentioned.

10. Connector Pin Assignments

Referring to FIG. 14B, the assignment of connector pins is as follows:

Pins A2 and A3 are connected to high voltage connections for alternating current to the three heater cartridges which are connected in parallel to define the heater.

Pins 3, 4, 5 are connected to the RTD temperature sensor at the bottom of the unit to provide direct current signal from the sensor (the higher voltage leads to the RTD sensor are shown as duplicated).

Pins 7, 8 are signal connections to a micro switch located in the top section of the vaporizer-canister unit, for detecting the position of the access-preventing bar of the manual closing device. The micro switch reads the top (withdrawn) position of the open-permissive mechanism, signifying that the mechanism is out of the way of the operating range of the pneumatic valve for controlling vapor flow. Thus, closing of the switch indicates that the pneumatic valve is free to operate properly.

Pins 10, 11 and 12, indicate the open and closed position of the pneumatic valve V1, pin 10 being the common terminal and pins 11 and 12 assigned to the open and closed positions, respectively. Pins 1 and 2 are spares available for other sensing function, such as electrically denoting the type of feed material in the unit.

11. Compressed Air Connection

The sub-connector part for electrical connections is incorporated in the composite connector 44' shown in FIG. 14 along with a compressed air connector tube 51 which carries an o-ring for sealing. Guide pins 52 are also provided for guiding the final engagement of the composite connector with the mating connector on the vapor-receiving device.

12. Automatic Connector Engagement

Because of being mounted in a coordinated manner, coarse alignment of the guide pins 52 of the composite connector with their receptacle is provided by the guide surface $G_s$ of the vapor delivery projection when it enters its matching receptacle on the vapor receiving device, as previously described. More precise alignment of all the functional pins (electrical power, electrical signal, compressed air) and the holes that receive them is provided by the action of the tapered guide pins 52 of the connector itself. Axial resilient compliance is provided between the two connectors to enable their making connection first and allowing further incremental movement of the vapor delivery projection as mounting screws are tightened to urge the vapor delivery projection against the thermal break washer and abutment surface within the receptacle of the vapor-receiving device.

13. Use as a Delivery Canister

The vaporizer-canister is of rugged construction with all functional parts protected during use as a delivery canister. A protective plastic cap, not shown, is snap-fit to the lateral projection to protect its surfaces. In the presently preferred implementation, thermal insulation for vaporizer operation is provided as a removable jacket, and does not accompany the unit when the unit is shipped to deliver feed material.

Safety System

The vaporizer unit includes a safety system constructed to prevent accidental release of toxic vapor to the atmosphere when being mounted or dismounted. Top member 132B includes a manual device and a detachable fastening for mounting the vaporizer unit at the mounting station. The manual device has a closed position for closing the vaporizer unit, as by over-riding a valve or serving itself as a valve to prevent outward flow. The manual device is associated with a preventing device that prevents access of workers to the detachable fastening of the mounted vaporizer except when the manual valve is in its closed position. Thus it is assured the vaporizer canister is closed before the device can be demounted, preventing escape of toxic vapor from the vaporizer.

Referring to FIGS. 13, and 13-13F, in a preferred version the vaporizer includes a pneumatically-operated valve 137 constructed to be remotely controlled by an operating system, and a threaded manual override device (closing device) 139 and detachable fastening comprising a pair of fixed screws 141 for mounting the vaporizer at a mounting station of the interface block. Overriding device 139 has a downward, closed position preventing vapor flow from the vaporizer. The closing device is associated with an access-preventing mechanism 143 that prevents access of workers to the detachable fastening screws 141 of a mounted vaporizer except when the closing device is in this closed position, thereby to prevent flow of toxic vapor from the vaporizer while the vaporizer is being detached. In a preferred form, the access-preventing device comprises an access-preventing shield that moves dependently with member of the closing device, the shield constructed and arranged to enable access to the holding screws (or nuts) for demounting the vaporizer only when the closing device is in closed position, see FIGS. 13B, D and F.

In the form shown, the vaporizer has a spring loaded, pneumatically operable valve 137 mounted to permit flow of vapor from the vaporizer, and the closing device is a mechanical over-riding device constructed to force the pneumatically operable valve to closed position regardless of presence of pneumatic pressure. In the preferred implementation, the valve is a spring-loaded, normally closed pneumatic valve and, for pneumatic connection, is connectable to a passage for compressed air associated with the mounting station. Referring to FIGS. 1D and 12, the sealing surface of the interface device and the corresponding sealing surface of the vaporizer, have a seal surrounding ports for both the vapor flow and for the compressed air in the manner that sufficient connection for the compressed air for opening the pneumatic valve is dependent upon sealing together of the corresponding sealing surfaces. This prevents opening of the pneumatic valve under a condition in which vapor can flow to the atmosphere.

The vaporizer is adapted for use with an interface system constructed to be used with a set of different vaporizers that are dedicated to carrying different solid feed materials. The vaporizer is provided with a characteristic physical feature that denotes its dedicated contents, the physical feature suitable for recognition by a recognition system of the interface device so that a vaporizer control system can operate under conditions appropriate for the contents of the recognized vaporizer. In a preferred form the vaporizer carries one or more microswitch actuator formations in a unique pattern dependent upon the content to which the vaporizer is dedicated, suitable for interaction with a recognition system that comprises a set of actuatable microswitches. Thus the vaporizer and other vaporizers comprise a set dedicated respectively to different solid feed materials having different vaporization temperatures and different characteristic physical features for recognition. For example one vaporizer in the set is dedicated to decaborane and another to octadecaborane.

In preferred form the vaporizer has a temperature limit switch set to a safe temperature lying above normal vaporizing temperature and below a hazard temperature for the respective solid material to which the vaporizer is dedicated.

The system described is suitable for safe production of ion beams from large molecule borohydrides ($B_{xx}$) such as decaborane ($B_{10}H_{14}$) and octadecaborane ($B_{18}H_{22}$). These materials are known to involve chemical hazards. For instance:

The borohydrides ($B_{10}H_{14}$, $B_{18}H_{22}$) will produce shock sensitive compounds If exposed to $NF_3$. The sensitive compounds could detonate resulting in severe damage to equipment and potentially loss of life.

$B_{10}H_{14}$ will ignite in the presence of oxygen when raised to a temperature greater than 60° C.

$B_{18}H_{22}$ will ignite in the presence of oxygen when raised to a temperature greater than 180° C.

$B_{10}H_{14}$ and $B_{18}H_{22}$ are solids at room temperature and very toxic to humans. The material is readily absorbed through the skin. Exposure to skin should be prevented.

There are several plausible conditions by which improper operation or removal and replacement of a vaporizer could result in $NF_3$ being pressurized into a borohydride vaporizer. This condition could result in detonation of the borohydride material.

The equipment described above, when employed with $B_{xx}$, materials, has features that prevent or minimize hazards to personnel and equipment.

As described, the system of FIG. 7 has two sources of gas delivery, gas from the reactive cleaning gas source and borohydride from the vapor delivery system. The isolation valves V7 and V8 that deliver $NF_3$/F and $B_{xx}$ to the ion source are mechanically linked (realized, for instance by a spool valve unit) such that these two gas streams are never allowed to be cross-connected.

As shown, the borohydride delivery system has two vaporizer bottles (canisters). These bottles allow for delivery of $B_{10}H_{14}$ or $B_{18}H_{22}$ without the need to access the high voltage region. The type of bottle is selected by the operator by way of the semiconductor process recipe. The following features eliminate hazards associated with vapor delivery and maintenance (bottle replacement).

The vaporizer bottle has one or two in-series, redundant, one or integral over-temperature cut-out switches SW1 and SW2. These switches can be either the non-reset type or the type enabling manual reset. For bottles dedicated to $B_{10}H_{14}$ the switch set point for one or more switches is 50° C., and for $B_{18}H_{22}$ the set point is 140° C. This safety cutout will prevent the $B_{xx}$ from reaching a temperature whereby an explosion could occur if oxygen were introduced through improper operation. The temperature controller for the vaporizer is arranged to heat the vaporizer with a safety margin of about 20% from the setting of the vaporizer limit switch. In one example, the top permitted temperature is in the operating range for decaborane is 40 C and for octadecaborane is 120 C.

The vapor delivery system of FIG. 6A has a purge capability similar to techniques used for toxic gas boxes. The valve on the bottle, V1 or V2, is constructed to be remotely operated. It can be remotely closed to isolate the vaporizer bottle. The interlocked vaporizer selector valves V3 and V4 (realized, for instance, in the form of a spool valve unit) isolates the vapor delivery path from the bottle. A gas cavity is created between the bottle isolation valve and vaporizer selector valve. This gas cavity would contain $B_{xx}$ vapors. Prior to bottle removal, by appropriate actuation of valve V5 or V6, the cavity is cycle purged with argon through common line 16C to eliminate any trace of $B_{xx}$ vapors.

The vaporizer bottle that has been described has a number of features: The bottle isolation valve has both a remote pneumatic operator and a manual operator, see FIGS. 13-13F. The manual operator has two positions: open permissive and closed. The pneumatic operator must be pressurized to open and, upon release of pneumatic pressure, closes with spring return. The pressurized air is piped to this actuator across the bottle interface at the mounting station. The bottle must be properly seated in the interface in order to allow actuation air to pressurize the valve open. The manual valve operator is interlocked to fastening devices for securing the bottle at the mounting station such that the bottle must be fully secured to the interface before the manual valve operator can be repositioned to the open permissive position (i.e., the shield interferes with unseated fastening screws). The vaporizer bottle is thus designed so the bottle is removable only when bottle isolation valve is manually locked closed. These features ensure the bottle contents are never allowed to be exposed to the environment.

As previously indicated, separate thermal zones are established to prevent heat migration between the vaporizer canister and the vapor-receiving device, accomplished by introduction of a substantial thermal break. This prevents heat entering the vaporizer unit from the vapor-receiving device and interfering with the thermal control system of the vaporizer-canister unit. Also, because of presence of this thermal break, a mounted vaporizer-canister unit can cool relatively quickly after being de-energized and its outer thermal insulation removed, despite the vapor-receiving device to which it is mounted being hot and continuing operation at temperature with another attached vaporizer unit. Despite continued heated state of the flow interface device (valve block), workmen can soon handle a de-energized vaporizer-canister unit for removal and replacement. Alternatively, the cooled unit may be left in place while avoiding substantial thermal degradation of remaining charge of feed material that otherwise would occur due to heat from the interface device.

The system described is suitable for safe production of ion beams from large molecule feed materials, including boron containing compounds such as decaborane ($B_{10}H_{14}$) and octadecaborane ($B_{18}H_{22}$).

As described, the system of FIG. 7 has two sources of gas delivery, gas from the reactive cleaning gas source and vapor from the vapor delivery system. The isolation valves V7 and V8 that deliver $NF_3/F$ and $B_x$ to the ion source are mechanically linked (realized, for instance by a spool valve unit) such that these two streams are never allowed to be cross-connected.

B. Feed Materials for Cluster Ion Sources, in General

It is useful for efficiently implanting molecular ions which contain multiple atoms of an electrical dopant species such as the elements B, P, As, Sb, and In which lie in the periodic table on either side of the group IV elements of C, Si, Ge, and Sn, and also for efficiently implanting molecular ions which contain multiple atoms of elements such as C, Si, or Ge useful for modifying a semiconductor substrate to effectuate, for example, amorphization, dopant diffusion control, stress engineering, or defect gettering. Such molecular ions can be useful for fabricating integrated circuits with critical dimensions of 60 nm and less. Hereinafter, such ions will be collectively referred to as "cluster" ions.

The chemical composition of a singly charged cluster ion has the general form $$M_m D_n R_x H_y^+ \qquad (1)$$

where M is an atom such as C, Si, or Ge useful for material modification of the substrate; D is a doping atom such as B, P, As, Sb, or In (from group III or IV of the Periodic Table) for implanting a charge carrier in to the substrate; R is a radical, ligand, or molecule; and H is a hydrogen atom. Generally, R or H are present simply as part of the complete chemical structure needed to produce or form a stable ion and are not specifically required for the implant process. In general H is not significantly detrimental to the implant process. The same should be true for R. For example it would be undesirable for R to contain a metallic atom such as Fe, or an atom such as Br. In the above equation m, n, x, and y are all integers greater than or equal to zero, with the sum of m and n greater than or equal to two, i.e, $m+n \geq 2$. Of particular interest in ion implantation are cluster ions with a high M and/or D atomic multiplicity, i.e those with $m+n \geq 4$, because of their improved efficiency for low energy, high dose implants.

Examples of cluster ions that can be used for material modification are those derived from adjoining benzene rings such as $C_7H_y^+$, $C_{14}H_y^+$, $C_{16}H_y^+$, and $C_{18}H_y^+$. Examples of cluster ions that can be used for doping are:

Borohydride ions: $B_{18}H_y^+$, $B_{10}H_y^+$.
Carborane ions: $C_2B_{10}H_y^+$ and $C_4B_{18}H_y^+$
Phosphorus hydride ions: $P_7 H_y^+$, $P_5(SiH_3)_5^+$, $P_7(SiCH_3)_3^+$.
Arsenic hydride ions: $As_5(SiH_3)_5^+$, $As_7(SiCH_3)_3^+$.

One of ordinary skill in the art can appreciate the possibility of using cluster ions other than those listed in the examples above, including: ions containing Si and Ge for material modification, ions with different amounts and different isotopes of dopant atoms, and ions with different isomeric structures. Doubly charged cluster ions are also generally formed with a much smaller yield in which case they are not as useful for high dose, low energy implantation.

For example, the method of cluster implantation and cluster ion sources with respect to decaborane has been described by Horsky et al. in U.S. Pat. No. 6,452,338 and U.S. Pat. No. 6,686,595 hereby incorporated by reference. The use of $B_{18}H_x^+$ in making PMOS devices is disclosed in Horsky et al. in pending U.S. patent application Ser. No. 10/251,491, published as U.S. Patent Application No. U.S. 2004/0002202 A1, hereby incorporated by reference.

C. Large Carborane Molecules

The nature of these boron-containing materials and their ions is explained in the literature, see for instance Vasyukova, N. I. [A. N. Neseyanov Institute of Heteroorganic Compounds, Academy of Sciences of the USSR, Moscow. Translated from Izvestiya Akademii Nauk SSSR, Seriya Khimicheskaya, No. 6, pp. 1337-1340, June, 1985. Original article submitted Mar. 13, 1984. Plenum Publishing Corporation.]

Figure 18:
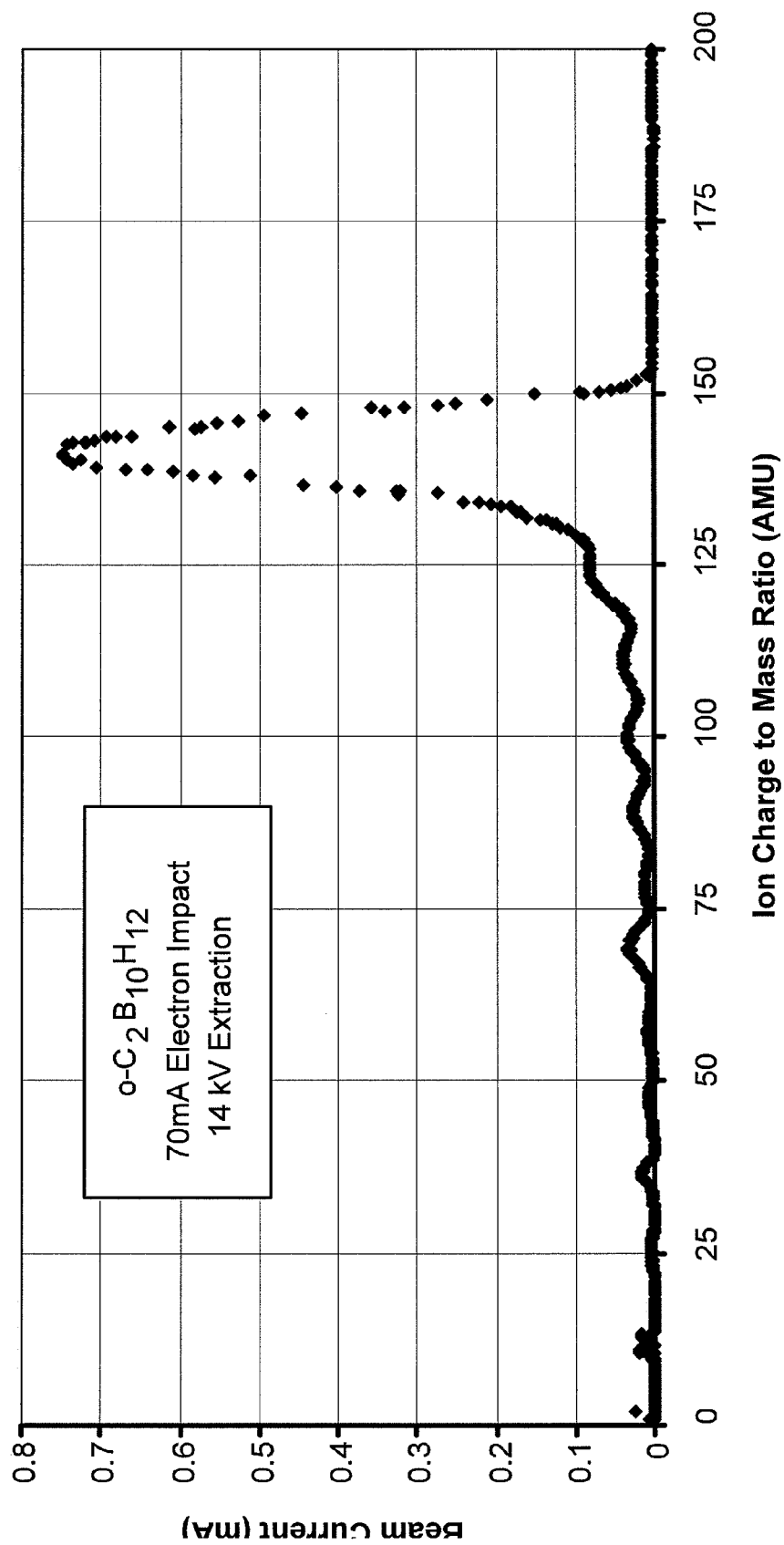
FIG. 18 is a beam-current vs. mass plot of ions employing o-$C_2B_{10}H_{12}$ solid feed material in the vaporizer. It was produced with a electron impact ionization according to the Horsky teaching referenced below with system and in accordance with FIGS. 5 and 7 through 8.

The cluster molecule $o-C_2B_{10}H_{12}$ has been successfully vaporized and ionized, see FIG. 18. Good vapor flow is obtainable at about 42 C. $C_4B_{18}H_{22}$ is also a useful material.

D. Large Molecules of Carbon

In general, any hydrocarbon with a chemical formula of the form $C_nH_y$, where $n \geq 4$ and $y \geq 0$ will increase the effective carbon dose rate into the silicon, and provide varying degrees of amorphization, in all cases being more beneficial than a monomer carbon implant. Flouranthane, $C_{16}H_{10}$, vaporizes at a temperature of 100 C, well suited to use in an electron impact ion source. Its vaporization temperature is similar to that of $B_{18}H_{22}$. A beam current of 0.5 mA enables the equivalent of 8 mA of carbon to be implanted on the wafer, at very low energy (about 1 keV per carbon atom). Ion beam currents of >1 mA are easily realized. Other carbon cluster materials are useful. For example, the following hydrocarbons may potentially be used:

2, 6 diisopropylnaphthalene ($C_{16}H_{20}$)
N-octadene ($C_{18}H_{38}$)
P-Terphenyl ($C_{18}H_{14}$)
Bibenzyl ($C_{14}H_{14}$)
1-phenylnaphthalene ($C_{16}H_{12}$)

E. Large Molecules for N-Type Doping

As, P, and Sb are N-type dopants, i.e., "donors".

For Sb, trimethystibines are good large molecule candidate feed materials, for instance $Sb(CH_3)C_3$.

For As and P, the ions are of the form $AnHx^+$, or $AnRHx^+$, where n and x are integers with n greater than 4 and x greater than or equal to 0, and A is either As or P, and R is a molecule not containing phosphorus or arsenic, which is not injurious to the implantation process.

Chemical Properties of Phosphorus-Bearing Compounds

The compounds phosphanes, organophosphanes and phosphides are seen to be potential sources for cluster phosphorus molecules and the subsequent ions for N-type doping. Examples include (1) phosphane, e.g., Heptaphosphane, $P_7H_3$, and Cyclopentaphosphane, $P_5H_5$, (2) Organophosphane, e.g., Tetra-tertbutylhexaphosphane, $tBu_4P_6$, Pentamethylheptaphosphane, $Me_5P_7$, (3) Phosphide, e.g., Polyphosphides: $Ba_3P_{14}$, $Sr_3P_{14}$ or Monophosphides: $Li_3P_7$, $Na_3P_7$, $K_3P_7$, $Rb_3P_7$, $Cs_3P_7$.

Cyclic phosphanes appear to be the most effective source of dopant clusters favorable to ionization and subsequent implantation with Heptaphosphane, $P_7H_3$, appearing to have the greatest potential of providing a simple cluster source for ion beam implantation.

Substitution of As for P in $P_nH_x$ and $P_nRH_x$ Compounds

Phosphorus-containing species and supporting synthesis techniques are theorized to allow direct substitution of the phosphorus atoms with arsenic to form similar arsenic species, due to similarity in the outer shell electron configuration and similar chemistry reactivity that same group elements exhibit. Molecular prediction software also indicates the similarity in substituting arsenic for phosphorus. The predicted molecular structure for $As_7H_3$ is nearly identical to $P_7H_3$ with differences being limited to the individual atomic radii of phosphorus and arsenic. Synthesis Pathways for $P_7H_3$ and $As_7H_3$ are analogous and interchangeable. In addition, since both Si and H are not injurious to devices formed on silicon wafers, the compounds $As_7(SiH_3)_3$ and $As_5(SiH_3)_5$ are very attractive, and are predicted to be stable compounds.

Furthermore, materials in the form of $A_nRH_x$ may be formulated in a manner to allow selective removal of the phosphorus or arsenic containing portion independently of the remaining molecular structure, R. This characteristic may be employed to increase the level of safe transportation in that the complex feed material is less volatile, hence less susceptible to emissions than the pure component. The residual material may be left in the transport container and "recharged" in normal cycle operations. Furthermore, the R molecular portion may be removed prior to the targeted dopant containing species, discarded or recycled to provide an increased margin of safety during transportation. Synthesis pathways to develop numerous organometallic compounds are well documented and known within the art.

Other As and P-Bearing Compounds of Interest

In addition to the 6-membered ring in $(P/As)_6$, 5-membered rings have been obtained with R=Me, Et, Pr, Ph, $CF_3$, $SiH_3$, $GeH_3$ and 4-membered rings occur with R=$CF_3$, Ph." (N. N. Greenwood, A. Earnshaw, *Chemistry of the Elements*, Butterworth and Heinemann Ltd, 1984, pgs 637-697). Thus, carbonyl groups are directly interchangeable with silicon hydrides, as well known in the art. In addition, a silicon phosphide has also been identified: $Si_{12}P_5$. This material is seen to be extremely useful in ultra-shallow junction formation of Halos and S/D Extensions, and also for Poly Gate doping. The mass of $Si_{12}P_5$ is about 491 amu. Thus, extremely shallow implants can be performed with this compound. In addition, since Si is routinely used for pre-amorphization prior to conducting the N-type drain extension implant, the $Si_{12}P_5$ implant would be self-amorphizing. It is likely there would not be deleterious end-of-range defects created by this implant, since the silicon would have about the same range as the P atoms, keeping damage very shallow. Such defects can be annealed out very effectively, since they tend to diffuse to the surface, when they annihilate.

A number of implementations of the inventive aspects have been described. Nevertheless, it will be understood that various modifications may be made without departing from the spirit and scope of the invention. Accordingly, other implementations are within the scope of the following claims.

What is claimed is:

1. A flow interface device comprising: a thermally conductive valve block formed with at least one vapor passage, the vapor passage defining at least first and second vapor transfer interfaces, one vapor transfer interface comprising a vapor inlet configured to receive vapor from a vaporizer of solid feed material and communicate with said vapor passage, and the other interface comprising a vapor outlet for delivery of vapor from said vapor passage to a vapor-receiving device, said valve block having at least one vapor valve for selectively enabling vapor to be delivered from the vaporizer to the vapor receiving device and a heating system for heating the passage.

2. The flow interface device of claim 1 in which the vapor valve is a flow control valve for regulating the flow of vapor to an ion source.

3. The flow interface device of claim 2 in which the flow control valve is a throttle-fly type valve.

4. The flow interface device of claim 1 in which a vapor valve is a valve system that enables vapor flow to an ion source of vapor entering through the vapor inlet and another flow to the ion source.

5. The flow interface device of claim 4 in which another flow enabled is flow of vapor from another vapor inlet defined by the valve block.

6. The flow interface device of claim 5 in which the valve system permits only one of the vapor flows at a time.

7. The flow interface device of claim 6 in which the valve system comprises a spool valve.

8. The flow interface device of claim 5 for use with vaporizers containing the same feed material, comprising a valve system that permits flow from at least two vaporizers simultaneously.

9. The flow interface of claim 8 in which the valve system is constructed for a second mode of action in which the valve system permits only one of the vapor flows at a time.

10. The flow interface device of claim 4 in which another flow enabled is flow to the ion source is flow of a reactive cleaning gas.

11. The flow interface device of claim 4 including at least two valve systems in the valve block, a first valve system enabling vapor flow to the ion source of vapor entering through said vapor inlet, and enabling flow to the ion source of vapor from another vapor inlet defined by the valve block, and a second selector valve system enabling flow of vapor from a vapor inlet defined by the valve block, or, alternatively, closing all vapor flow and permitting flow to the ion source of a reactive cleaning gas.

12. The flow interface device of claim 4 in which the valve system comprises a spool valve acting as a selector to permit only one of said flows at a time.

13. The flow interface device of claim 1 in which at least two vapor inlets defined by the valve block are located to receive vapor from respective vaporizers, the two vapor inlets associated with respective inlet passage portions, flows through the inlet passage portions being enabled by the first valve system, the inlet passage portions merging following the first valve system into a common passage portion, and the second valve system is arranged to selectively enable flow through the common passage portion to the vapor-receiving device, or, alternatively, flow of the reactive cleaning gas to the vapor-receiving device.

14. The flow interface device of claim 13 in which a further valve comprising a flow control valve is associated with the common passage portion for regulating flow of vapor to the vapor-receiving device.

15. The flow interface device of claim 1 in which the valve block is associated with a heater controlled to maintain the temperature of the valve block higher than that of a vaporizer from which it receives vapor.

16. The flow interface device of claim 1 in which the valve block defines a mounting region constructed to receive and support a vaporizer.

17. The flow interface device of claim 16 including thermal insulation insulating the valve block from the vaporizer to define respective separate thermal control regions to enable maintenance of valve block temperature higher than that of the vaporizer.

18. The flow interface device of claim 16 having a connector constructed, with mounting motion of a vaporizer with respect to the valve block, to mate with a matching connector of the vaporizer, for connecting the vaporizer electrically to a heating control system.

19. The flow interface device of claim 16 in which the valve block defines a receptacle having support surfaces for receiving a support projection of a vaporizer to thereby support the vaporizer during vaporizer heating and vapor transfer.

20. The flow interface device of claim 19 in which the support projection is a lateral projection defining a lateral vapor flow passage, the projection having a peripheral side surface and an end surface, and peripheral and end thermal insulation portions are provided to enable thermal isolation of the valve block from the projection of the vaporizer.

21. The flow interface device of claim 19 in which the receptacle of the valve block is constructed to receive the support projection of the vaporizer by linear sliding motion of the projection, the flow interface device mounting an electrical connector that is constructed, with mounting motion of a vaporizer relative to the valve block, to slideably mate with a matching electrical connector of the vaporizer for connecting the vaporizer electrically to a control and heating system.

22. The flow interface device of claim 21 in which the electrical connector includes a pneumatic connector for supplying controllable compressed air to the vaporizer for selectively actuating a valve of the vaporizer.

23. The flow interface device of claim 1 in which the vapor valve is a flow control valve, the interface device being associated with a power supply and heating system for receiving sensed temperature signal from a vaporizer and for applying electric heating current to the vaporizer to cause the vaporizer to heat sufficiently to produce vapor of the solid feed material of pressure greater than that required by the vapor-receiving device, and in the range that enables the flow control valve to regulate vapor flow to the ion source.

24. The flow interface device of claim 1 further including a vaporizer, the vaporizer containing solid feed material capable of producing ionizable vapor.

25. The flow interface device of claim 24 in which the solid feed material comprises a cluster compound capable of producing vapor for the production of cluster ions.

26. The flow interface device of claim 25 in which the cluster compound comprises a cluster boron compound.

27. The flow interface device of claim 26 in which the compound comprises a borane or a carborane.

28. The flow interface device of claim 27 in which the compound comprises $B_{10}H_{14}$, $B_{18}H_{22}$, $C_2B_{10}H_{12}$ or $C_4B_{18}H_{22}$.

29. The flow interface device of claim 25 in which the cluster compound comprises a cluster carbon compound.

30. The flow interface device of claim 29 in which the cluster compound comprises $C_{14}H_{14}$, $C_{16}H_{14}$, $C_{16}H_{12}$, $C_{16}H_{20}$, $C_{18}H_{14}$ or $C_{18}H_{38}$.

31. The flow interface device of claim 25 in which the cluster compound comprises a compound for N-Type doping.

32. The flow interface device of claim 31 in which the compound comprises an arsenic, phosphorus or antimony cluster compound.

33. The flow interface device of claim 32 in which the compound comprises an arsenic or phosphorus compound capable of forming ions of the form $A_nH_x^+$ or $A_nRH_x^+$, where n and x are integers with n greater than 4 and x greater than or equal to 0, and A is either As or P and R is a molecule not containing phosphorus or arsenic and which is not injurious to the implantation process.

34. The flow interface device of claim 32 in which the compound comprises a phosphorus compound selected from the group consisting of phosphanes, organophosphanes and phosphides.

35. The flow interface device of claim 32 in which the compound is $P_7H_7$.

36. The flow interface device of claim 32 in which the compound comprises an antimony compound that comprises a trimethylstibine.

37. The flow interface device of claim 30 in which the compound comprises $S_b(CH_3)C_3$.

38. The flow interface device and vaporizer of claim 25 in combination with an ion beam implanter in which the vapor-receiving device comprises a high voltage ion source capable of ionizing vapor produced from the solid feed material for ion implantation.

39. The flow interface device of claim 1 further including a vapor-receiving device in the form of an ion source constructed to produce ions for use in semiconductor manufacture.

40. The flow interface device of claim 1 further including an ion beam implanter in which the vapor-receiving device comprises a high voltage ion source capable of ionizing vapor to produce a beam of ions for ion implantation.

41. The combination of the flow interface device of claim 1 further including a vapor-receiving-device in the faun of a high voltage ion source and the flow-interface device is mounted for support upon an electrical insulator.

42. The combination of claim 41 in which the insulator is an insulator bushing that also supports the ion source to which the vapors are delivered.

43. The flow interface device of claim 39 in combination with an ion beam implanter in which the vapor-receiving device comprises a high voltage ion source o capable of ionizing the vapor to produce a beam of ions for ion implantation.

44. The flow interface device of claim 1 further including a gas purge system for removing vapor from the vapor inlet passage of the valve block prior to disconnecting the vaporizer from the valve block.

45. The flow interface device of claim 1 in which the valve block defines a delivery passage for a process gas.

46. The flow interface device of claim 45 constructed so that the process gas is selectively directed through a passage through which reactive cleaning gas is at other times directed.

47. The flow interface device of claim 1 in which the valve block includes a delivery extension defining at least two flow paths to the vapor-receiving device, at least one of which is constructed to convey vapor from solid feed material and another is constructed to deliver a process gas or a reactive cleaning gas.

48. A flow interface device for an ion source constructed for use as the ion source for an ion beam implanter, the interface device comprising:
a thermally conductive valve block formed with at least one vapor passage, the vapor passage defining at least first and second vapor transfer interfaces, one interface comprising a vapor inlet located to receive vapor from a vaporizer and communicating with an inlet portion of the passage, and the other interface comprising a vapor outlet for delivery of vapor from an outlet portion of the passage to the ion source,
a heating system for heating the passage
a flow control valve associated with the passage for regulating the flow of vapor to the ion source, and a valve system that enables vapor flow to the ion source of vapor entering through the inlet and another enables flow to the ion source.

49. The flow interface device of claim 48 associated with a power supply and control system for causing the vaporizer to heat sufficiently to produce vapor of the solid feed material of pressure greater than that required by the ion source, and in the range controllable by the flow control valve.

50. The flow interface device of claim 48 in which the flow control valve is a butter-fly type valve.

51. The flow interface device of claim 48 in which another flow enabled is flow of vapor from another vapor inlet defined by the valve block.

52. The flow interface device of claim 48 in which another flow enabled is flow to the ion source of a reactive cleaning gas.

53. The flow interface device of claim 48 further including at least two valve systems in the valve block that enable flow, a first valve system enabling vapor flow to the ion source of vapor entering through the vapor inlet, and enabling another flow to the ion source of vapor from another vapor inlet defined by the valve block, and a selector valve system enabling flow of vapor from a vapor inlet defined by the valve block, or, alternatively, closing all vapor flow and enabling flow to the ion source of a reactive cleaning gas.

54. The flow interface device of claim 53 in which vapor inlet passages associated with at least two vapor inlets located to receive vapor from respective vaporizers are controlled by the first valve system following which the inlet passage portions merge into a common passage, and the second valve system selectively controls flow through the common passage portion to the ion source, or alternatively flow of the reactive cleaning gas to the ion source, the flow control valve being associated with the common passage for regulating flow of vapor to the ion source.

55. The flow interface device of claim 54 in which a valve comprises a spool valve.

56. The flow interface device of claim 48 in which the valve block is associated with a heater controlled to maintain the temperature of the valve block higher than that of a vaporizer from which it receives vapor.

* * * * *